United States Patent
Kobayashi

(10) Patent No.: US 7,660,184 B2
(45) Date of Patent: Feb. 9, 2010

(54) SEMICONDUCTOR MEMORY FOR DISCONNECTING A BIT LINE FROM A SENSE AMPLIFIER IN A STANDBY PERIOD AND MEMORY SYSTEM INCLUDING THE SEMICONDUCTOR MEMORY

(75) Inventor: Hiroyuki Kobayashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 78 days.

(21) Appl. No.: 11/878,354

(22) Filed: Jul. 24, 2007

(65) Prior Publication Data

US 2008/0037344 A1 Feb. 14, 2008

(30) Foreign Application Priority Data

Aug. 10, 2006 (JP) ............................. 2006-218658
Jun. 1, 2007 (JP) ............................. 2007-147347

(51) Int. Cl.
*G11C 8/00* (2006.01)
(52) U.S. Cl. .................. 365/230.03; 365/200; 365/203; 365/222; 365/229
(58) Field of Classification Search ................. 365/200, 365/203, 222, 229, 203.03
See application file for complete search history.

(56) References Cited

U.S. PATENT DOCUMENTS 5,025,422 A * 6/1991 Moriwaki et al. ........ 365/233.5
5,673,231 A * 9/1997 Furutani ..................... 365/203
6,452,859 B1 * 9/2002 Shimano et al. ........ 365/230.06
6,504,776 B1 1/2003 Nakaoka
7,106,641 B2 9/2006 Tsukada
2003/0031066 A1 2/2003 Yanagisawa et al. ........ 365/200
2003/0103368 A1* 6/2003 Arimoto et al. ............... 365/63
2004/0145959 A1* 7/2004 Kuge et al. ............ 365/230.03
2006/0215479 A1* 9/2006 Lee ........................ 365/230.06
2007/0002648 A1* 1/2007 Ikeda et al. ................. 365/201

FOREIGN PATENT DOCUMENTS

| JP | 04-047588 | 2/1992 |
| JP | 06-052681 | 2/1994 |
| JP | 08-263983 | 10/1996 |
| JP | 11-149793 | 6/1999 |
| KR | 2003-0057273 A | 7/2003 |
| KR | 10-2006-0042205 A | 5/2006 |

* cited by examiner

*Primary Examiner*—Hoai V Ho
(74) *Attorney, Agent, or Firm*—Arent Fox LLP

(57) ABSTRACT

Each memory block has a plurality of memory cells, and word lines and bit lines connected to the memory cells. Precharge switches connect the bit lines to a precharge line. A switch control circuit controls an operation of the precharge switches and sets a cutoff function that turns off connection switches in a standby period in which no access operation of the memory cells is performed. Since connections of the bit lines and the precharge switch and those of the bit lines and the sense amplifier are cut off in the standby period, if a short circuit failure is present between a word line and a bit line, a leak current can be prevented from flowing from the word line to a precharge voltage line and so on.

29 Claims, 71 Drawing Sheets

| MRS { PSET0<br>PSET1 | L<br>L | H<br>L | L<br>H | H<br>H |
|---|---|---|---|---|
| | ALL | 1/2 | 1/4 | NONE |
| | RBLK0 RBLK1 RBLK2 RBLK3 — PREFA | RBLK0 RBLK1 RBLK2 RBLK3 | RBLK0 RBLK1 RBLK2 RBLK3 | RBLK0 RBLK1 RBLK2 RBLK3 |
| RAD5 RAD4 | L L | L H | H L | H H |

Fig. 65

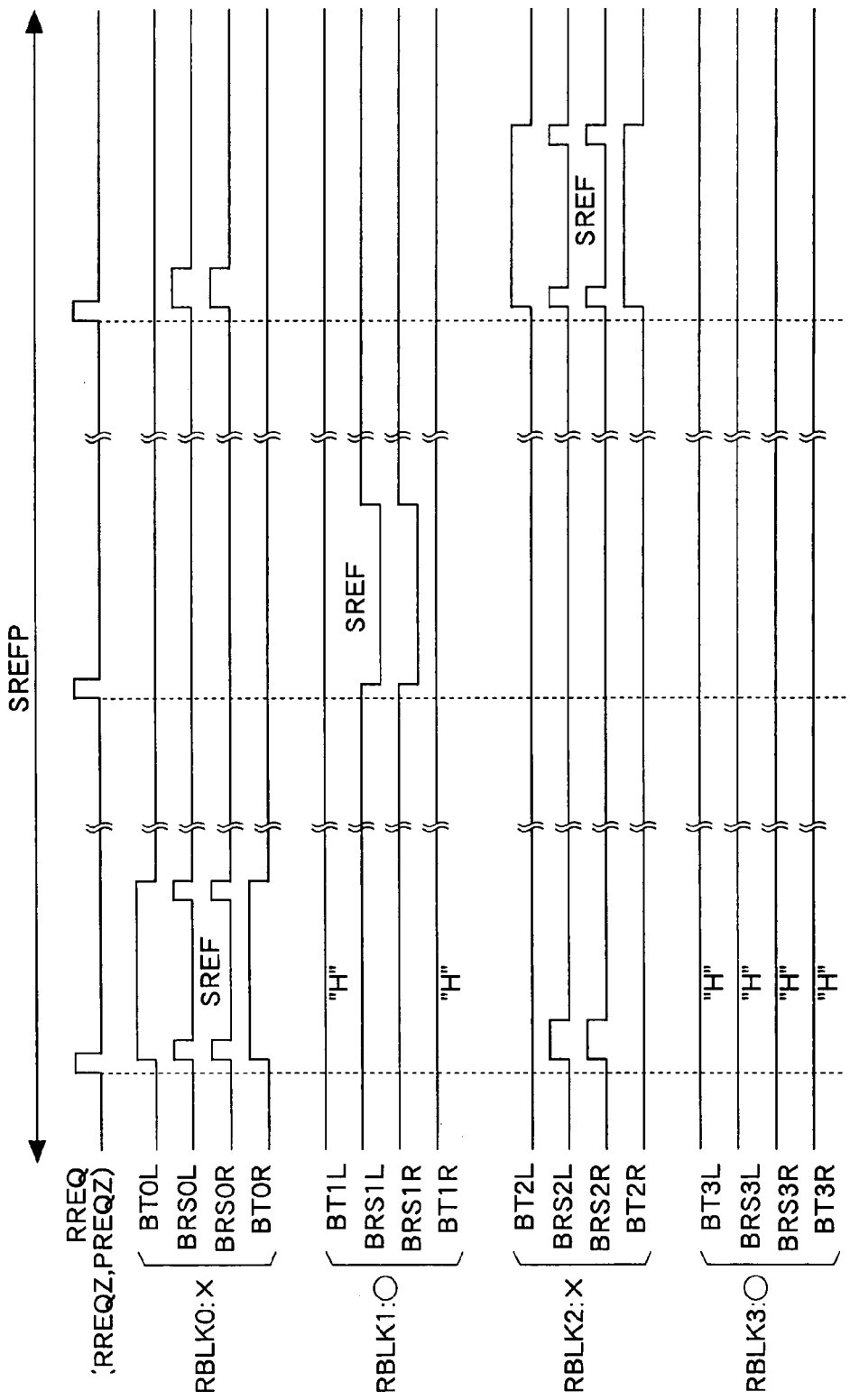

SEMICONDUCTOR MEMORY FOR DISCONNECTING A BIT LINE FROM A SENSE AMPLIFIER IN A STANDBY PERIOD AND MEMORY SYSTEM INCLUDING THE SEMICONDUCTOR MEMORY

CROSS REFERENCE TO RELATED APPLICATION

This application is based upon and claims the benefit of priority from Japanese Patent Application No. 2006-218658, filed on Aug. 10, 2006 and Japanese Patent Application No. 2007-147347, filed on Jun. 1, 2007 the entire contents of which are incorporated herein by reference.

BACKGROUND

1. Field

The present invention relates to a semiconductor memory having memory cells and a memory system having the semiconductor memory and a controller.

2. Description of the Related Art

In a semiconductor memory such as a DRAM, a memory cell is connected to one of a pair of complementary bit lines via a transfer gate operating in accordance with a voltage of a word line. In a read operation, data retained in the memory cell is output to one of the pair of bit lines. The other of the bit lines is set to a precharge voltage before the read operation. Then, a voltage difference between the pair of bit lines is amplified by a sense amplifier and output as read data. Generally, the bit lines are set to the precharge voltage and the word lines to a ground voltage or the like during standby of the DRAM.

When, for example, a failure occurs due to a short circuit between a word line and a bit line, the bad word line is replaced by a redundant word line. Alternatively, a bad bit line pair is replaced by a redundant bit line pair. However, the short circuit between the word line and the bit line physically remains even after the failure is relieved. Thus, a leak current still flows to a ground line from a precharge voltage line via a short circuit portion after the failure is relieved. If a leak current is large in a DRAM, the DRAM will be removed as a defective component.

In order to reduce standby current failure accompanying a short circuit between a word line and a bit line, a technique to arrange a resistor element between a precharge voltage line and a bit line has been proposed (for example, Japanese Unexamined Patent Application Publication No. Hei 8-263983). A technique to arrange a resistor element between a precharge voltage line and a sense amplifier has also been proposed (for example, Japanese Unexamined Patent Application Publication No. Hei 11-149793). Further, a technique to connect a precharge voltage line to a bit line and a sense amplifier only a certain period before activating a word line has been proposed (for example, Japanese Unexamined Patent Application Publication No. Hei 4-47588 and Japanese Unexamined Patent Application Publication No. Hei 6-52681).

However, when a resistor element is arranged between a precharge voltage line and a bit line or between a precharge voltage line and a sense amplifier, a precharge operation will be slower and an access cycle time longer as a resistance value is increased to reduce a leak current.

Moreover, in a semiconductor memory such a DRAM, the number of sense amplifiers is reduced to reduce the chip size by making memory blocks adjacent to each other share the sense amplifier. However, no method of reducing a leak current accompanying a short circuit between a word line and a bit line in a shared sense amplifier type semiconductor memory has been proposed.

SUMMARY

An object of the present invention is to reduce a leak current accompanying a short circuit between a word line and a bit line in a shared sense amplifier type semiconductor memory. Another object of the present invention is to easily identify a bad memory block having a leak failure between a word line and a bit line.

In an embodiment of the present invention, a semiconductor memory has a pair of memory blocks, a sense amplifier shared by these memory blocks, and connection switches for connecting the sense amplifier to the bit lines of each memory block. Each memory block has a plurality of memory cells, and word lines and bit lines connected to the memory cells. Precharge switches connect the bit lines to a precharge line. A switch control circuit controls an operation of the precharge switch and sets a cutoff function to turn off the connection switch in a standby period in which no access operation of the memory cells is performed. Since connection between the bit lines and the precharge switch and that between the bit lines and the sense amplifier are cut off in the standby period, when a short circuit failure is present between a word line and a bit line, a leak current can be prevented from flowing from the word line to a precharge voltage line and the like.

In another preferred embodiment of the present invention, a semiconductor memory has a leak memory unit for storing information about a bad memory block having a leak failure between the word lines and bit lines. The cutoff function is set for a connection switch corresponding to a bad memory block and released for the connection switch corresponding to a good memory block without a leak failure based on information retained in the leak memory unit. By performing an operation of the connection switch involved in the cutoff setting only for bad memory blocks, wasteful operations of the connection switch can be prevented to reduce a standby current.

In another preferred embodiment of the present invention, the standby period is constituted by an external standby period in which external access requests and internal access requests can be received and an internal standby period in which reception of external access requests is prohibited and only internal access requests can be received. The cutoff function is set for the internal standby period and released for the external standby period. This can reduce a standby current in the internal standby period in which a low current consumption is demanded.

In another preferred embodiment of the present invention, in response to a test request, a test circuit controls an operation of the switch control circuit to turn on the connection switches of all memory blocks and thereafter turn off the connection switch of each memory block. Alternatively, in response to a test request, the test circuit controls an operation of the switch control circuit to turn off the connection switches of all memory blocks and thereafter turn on the connection switch of each memory block. In this example, a bad memory block having a leak failure between a word line and a bit line can easily be identified based on a difference of standby current values measured for each operation of the connection switches.

In another preferred embodiment of the present invention, an operation control circuit controls an operation timing of the precharge switch and an activation timing of the word lines. The test circuit controls an operation of the operation control circuit so that a time period between the time when the precharge switch is turned off by the switch control circuit in response to an access request and the time when the word line is activated is set to be longer in a test mode than in a normal operation mode. Alternatively, the test circuit controls the operation of the operation control circuit so that the operation control circuit successively activates the word line and the sense amplifier after the precharge switch is turned off by the switch control circuit in response to an access request and a time period between the time when the word line is activated and the time when the sense amplifier is activated is set to be longer in a test mode than in a normal operation mode. The above operation makes a change in voltage of a bit line having a leak failure with a word line larger. Thus, a bad memory block having a leak failure between a word line and bit line can easily be identified.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 65 is a schematic diagram showing a partial refresh area in the thirty-first embodiment;

FIG. 71 is a timing chart showing another example of operations in self-refresh mode.

DETAILED DESCRIPTION OF THE EMBODIMENTS

Embodiments of the present invention will be described below with reference to drawings. A signal line shown as a thick line in a diagram consists of a plurality of lines. Also, a portion of a block to which a thick line is connected consists of a plurality of circuits. The same symbol as a signal name is used for a signal line through which the signal is transmitted. A signal beginning with "/" denotes negative logic. A signal ending with "Z" denotes positive logic. A double circle in a diagram denotes an external terminal.

Figure 1:
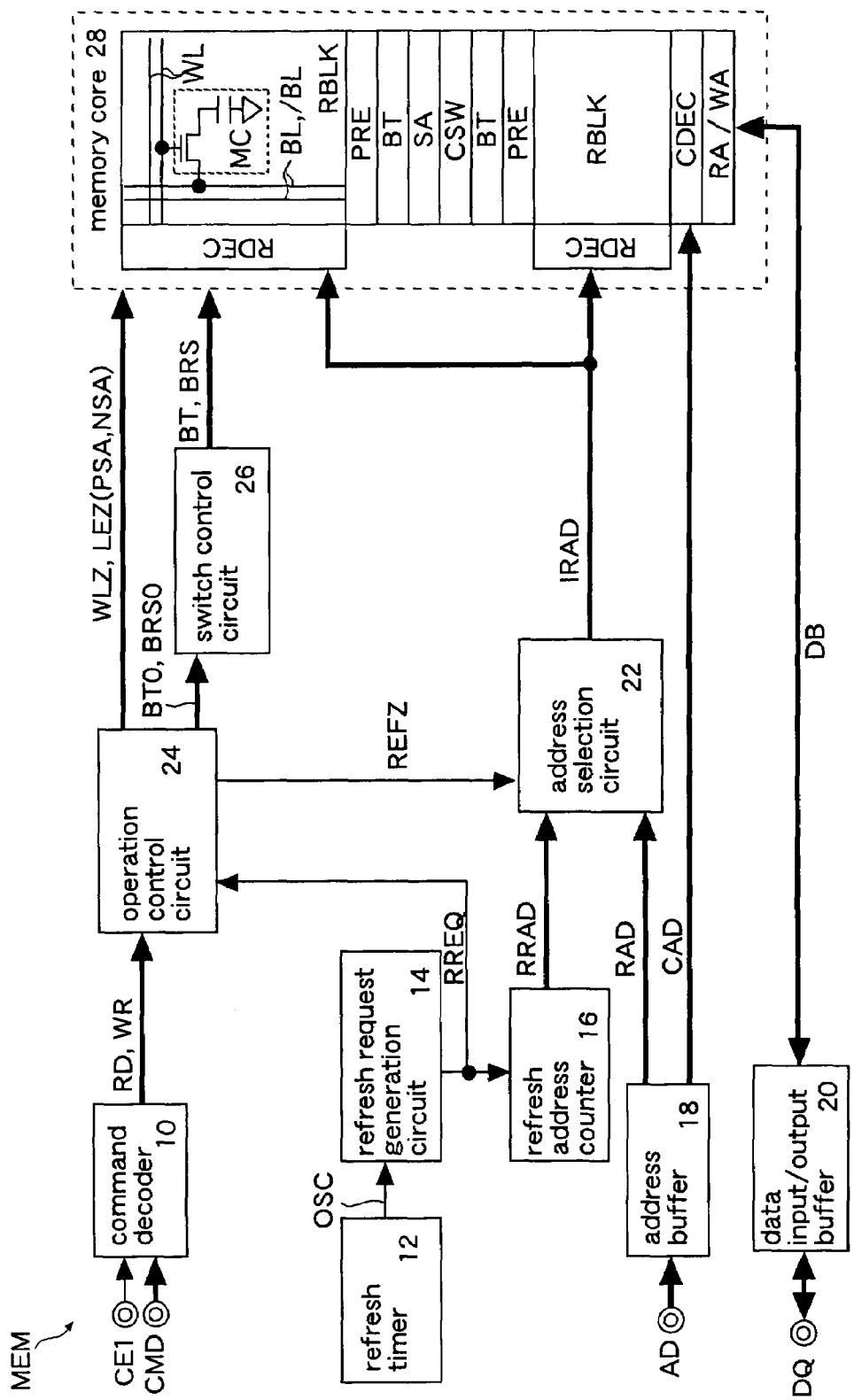
FIG. 1 is a block diagram showing a first embodiment of the present invention.
Figure 4:
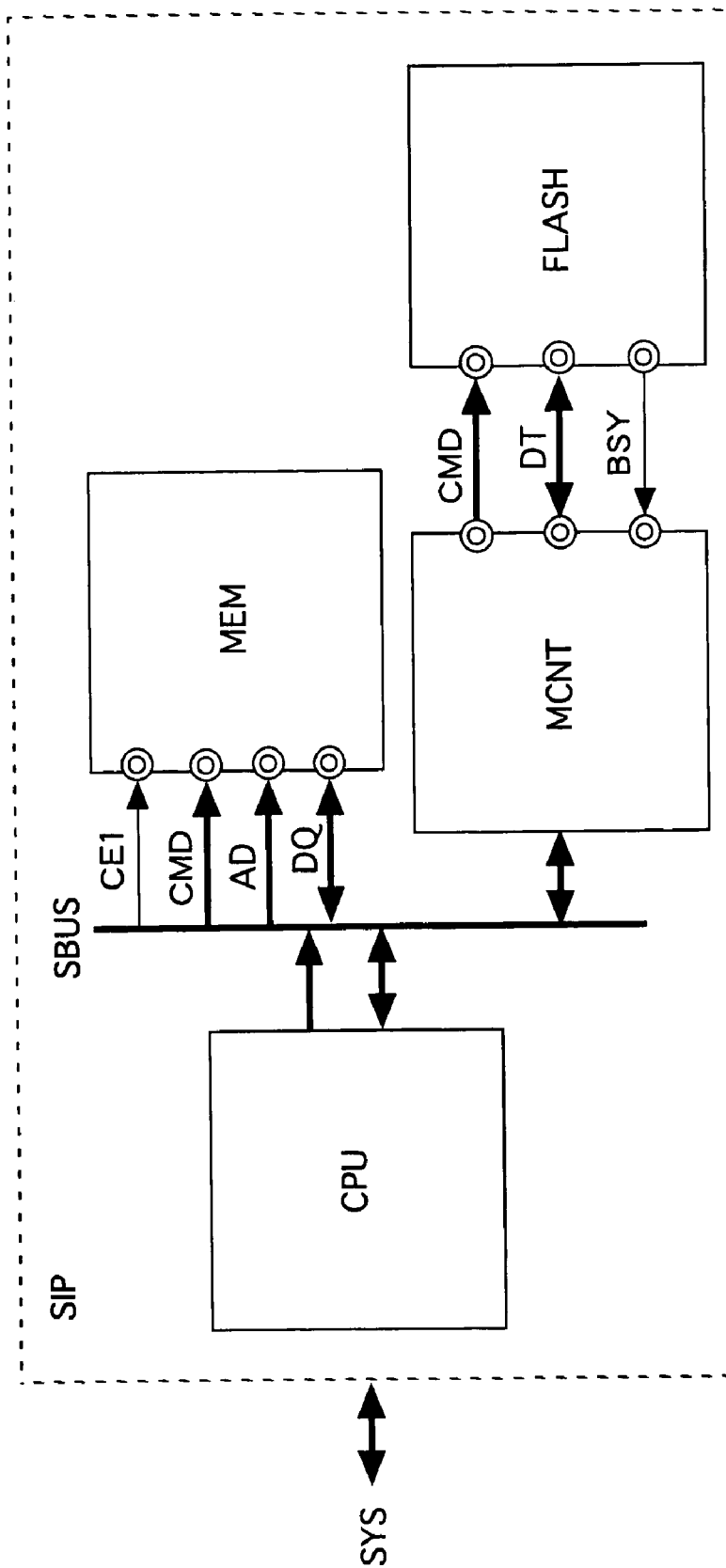
FIG. 4 is a block diagram showing a memory system in the first embodiment.

FIG. 1 shows a first embodiment of the present invention. A semiconductor memory MEM is, for example, an FCRAM (Fast Cycle RAM). The FCRAM is a pseudo SRAM having memory cells of DRAM and an interface of SRAM. The memory MEM has a command decoder 10, a refresh timer 12, a refresh request generation circuit 14, a refresh address counter 16, an address buffer 18, a data input/output buffer 20, an address selection circuit 22, an operation control circuit 24, a switch control circuit 26, and a memory core 28. The memory MEM constitutes, as shown in FIG. 4 described later, a memory system together with a CPU.

The command decoder 10 outputs a command recognized in accordance with logical levels of a chip enable signal CE1 and a command signal CMD as a read command RD, a write command WR or the like for performing an access operation of the memory core 28. The read command RD and write command WR are external access requests for performing an access operation to the memory core 28. For example, the command signal CMD includes a write enable signal /WE and an output enable signal /OE.

The refresh timer 12 has an oscillator that outputs an oscillating signal OSC in a predetermined cycle. The refresh request generation circuit 14 divides a frequency of the oscillating signal OSC to generate a refresh request RREQ (internal access request). The refresh address counter 16 sequentially generates a refresh address signal RRAD in synchronization with the refresh request RREQ. The refresh address signal RRAD is a row address signal for selecting a word line WL to be described later.

The address buffer 18 receives an address signal AD and outputs the received address as a row address signal RAD and a column address signal CAD. The column address signal CAD is supplied to select bit lines BL and /BL. The data input/output buffer 20 receives a write data signal via a data terminal DQ and outputs the received data signal to a data bus DB. The data input/output buffer 20 also receives a read data signal from the memory cell MC via the data bus DB and outputs the received data signal to the data terminal DQ.

The address selection circuit 22 selects a refresh address signal RRAD (REFZ=H) when a refresh operation should be performed and a row address signal RAD (REFZ=L) when no refresh operation should be performed, and then outputs the selected signal to the memory core 28 as an internal row address signal IRAD.

The operation control circuit 24 outputs a word line activation signal WLZ, a sense amplifier activation signal LEZ, a switch control signal BT0, and a precharge control signal BRS0 for causing the memory core 28 to perform a read operation, a write operation, or a refresh operation in response to a read command RD, a write command WR, or a refresh request RREQ. The word line activation signal WLZ controls an activation timing of the word line WL and an activation timing of the sense amplifier activation signal LEZ and a sense amplifier SA. The switch control signal BT0 is a basic timing signal for controlling on/off of a connection switch BT to be described later. The precharge control signal BRS0 is a basic timing signal for controlling on/off of a precharge circuit PRE to be described later.

The operation control circuit 24 changes a refresh signal REFZ to a high logical level (H) when a refresh operation is performed and changes the refresh signal REFZ to a low logical level (L) when no refresh operation is performed. The operation control circuit 24 has an arbiter (not shown) for deciding a preferential order of the read command RD, write command WR, and refresh request RREQ. When the operation control circuit 24 receives a read command RD and a refresh request RREQ simultaneously, for example, priority is given to the refresh request RREQ. A read operation in response to the read command RD is suspended until the refresh operation is completed. Conversely, when a refresh request RREQ is supplied during read operation, a refresh operation in response to the refresh request RREQ is temporarily suspended.

Figure 2:
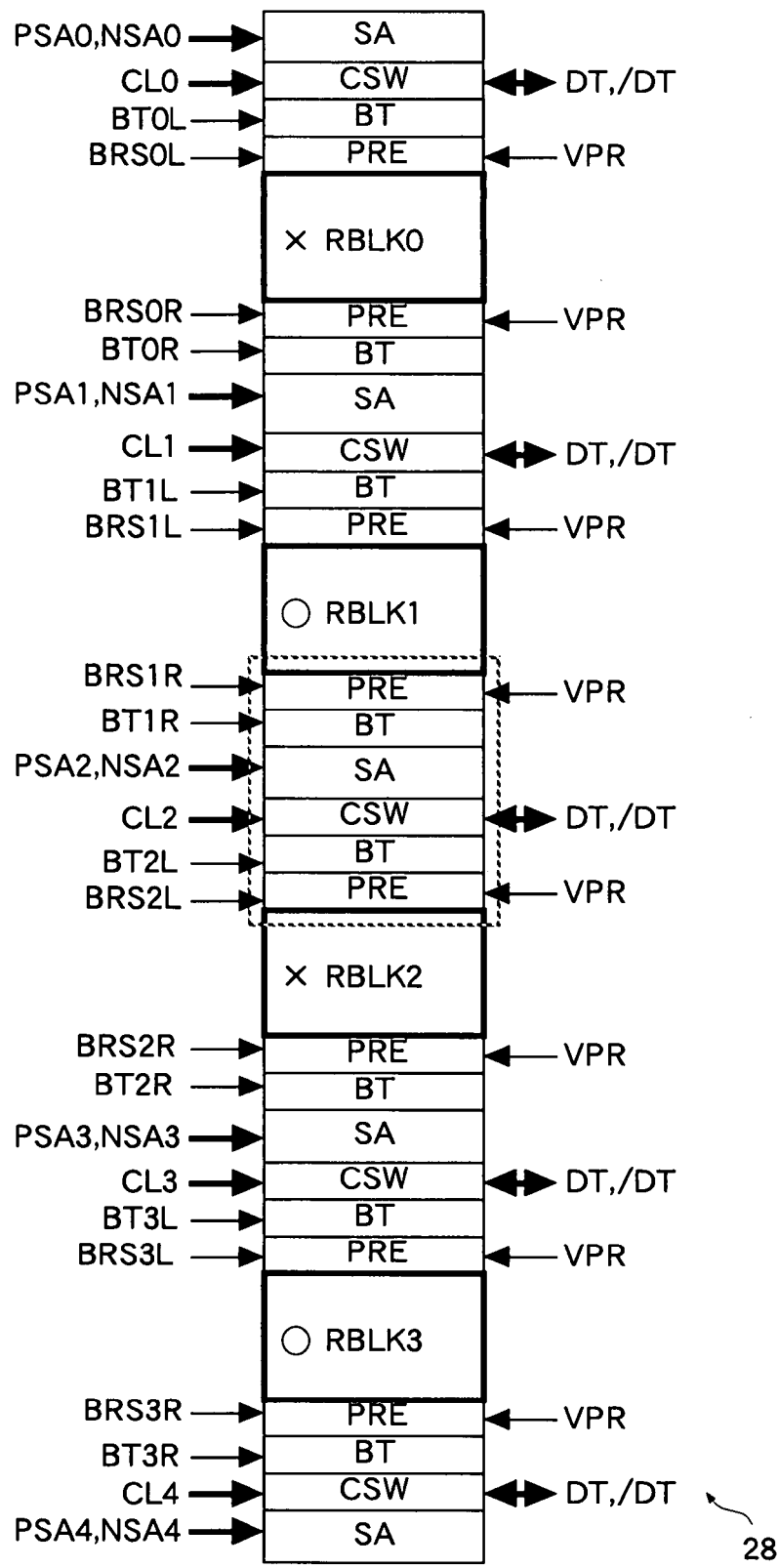
FIG. 2 is a block diagram showing an overview of a memory core shown in FIG. 1.

The switch control circuit 26 outputs a switch control signal BT and a precharge control signal BRS based on a switch control signal BT0 and a precharge control signal BRS0. As shown in FIG. 2 to be described later, the switch control signal BT consists of BT0L-BT3L and BT0R-BT3R and the precharge control signal BRS consists of BRS0L-BRS3L and BRS0R-BRS3R. Operations of the switch control circuit 26 will be described with reference to FIGS. 5 and 6 to be described later.

The memory core 28 has a row decoder RDEC, a column decoder CDEC, a precharge circuit PRE (precharge switch), the connection switch BT, the sense amplifier SA, a column switch CSW, a read amplifier RA, a write amplifier WA, and a plurality of memory blocks RBLK. Four memory blocks RBLK, for example, are formed. Each memory block RBLK has a plurality of memory cells MC, the word lines WL connected to the memory cells MC lined up in one direction, and bit lines BL and /BL connected to the memory cells MC lined up in a direction perpendicular to the one direction. The memory cell MC has a capacitor for retaining data as a charge and a transfer transistor for connecting one end of the capacitor to the bit line BL (or /BL). The other end of the capacitor is connected to a precharge voltage line VPR. Instead of the precharge voltage line VPR, the other end of the capacitor may be connected to a cell plate voltage line VCP (not shown). A gate of the transfer transistor is connected to the word line WL. Depending on the selection of the word line WL, one of the read operation, write operation, and refresh operation is performed. The row address decoder RDEC decodes an internal row address signal IRAD to select one of the word lines WL. The column address decoder CDEC decodes a column address signal CAD to select bit line pairs BL and /BL, the number of pairs corresponding to the number of bits of the data terminal DQ. The sense amplifier SA amplifies a difference of signal quantities of data signals read by the bit line pairs BL and /BL. The column switch CSW connects the bit lines BL and /BL corresponding to a column address signal CAD to the read amplifier RA and write amplifier WA. The read amplifier RA amplifies complementary read data output via the column switch CSW during read access operation. The write amplifier WA amplifies complementary write data supplied via the data bus DB during write access operation and supplies the amplified data to the bit line pairs BL and /BL.

FIG. 2 shows an overview of the memory core 28 shown in FIG. 1. The precharge circuit PRE, connection switch BT, column switch CSW, and sense amplifier SA are arranged on both sides of each memory block RBLK0-3. That is, the sense amplifier SA arranged between a pair of adjacent memory blocks RBLK (for example, RBLK0-1) is shared by the pair of memory blocks RBLK (shared sense amplifier type).

Each sense amplifier SA operates in synchronization with sense amplifier activation signals PSA and NSA (PSA0-4, NSA0-4). The sense amplifier activation signals PSA and NSA are signals synchronized with the sense amplifier activation signal LEZ output from the operation control circuit 24 shown in FIG. 1. Signal lines of the sense amplifier activation signals PSA and NSA are wired for each block of the sense amplifier SA. Each column switch CSW connects complementary output of the sense amplifier SA to data lines DT and /DT in synchronization with a column switch signal CL (CL0-CL4). A signal line of the column switch signal CL is wired for each group of column switches CSW corresponding to the number of bits of the data terminal DQ.

Each connection switch BT operates in synchronization with a switch control signal BT (BT0L-BT3L, BT0R-BT3R). A signal line of the switch control signal BT is wired for each block of the connection switch BT. Each precharge circuit PRE connects the bit lines BL and /BL to the precharge voltage line VPR in synchronization with a precharge control signal BRS (BRS0L-BRS3L, BRS0R-BRS3R). A signal line of the precharge control signal BRS is wired for each block of the precharge circuit PRE.

Round marks and X marks shown in the memory blocks RBLK0-3 denote whether there is a leak failure between a word line WL and a bit line BL (or /BL). In the present embodiment, for example, the memory blocks RBLK0/2 (bad memory blocks) have a leak failure and the memory blocks RBLK1/3 (good memory blocks) have no leak failure.

Figure 3:
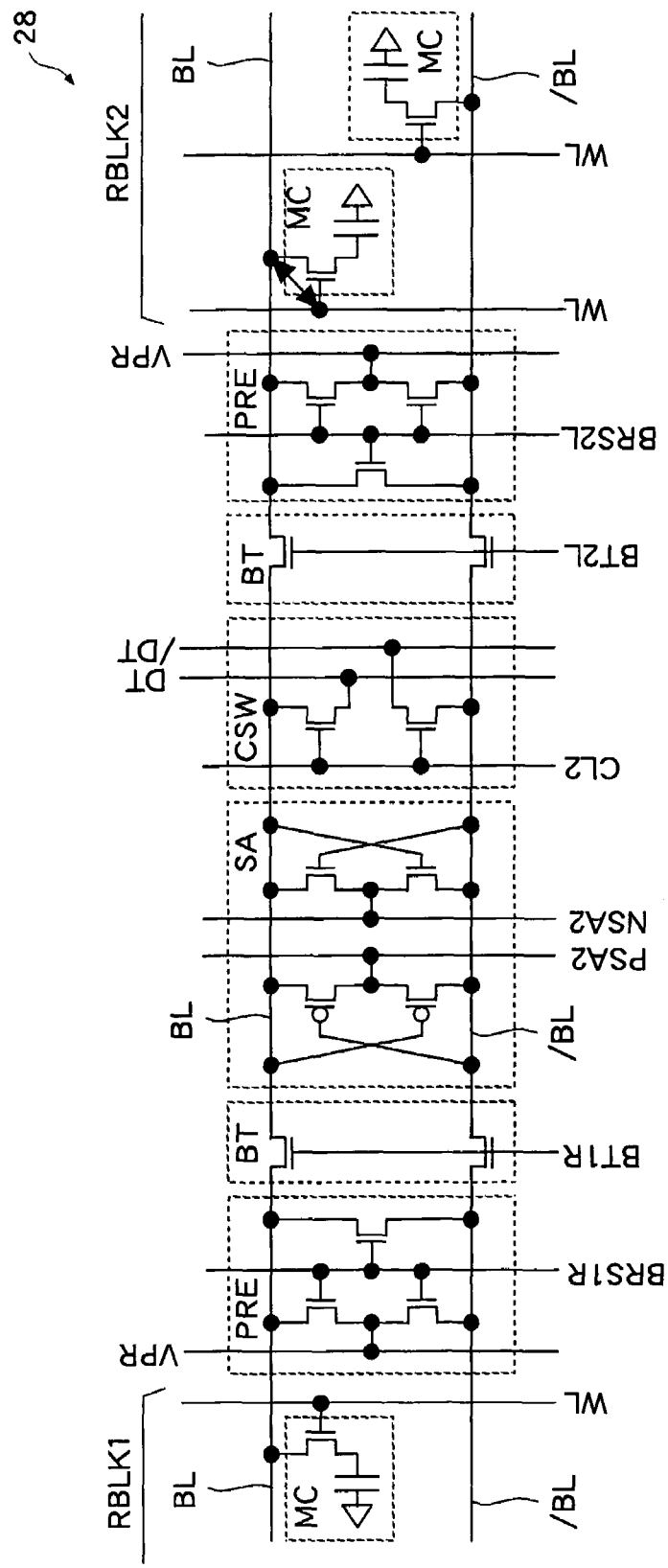
FIG. 3 is a circuit diagram showing details of an area denoted by a broken line frame in FIG. 2.

FIG. 3 shows details of an area denoted by a broken line frame in FIG. 2. For convenience sake, data lines connected to the bit line BL or /BL via the connection switch BT are also called the bit lines BL and /BL in FIG. 3. Arrows in the memory cell MC of the memory block RBLK2 indicate that a leak failure is present between a word line and a bit line in the memory cell MC. The memory cell MC connected to a word line WL is connected to one of the bit lines BL and /BL. Thus, when accessing a memory cell MC connected to a bit line BL, for example, the bit line /BL functions as a reference voltage line (precharge voltage).

The connection switch BT is constructed of an nMOS transistor. One of source/drain of the nMOS transistor is connected to the bit line BL (or /BL) and the other of source/drain of the nMOS transistor is connected to the sense amplifier SA. A gate of the nMOS transistor receives the switch control signal BT (BT1R, BT2L). While receiving a switch control signal BT at a high logical level, the connection switch BT connects the bit lines BL and /BL of the memory block RBLK to the sense amplifier SA.

Each precharge circuit PRE is constructed of a pair of nMOS transistors for connecting each of the complementary bit lines BL and /BL to the precharge voltage line VPR and an nMOS transistor for mutually connecting the bit lines BL and /BL. The gate of the nMOS transistor of the precharge circuit PRE receives the precharge control signal BRS (BRS1R, BRS2L). While receiving a precharge control signal BRS at the high logical level, the precharge circuit PRE supplies a precharge voltage VPR to the bit lines BL and /BL and equalizes the voltages of the bit lines BL and /BL.

The sense amplifier SA is constructed of a pair of CMOS inverters whose input and output are mutually connected. The input (transistor gate) of each CMOS inverter is connected to the bit line BL (or /BL). Each CMOS inverter is constructed of an nMOS transistor and a pMOS transistor lined up side by side in a cross direction in the diagram. A source of the PMOS transistor of each CMOS inverter receives a sense amplifier activation signal PSA (PSA2). The source of the nMOS transistor of each CMOS inverter receives a sense amplifier activation signal NSA (NSA2). The sense amplifier activation signal PSA is set to the high level voltage when the sense amplifier SA operates and to the precharge voltage VPR when the sense amplifier SA does not operate. The sense amplifier activation signal NSA is set to a low level voltage (for example, the ground voltage) when the sense amplifier SA operates and to the precharge voltage VPR when the sense amplifier SA does not operate.

The column switch CSW is constructed of an nMOS transistor connecting the bit line BL to the data line DT and an nMOS transistor connecting the bit line /BL to the data line /DT. The gate of each nMOS transistor receives a column switch signal CL (CL2). A read data signal in the bit line BL or /BL amplified by the sense amplifier SA during read operation is transmitted to the data line DT or /DT via the column switch CSW. A write data signal supplied via the data line DT or /DT during write operation is written into the memory cells MC via the bit line BL or /BL. The data lines DT and /DT are connected to the read amplifier RA and write amplifier WA.

FIG. 4 shows a memory system in the first embodiment. The same memory system as that shown in FIG. 4 is constructed in second to twenty-second embodiments to be described later. The memory system is formed as a System In Package (SIP) integrated on a silicon substrate. The SIP has the memory MEM shown in FIG. 1, a flash memory FLASH, a memory controller MCNT for accessing the flash memory FLASH, and a CPU (controller) controlling the entire system. The CPU, memory MEM, and memory controller MCNT are mutually connected by a system bus SBUS. The SIP is connected to a system SYS via an external bus. The CPU outputs a chip enable signal CE1, an access command CMD, an address signal AD, and a write data signal DQ to access the memory MEM and receives a read data signal DQ from the memory MEM.

Figure 5:
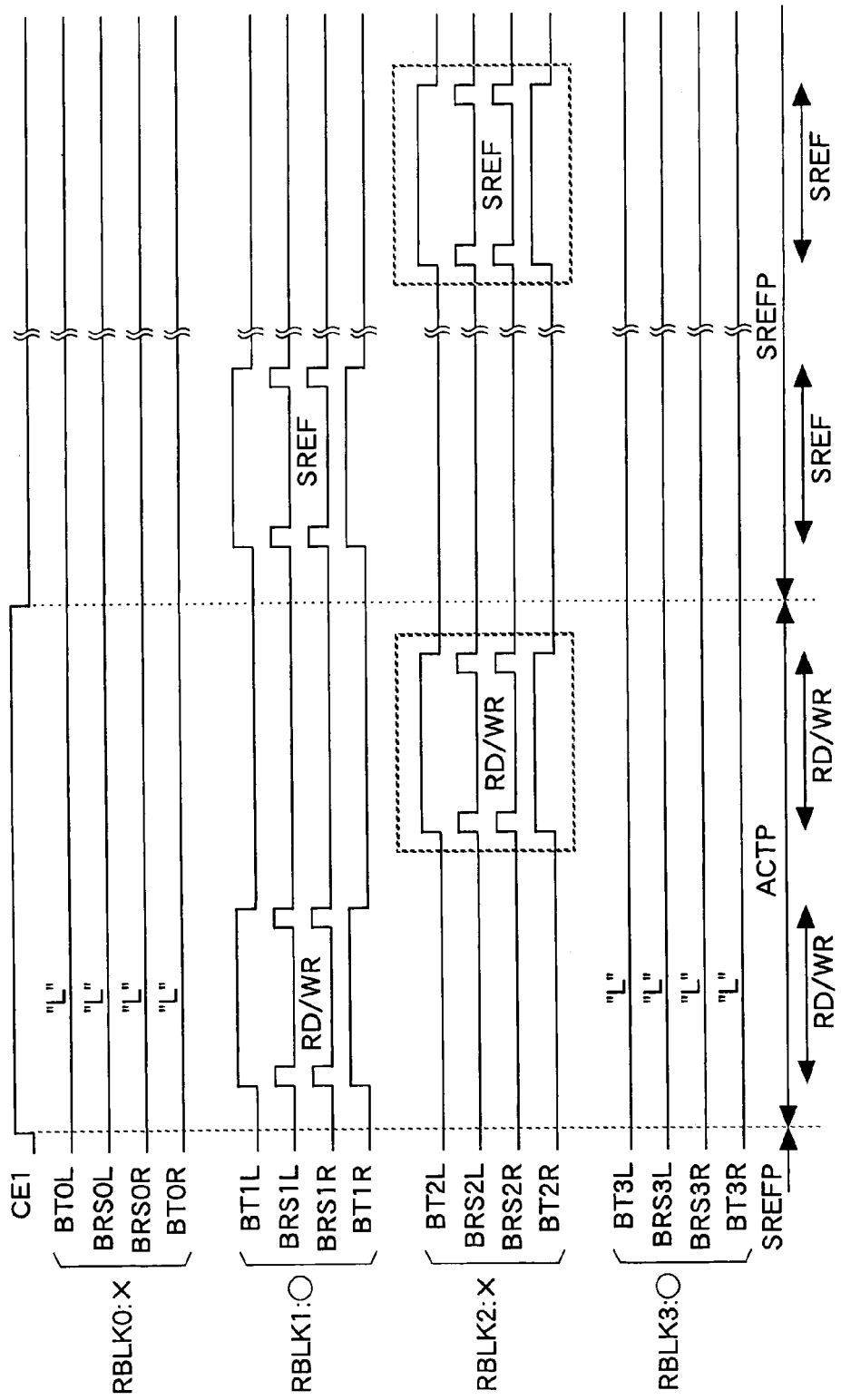
FIG. 5 is a timing chart showing operations of the first embodiment.

FIG. 5 shows operations of the first embodiment. In this example, external access operations (read operations RD or write operations WR) or self-refresh operations SREF are sequentially performed in the good memory block RBLK1 and bad memory block RBLK2 in response to an external access request (read command RD or write command WR) or an internal access request (refresh request RREQ) in an activation period ACTP in which the chip enable signal CE1 is activated. In the diagram, however, no refresh request RREQ generated during activation period ACTP is shown. Also, internal access operations (self-refresh operations SREF) are sequentially performed in the good memory block RBLK1 and bad memory block RBLK2 in response to an internal access request (refresh request RREQ) in a self-refresh period SREFP (self-refresh mode) in which the chip enable signal CE1 is inactivated. For example, a minimum supply interval of the read command RD or write command WR is 80 ns and the supply interval of the refresh request RREQ is 16 μs.

Figure 6:
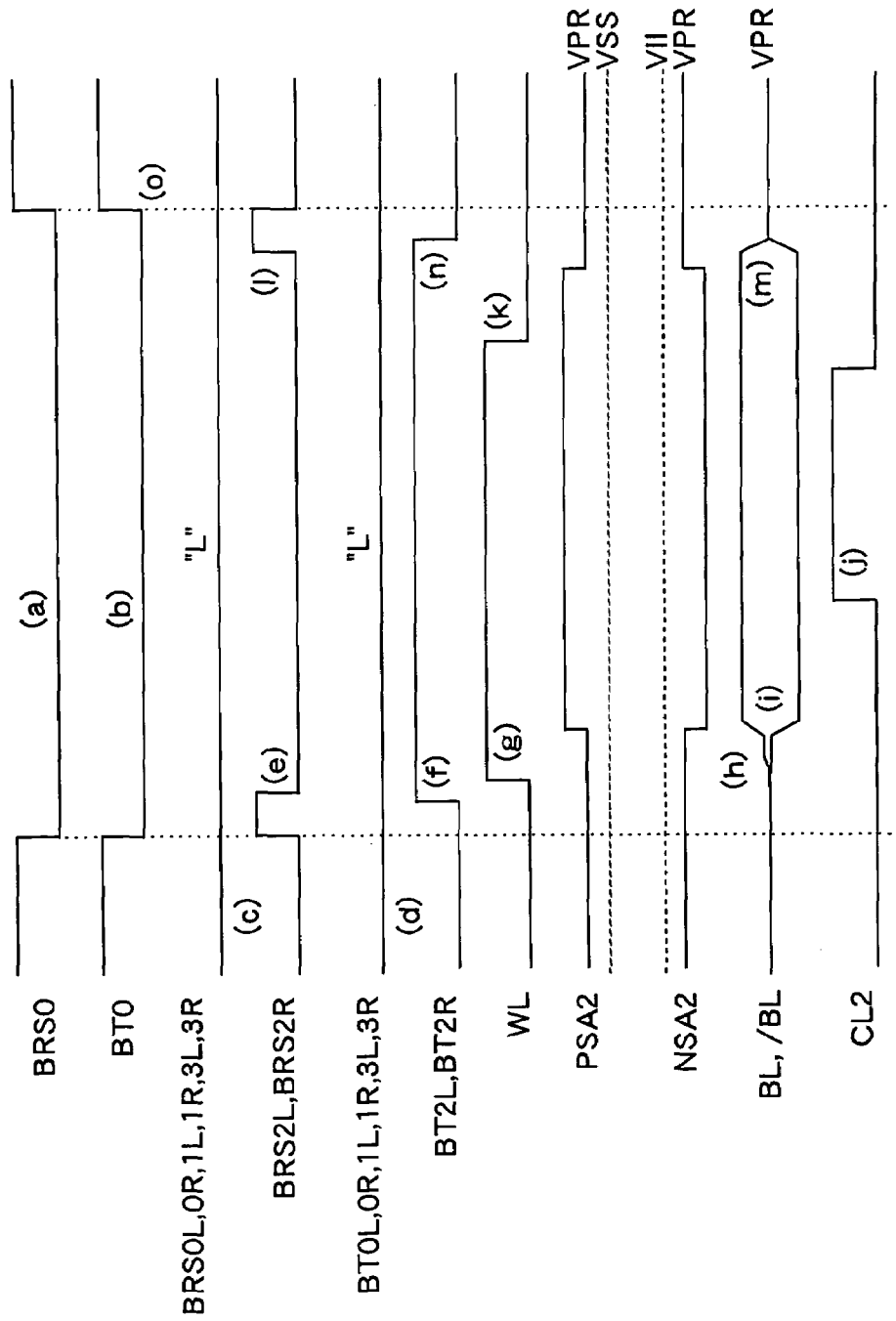
FIG. 6 is a timing chart showing details of an operation of an area denoted by a broken line frame in FIG. 5.

The activation period ACTP is an external standby period in which external access requests RD and WR can be received and the self-refresh period SREFP is an internal standby period in which reception of external access requests RD and WR is prohibited and only internal access requests RREQ are received. In the present embodiment, as described in FIG. 6 shown later, a cutoff function is set for all memory blocks RBLK0-3 in the activation period ACTP and self-refresh period SREFP. The cutoff function is a function to turn off the connection switch BT and precharge circuit PRE while no access operation of RD, WR, or SREF of the memory MEM is performed and is set by the switch control circuit 26 shown in FIG. 1. By setting the cutoff function for all memory blocks RBLK in a period of the activation period ACTP and self-refresh period SREFP in which neither access operation RD or WR nor self-refresh operation SREF is performed, the switch control circuit 26 eliminates a need for identifying bad memory blocks RBLK. Thus, a circuit scale of the switch control circuit 26 can be made smaller. Also, a circuit for storing information about bad memory blocks RBLK can be made unnecessary.

FIG. 6 shows details of an access operation in FIG. 5. Here, the access operation is one of a read operation RD, a write operation WR, and a self-refresh operation SREF. FIG. 6 shows, as an example, an access operation of the memory block RBLK2 denoted by a broken line frame in FIG. 5.

The operation control circuit 24 shown in FIG. 1 holds the precharge control signal BRS0 at the low logical level while the access operation is performed to release the connection between the bit lines BL and /BL and precharge voltage line VPR in the memory block RBLK in which an access operation is performed (FIG. 6(a)). The operation control circuit 24 also holds the switch control signal BT0 at the low logical level while an access operation is performed to turn off the connection switch BT of the memory block RBLK of a pair of memory blocks RBLK sharing the sense amplifier SA in which no access operation is performed (FIG. 6(b)).

The switch control circuit 26 shown in FIG. 1 sets the cutoff function and sets all precharge control signals BRS to the low logical level in accordance with a precharge control signal BRS0 in a standby period in which no access operation is performed (FIG. 6(c)). This prevents connection of the bit line BL or /BL and the precharge voltage line VPR via the precharge circuit PRE. Thus, even if a leak failure is present between a word line WL and a bit line BL or /BL and the voltage of the bit line BL or /BL drops below the precharge voltage VPR during standby period, a leak current can be prevented from flowing between the word line WL and precharge voltage line VPR.

The switch control circuit 26 also sets the cutoff function and sets all switch control signals BTZ to the low logical level in accordance with the switch control signal BT in a standby period in which no access operation is performed (FIG. 6(d)). This prevents connection of the sense amplifier activation signal line PSA or NSA set to the precharge voltage VPR during standby period and the bit line BL or /BL via the sense amplifier SA. As a result, an increase in standby current can be prevented.

More specifically, if an inactivation level of a word line WL is a negative voltage and a leak failure is present between the word line WL and bit line BL or /BL, the voltage of the bit line BL or /BL may become negative during standby period. If a gate voltage of a pMOS transistor of the sense amplifier SA shown in FIG. 3 becomes negative, the PMOS transistor is turned on and a current flows from the sense amplifier activation signals PSA and NSA (voltage VPR) to the bit lines BL and /BL (negative voltage). Alternatively, if one of the bit lines BL and /BL becomes a negative voltage and the other becomes equal to the precharge voltage VPR, the source of one of nMOS transistors of the sense amplifier SA becomes negative voltage and the nMOS transistor is turned on. This causes a current to flow from the sense amplifier activation signals PSA and NSA (voltage VPR) to the bit lines BL and /BL (negative voltage). By turning off the connection switch BT during standby period, such an incorrect current can be prevented from flowing.

On the other hand, the switch control circuit 26 releases the cutoff function in synchronization with a start of an access operation and temporarily sets only the precharge control signals BRS2L and BRS2R corresponding to the memory block RBLK2 in which the access operation is performed to the high logical level until the word line WL is activated (FIG. 6(e)). This sets a voltage of the bit line BL or /BL relating to the access operation to the precharge voltage VPR before the access operation also when the voltage of the bit line is lower than the precharge voltage VPR due to a leak failure.

Further, the switch control circuit 26 releases the cutoff function in synchronization with the start of an access operation and sets only the switch control signals BT2L and BT2R corresponding to the memory block RBLK2 in which the access operation is performed to the high logical level before the word line WL is activated (FIG. 6(f)). This connects the bit lines BL and /BL relating to the access operation to the sense amplifier SA.

Then, the word line WL is activated (FIG. 6(g)) and data is read from the memory cell MC to one of the bit lines BL and /BL (FIG. 6(h)). Next, the sense amplifier activation signals PSA2 and NSA2 are activated and a voltage difference between the bit lines BL and /BL is amplified (FIG. 6(i)). While the sense amplifier SA is operating, the column switch signal CL2 changes to the high logical level and data in the bit lines BL and /BL is read to the data lines DT and /DT (FIG. 6(j)).

Next, the word line WL is inactivated and the sense amplifier activation signals PSA2 and NSA2 are inactivated (FIG. 6(k)). After the sense amplifier SA stops its operation, the switch control circuit 26 temporarily sets the precharge control signals BRS2L and BRS2R to the high logical level (FIG.

6 (*l*)). This resets the voltages of the bit lines BL and /BL to the precharge voltage VPR (FIG. 6 (*m*)). Also, after the sense amplifier SA stops its operation, the switch control circuit 26 inactivates the switch control signals BT2L and BT2R to the low logical level (FIG. 6 (*n*)). Then, the access operation is completed. In a standby period after the access operation, the switch control circuit 26 sets the cutoff function and sets all precharge control signals BRS and switch control signals BTZ to the low logical level (FIG. 6(*o*)). This turns off all precharge circuits PRE and connection switches BT to reduce a standby current.

In the first embodiment described above, since the connection switch BT and precharge circuit PRE are turned off during standby period in which no access operation RD, WR, or SREF is performed, a leak current can be prevented from flowing from a word line WL to a precharge voltage line VPR even when a short circuit failure is present between the word line WL and a bit line BL or /BL. As a result, current consumption of the memory MEM, particularly a standby current can be reduced.

Figure 7:
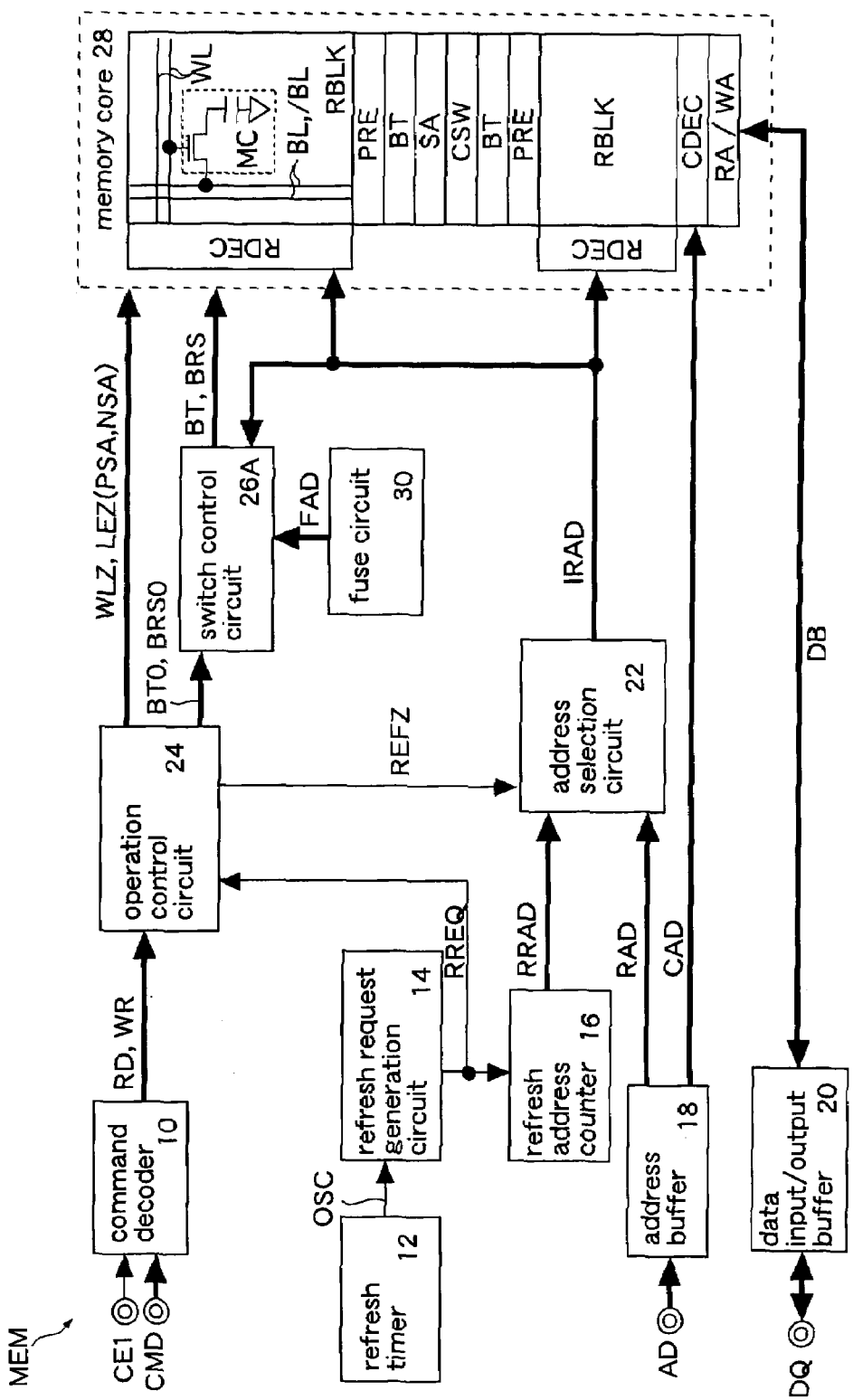
FIG. 7 is a block diagram showing a second embodiment of the present invention.

FIG. 7 shows a second embodiment of the present invention. The same symbols and numerals are attached to the same components as those described in the first embodiment and a detailed description thereof is omitted. In the present embodiment, a switch control circuit 26A is formed instead of the switch control circuit 26 in the first embodiment. Also, a fuse circuit 30 (leak memory unit) is newly formed. Other components are the same as those in the first embodiment.

The fuse circuit 30 stores location information of bad memory blocks RBLK having a leak failure between a word line WL and a bit line BL (or /BL) using a built-in fuse program. The fuse circuit 30 outputs the stored location information as a block address FAD. The fuse circuit 30 may use a redundant fuse circuit storing block addresses of bad memory blocks RBKL to replace a bad memory block RBLK with a redundancy memory block RBLK (not shown) or a circuit may be formed separately from the redundant fuse circuit.

The switch control circuit 26A sets the cutoff function only for bad memory blocks RBLK indicated by bad block addresses FAD and releases the cutoff function for good memory blocks RBLK. Essentially, the cutoff function needs to be set only for bad memory blocks RBLK. The switch control circuit 26A monitors the row address signal RAD and, when an access operation RD, WR, or SREF to bad memory blocks RBLK is performed, releases the cutoff function like in the first embodiment. When an access operation RD, WR, or SREF to good memory blocks RBLK is performed, the switch control circuit 26A controls operations of the precharge circuit PRE and connection switch BT as before.

Figure 8:
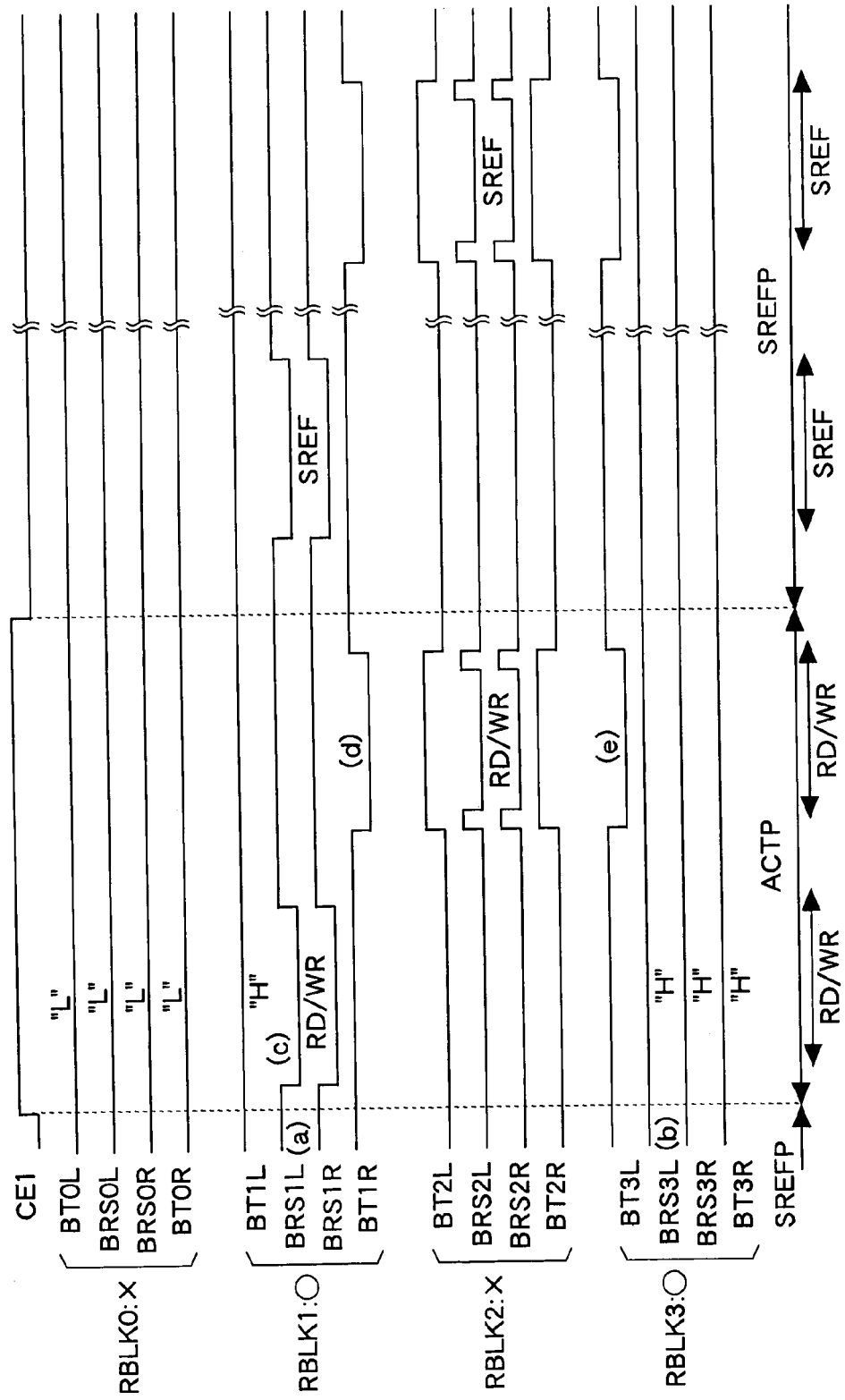
FIG. 8 is a timing chart showing operations of the second embodiment.

FIG. 8 shows operations of the second embodiment. Locations of bad memory blocks RBLK and a sequence of access operations RD, WR, and SREF are the same as those in the first embodiment. A detailed description of the same operation as that in the first embodiment is omitted. An operation of the bad memory blocks RBLK0 and 2 is the same as that in the first embodiment.

In the good memory blocks RBLK1 and 3, the precharge control signal BRS (BRS1L, 1R, 3L, and 3R) and switch control signal BT (BT1L, 1R, 3L, and 3R) are set to the high logical level during standby period in which no access operation is performed (FIG. 8 (*a, b*)). The precharge control signal BRS changes to the low logical level only during access operation (FIG. 8 (*c*)). When an access operation is performed in an adjacent memory block RBLK, the switch control signal BT (BT1R, BT3L) changes to the low logical level to turn off the connection switch BT connected to the sense amplifier SA in which an amplification operation is performed (FIG. 8 (*d, e*)).

Also in the second embodiment described above, the same advantages as those of the first embodiment described above can be obtained. Further, in the present embodiment, a wasteful operation of the connection switch BT can be prevented to further reduce a standby current by setting the cutoff function for only bad memory blocks RBLK.

Figure 9:
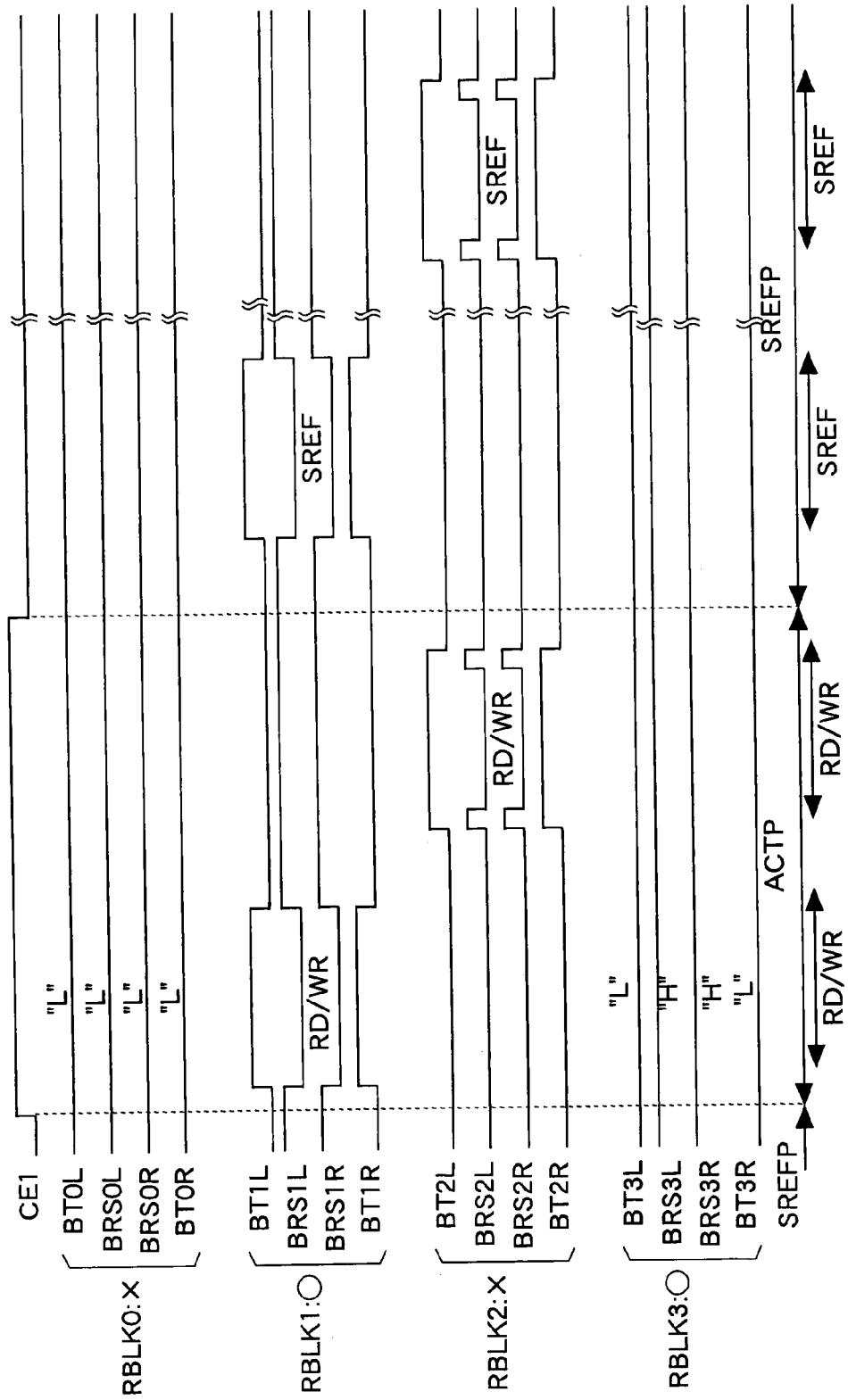
FIG. 9 is a timing chart showing operations of a third embodiment.

FIG. 9 shows operations of a third embodiment. The same symbols and numerals are attached to the same components as those described in the first and second embodiments and a detailed description thereof is omitted. In the present embodiment, the cutoff function to turn off the connection switch BT is set also for good memory blocks RBLK during a period in which no access operation RD, WR, or SREF is performed. Other components are the same as those in the second embodiment (FIG. 8). The precharge control signal BRS in the good memory blocks RBLK1 and 3 holds the high logical level also while the cutoff function is set. A memory MEM in the present embodiment is the same as that in the second embodiment (FIG. 7) except that the operation of the switch control circuit 26A is different.

Also in the third embodiment described above, the same advantages as those of the first and second embodiments described above can be obtained. Further, in the present embodiment, logic of the switch control circuit can be made simpler because the operation of the connection switch BT for the good memory blocks RBLK1 and 3 and that for the bad memory blocks RBLK0 and 2 can be made the same.

Figure 10:
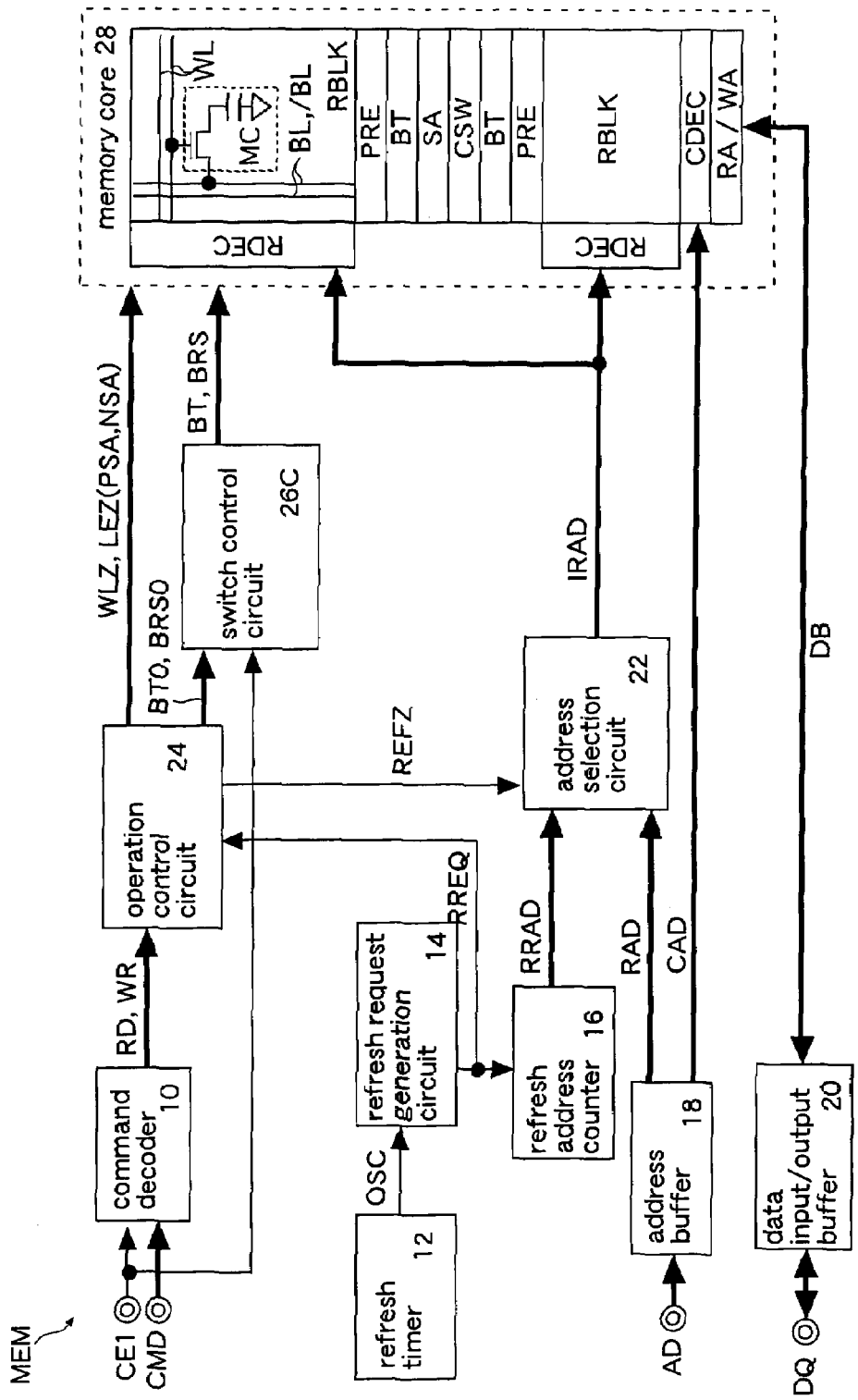
FIG. 10 is a block diagram showing a fourth embodiment of the present invention.

FIG. 10 shows a fourth embodiment of the present invention. The same symbols and numerals are attached to the same components as those described in the first and second embodiments and a detailed description thereof is omitted. In the present embodiment, a switch control circuit 26C is formed instead of the switch control circuit 26 in the first embodiment. Other components are the same as those in the first embodiment.

The switch control circuit 26C sets the cutoff function only in a self-refresh period SREFP in which the chip enable signal CE1 is inactivated and releases the cutoff function in an activation period ACTP in which the chip enable signal CE1 is activated. The self-refresh period SREFP is an internal standby period in which reception of external access requests RD and WR is prohibited and only internal access requests SREF can be received. The activation period ACTP is an external standby period in which external access requests RD and WR and internal access requests SREF can be received.

Figure 11:
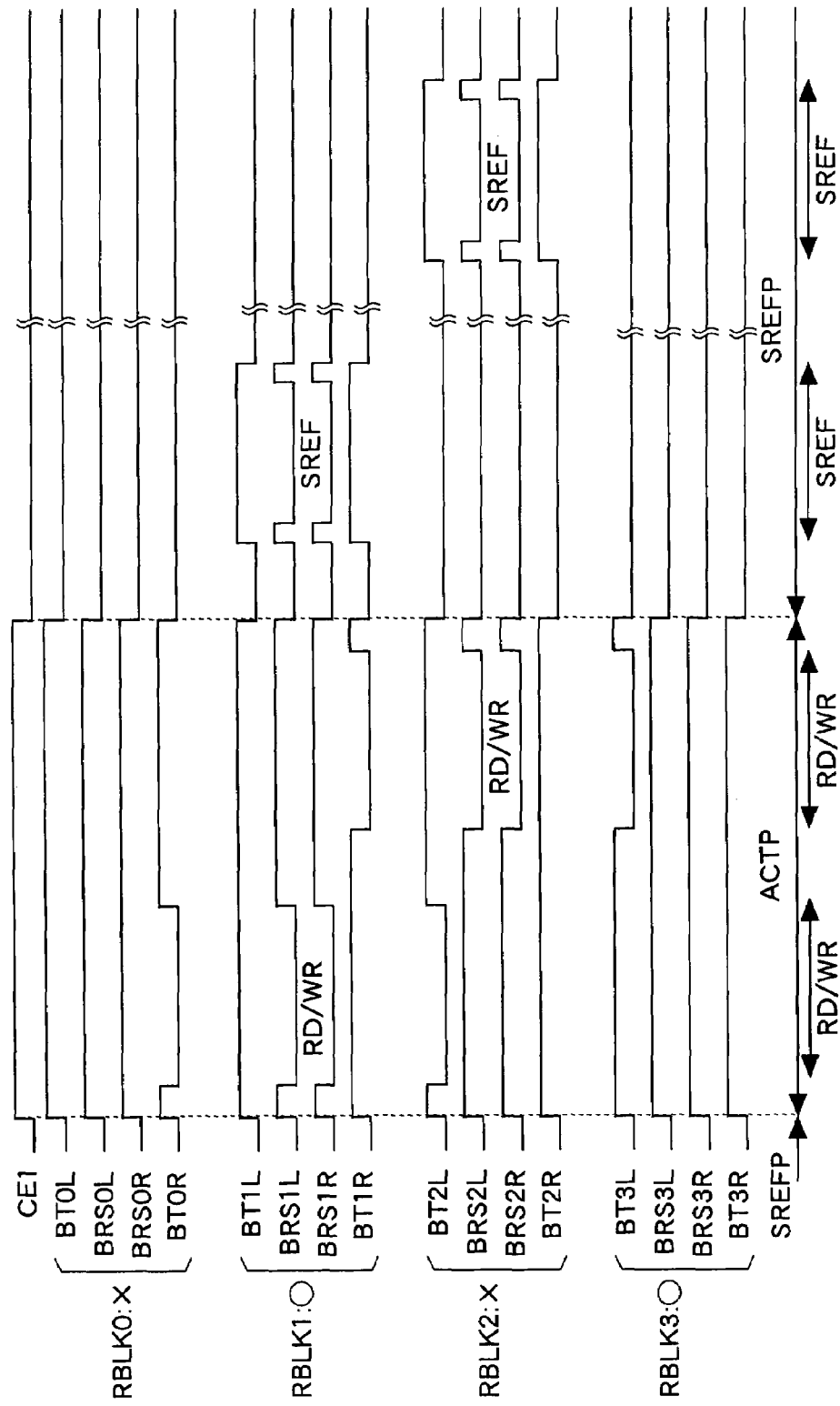
FIG. 11 is a timing chart showing operations of the fourth embodiment.

FIG. 11 shows operations of the fourth embodiment. Locations of bad memory blocks RBLK and the sequence of access operations RD, WR, and SREF are the same as those in the first embodiment. A detailed description of the same operation as that in the first embodiment is omitted. The operation in the self-refresh period SREFP is the same as that in the first embodiment (FIG. 5). The operation in the activation period ACTP is the same as that of good memory blocks RBLK in the second embodiment (FIG. 8). That is, in the activation period ACTP, the precharge control signal BRS changes to the low logical level only during access operation. When an access operation is performed in an adjacent memory block RBLK, the switch control signal BT corresponding to the connection switch BT connected to the sense amplifier SA in which an amplification operation is performed changes to the low logical level.

Also in the fourth embodiment described above, the same advantages as those of the first and second embodiments described above can be obtained. Further, in the present embodiment, since switching control of the switch control circuit 26 can be performed easily during activation period ACTP, longer access time can be prevented by the switching control of the switch control circuit 26. Incidentally, in the activation period ACTP, read operations RD and write operations WR are in most cases frequently performed and thus current consumption is relatively large. Consequently, an influence of a leak current accompanying a leak failure between a word line WL and a bit line BL or /BL is slight. In the self-refresh period SREFP, on the other hand, a refresh request RREQ is supplied every 16 μs or so and thus a self-refresh operation SREF is performed only every 16 μs. Therefore, if a leak failure is present between a word line WL and a bit line BL or /BL, a leak current thereof has a considerable influence on a standby current.

Figure 12:
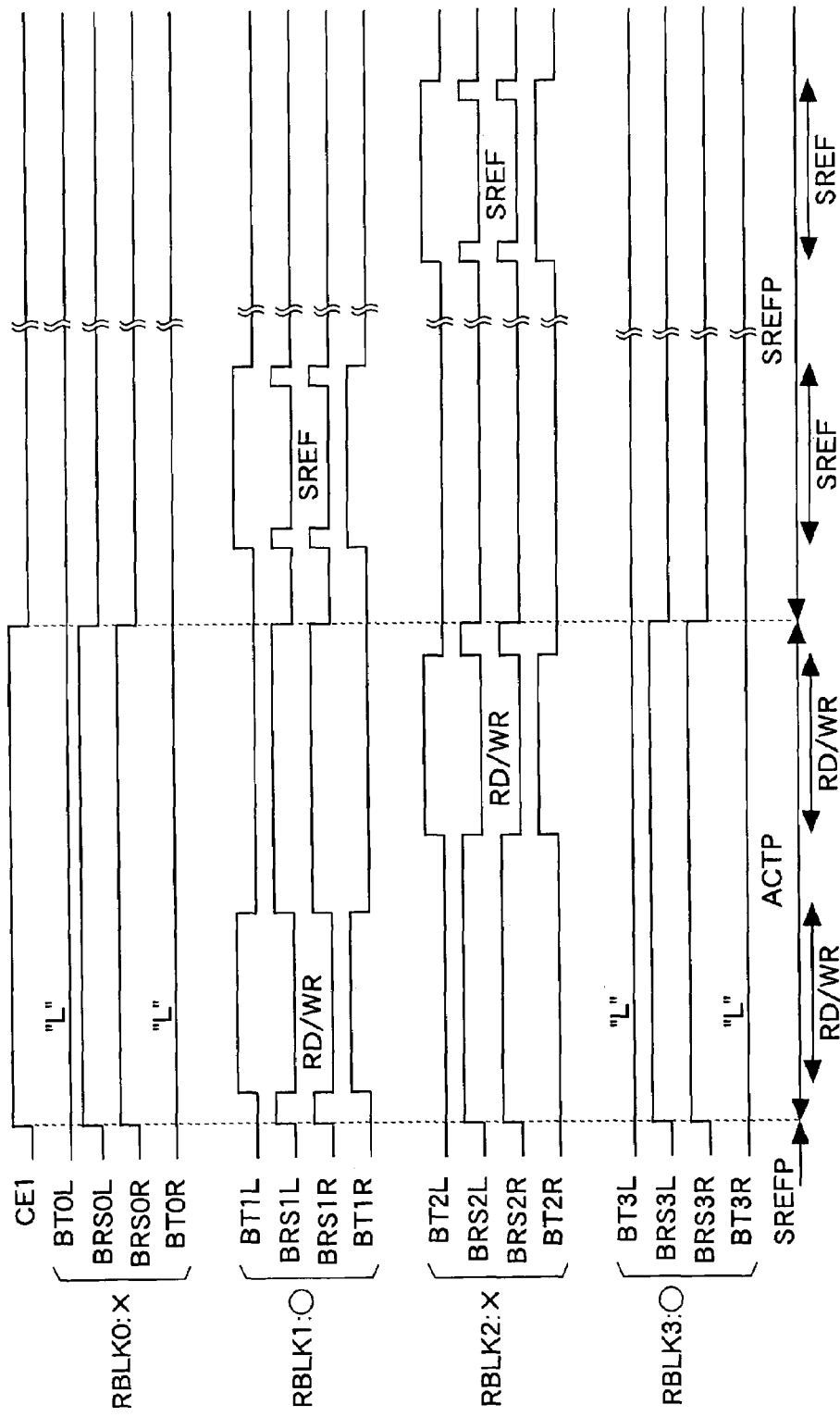
FIG. 12 is a timing chart showing operations of a fifth embodiment.

FIG. 12 shows operations of a fifth embodiment. The same symbols and numerals are attached to the same components as those described in the above embodiments and a detailed description thereof is omitted. In the present embodiment, the cutoff function to turn of the connection switch BT is set in a period in which no access operation RD or WR is performed in the activation period ACTP. Other components are the same as those in the fourth embodiment (FIG. 11). A memory MEM in the present embodiment is the same as that in the fourth embodiment (FIG. 10) except that the operation of the switch control circuit 26C is different. Also in the fifth embodiment described above, the same advantages as those of the above embodiments can be obtained.

Figure 13:
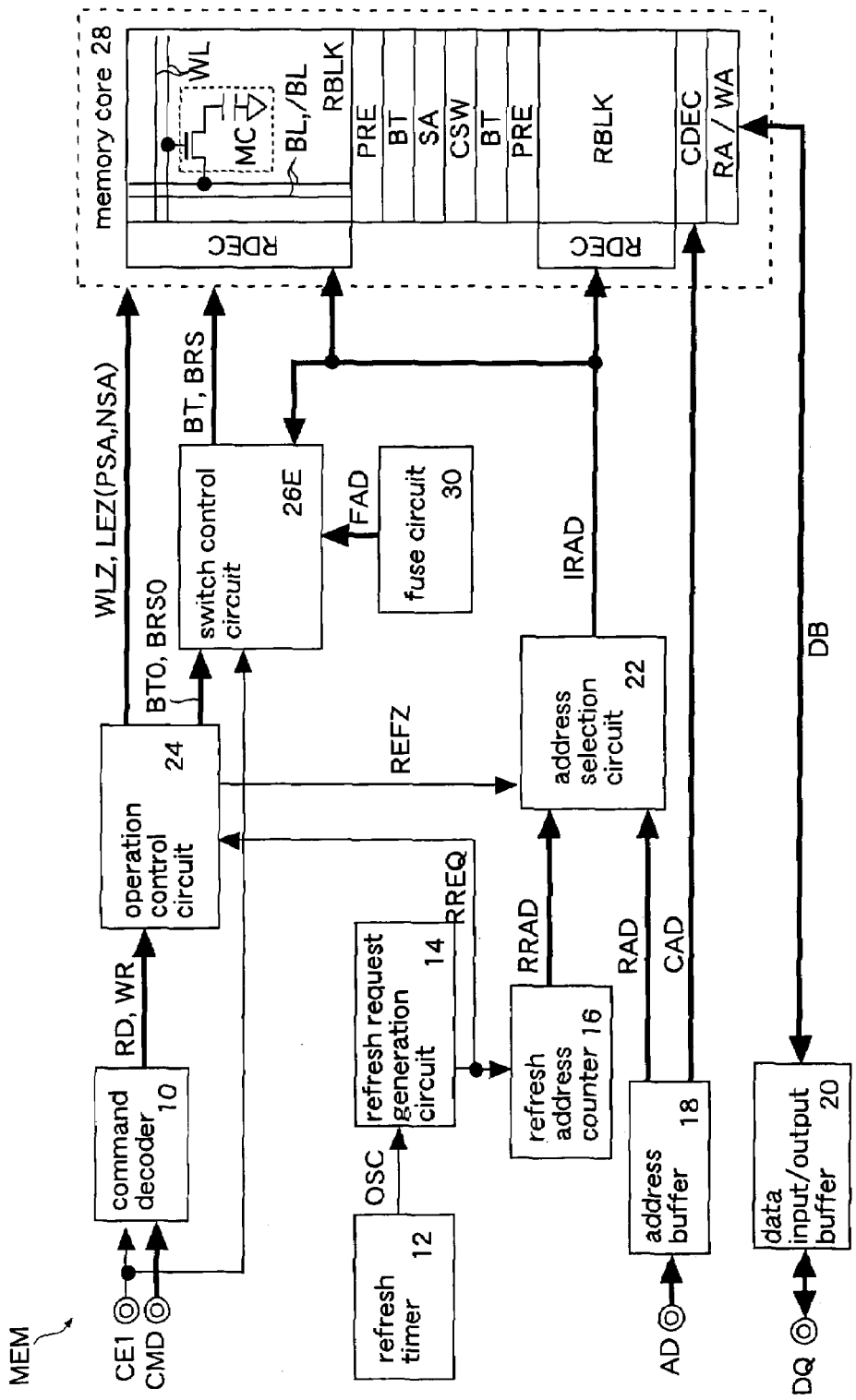
FIG. 13 is a block diagram showing a sixth embodiment of the present invention.

FIG. 13 shows a sixth embodiment of the present invention. The same symbols and numerals are attached to the same components as those described in the above embodiments and a detailed description thereof is omitted. In the present embodiment, a switch control circuit 26E is formed instead of the switch control circuit 26C in the fourth embodiment. Also, the same fuse circuit 30 as that in the second embodiment is formed. Other components are the same as those in the fourth embodiment.

The switch control circuit 26E sets the cutoff function for the bad memory blocks RBLK0 and 2 only in the self-refresh period SREFP (internal standby period) in which the chip enable signal CE1 is inactivated. The switch control circuit 26E releases the cutoff function for good memory blocks RBLK and also releases the cutoff function in an activation period ACTP (external standby period) in which the chip enable signal CE1 is activated.

Figure 14:
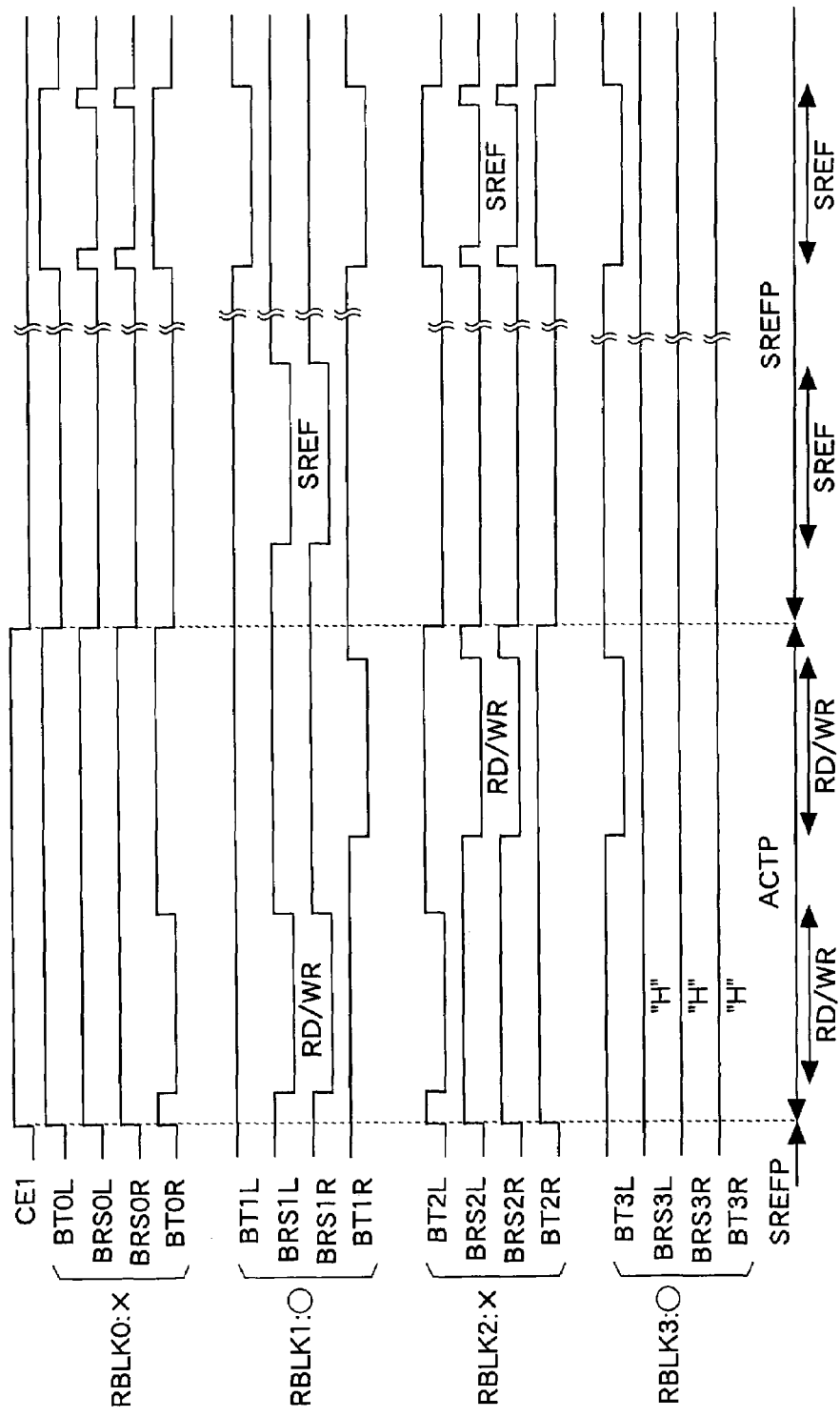
FIG. 14 is a timing chart showing operations of the sixth embodiment.

FIG. 14 shows operations of the sixth embodiment. Locations of bad memory blocks RBLK and the sequence of access operations RD, WR, and SREF are the same as those in the first embodiment. A detailed description of the same operation as that in the first embodiment is omitted. The operation in the activation period ACTP is the same as that in the fourth embodiment (FIG. 11).

In the present embodiment, when a self-refresh operation SREF is performed in the bad memory block RBLK2, the cutoff function is released not only for the bad memory block RBLK2, but also for the other bad memory block RBLK0. This can make the logic of the switch control circuit 26E simpler. Further, if a leak failure is present between a word line WL and a bit line BL, the voltage of the bit lines BL and /BL drops below the precharge voltage VPR during standby because a refresh request RREQ occurs relatively infrequently. By temporarily performing a precharge operation for each refresh request RREQ, a shift of the voltage of the bit lines BL and /BL from the precharge voltage VPR can be minimized. As a result, a precharge operation temporarily performed when starting a self-refresh operation can be made shorter and a self-refresh operation time can be made equal to a read operation time and a write operation time. That is, timing control by the operation control circuit 24 can be prevented from becoming more complex.

Also in the sixth embodiment described above, the same advantages as those of the above embodiments can be obtained. Further, in the present embodiment, a precharge operation of the bit lines BL and /BL can be performed for each refresh request RREQ in all bad memory blocks RBLK0 and 2 by releasing the cutoff function for all bad memory blocks RBLK0 and 2 for each refresh request RREQ. This can minimize a shift of the bit lines BL and /BL in the self-refresh period SREFP.

Figure 15:
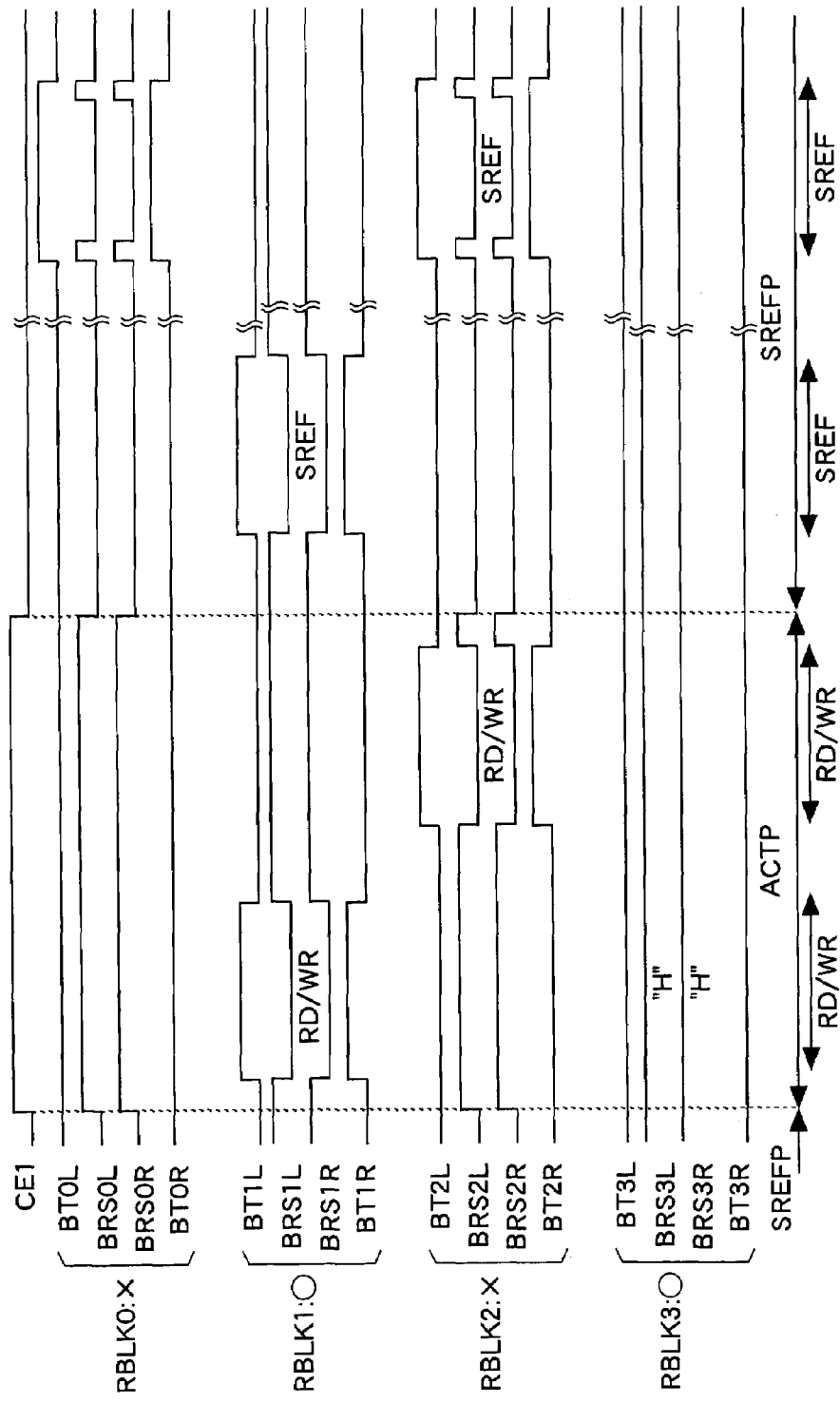
FIG. 15 is a timing chart showing operations of a seventh embodiment.

FIG. 15 shows operations of a seventh embodiment. The same symbols and numerals are attached to the same components as those described in the above embodiments and a detailed description thereof is omitted. In the present embodiment, the cutoff function to turn off the connection switch BT is set in a period in which no access operation RD or WR is performed in the activation period ACTP. Other components are the same as those in the sixth embodiment (FIG. 14). A memory MEM in the present embodiment is the same as that in the sixth embodiment (FIG. 13) except that the operation of the switch control circuit 26E is different. Also in the seventh embodiment described above, the same advantages as those of the above embodiments can be obtained.

Figure 16:
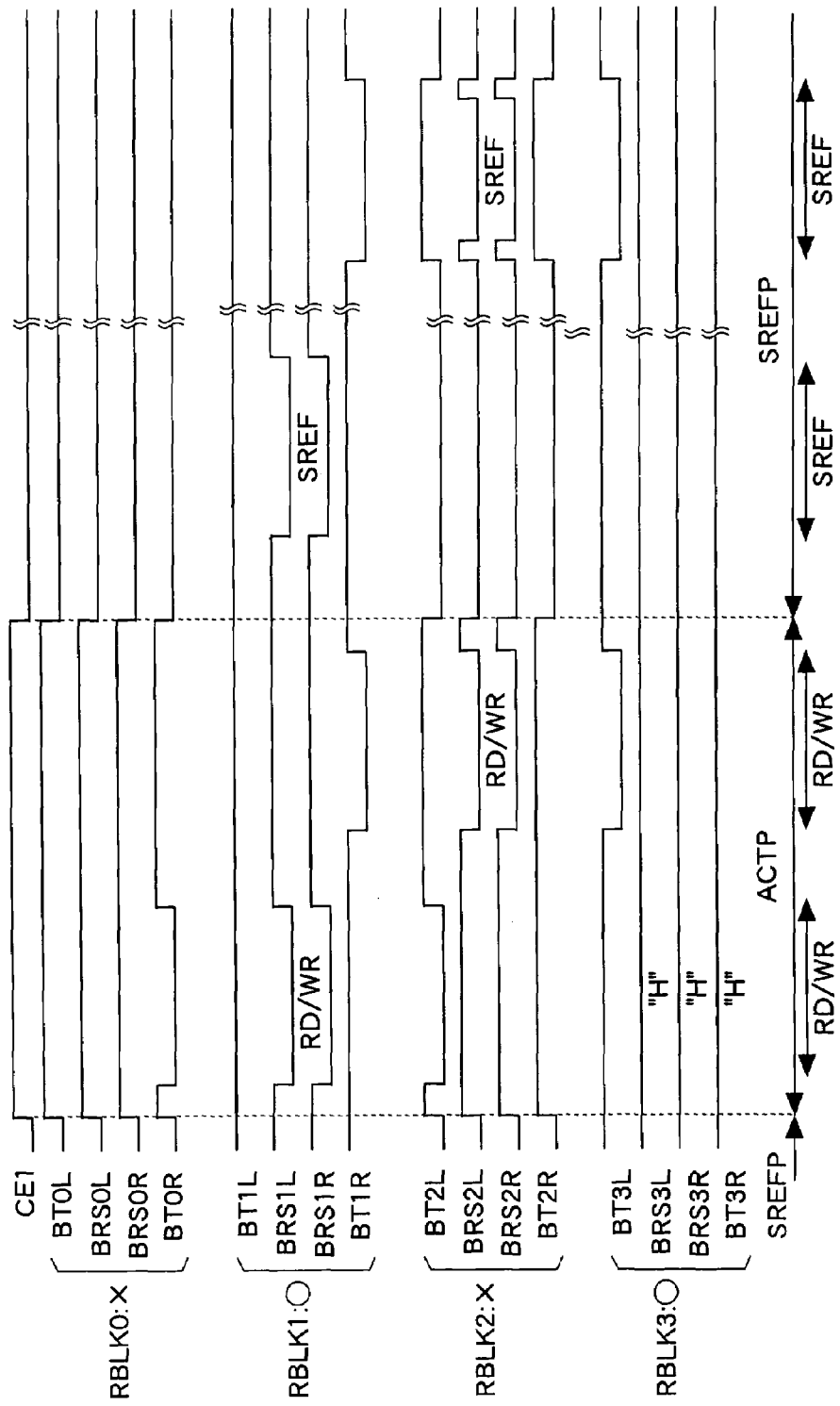
FIG. 16 is a timing chart showing operations of an eighth embodiment.

FIG. 16 shows operations of an eighth embodiment. The same symbols and numerals are attached to the same components as those described in the above embodiments and a detailed description thereof is omitted. In the present embodiment, the cutoff function is released only for the bad memory blocks RBLK0 and 2 in which a self-refresh operation SREF is performed in the self-refresh period SREFP. The setting of the cutoff function is maintained for the bad memory blocks RBLK0 and 2 when no self-refresh operation is performed and off states of the connection switch BT and precharge circuit PRE are maintained. Other components are the same as those in the sixth embodiment (FIG. 14). A memory MEM in the present embodiment is the same as that in the sixth embodiment (FIG. 13) except that the operation of the switch control circuit 26E is different. Also in the eighth embodiment described above, the same advantages as those of the above embodiments can be obtained.

Figure 17:
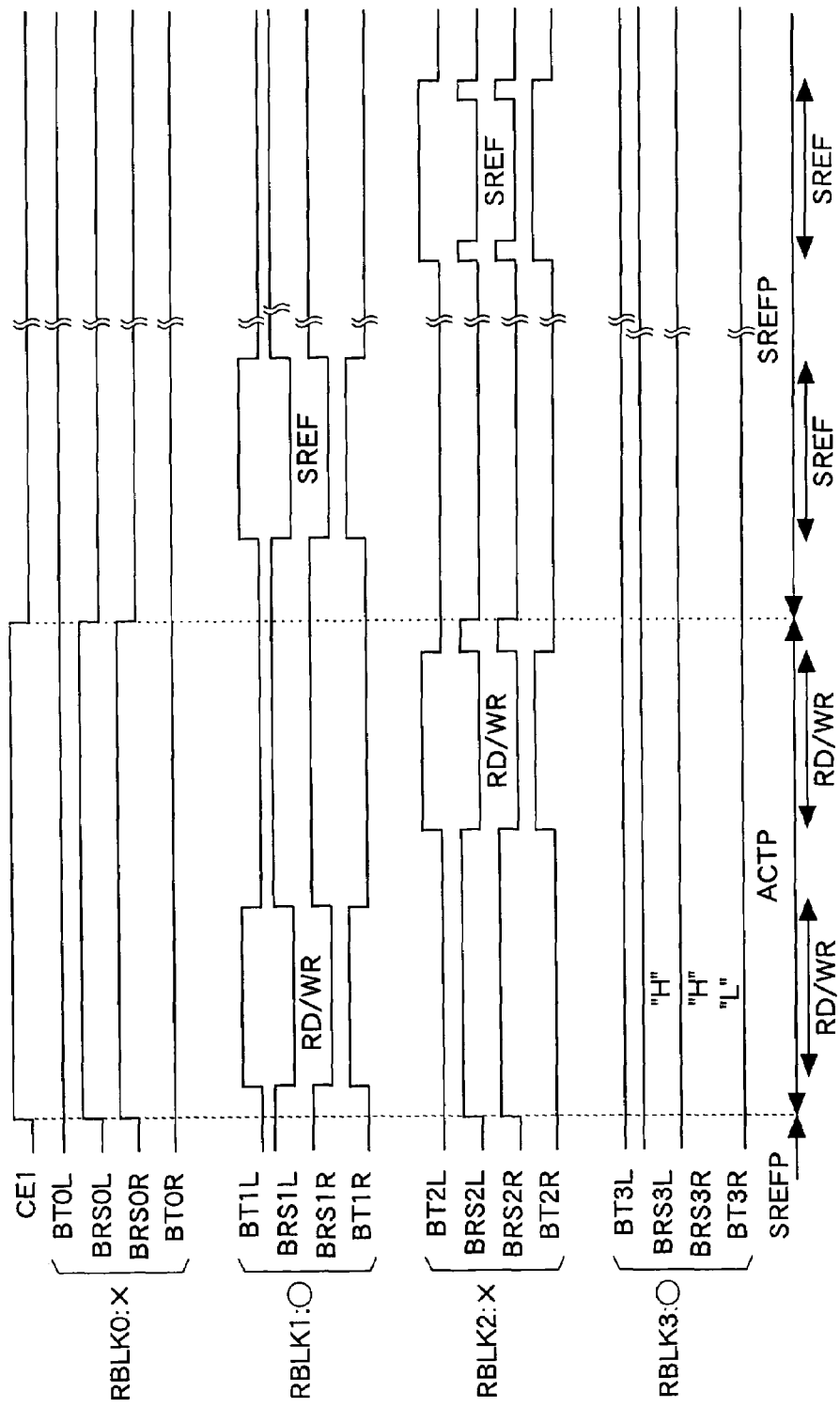
FIG. 17 is a timing chart showing operations of a ninth embodiment.

FIG. 17 shows operations of a ninth embodiment. The same symbols and numerals are attached to the same components as those described in the above embodiments and a detailed description thereof is omitted. In the present embodiment, the cutoff function is released only for the bad memory blocks RBLK0 and 2 in which a self-refresh operation SREF is performed in the self-refresh period SREFP. The setting of the cutoff function is maintained for the bad memory blocks RBLK0 and 2 when no self-refresh operation is performed and off states of the connection switch BT and precharge circuit PRE are maintained. Other components are the same as those in the seventh embodiment (FIG. 15). A memory MEM in the present embodiment is the same as that in the sixth embodiment (FIG. 13) except that the operation of the switch control circuit 26E is different. Also in the ninth embodiment described above, the same advantages as those of the above embodiments can be obtained.

Figure 18:
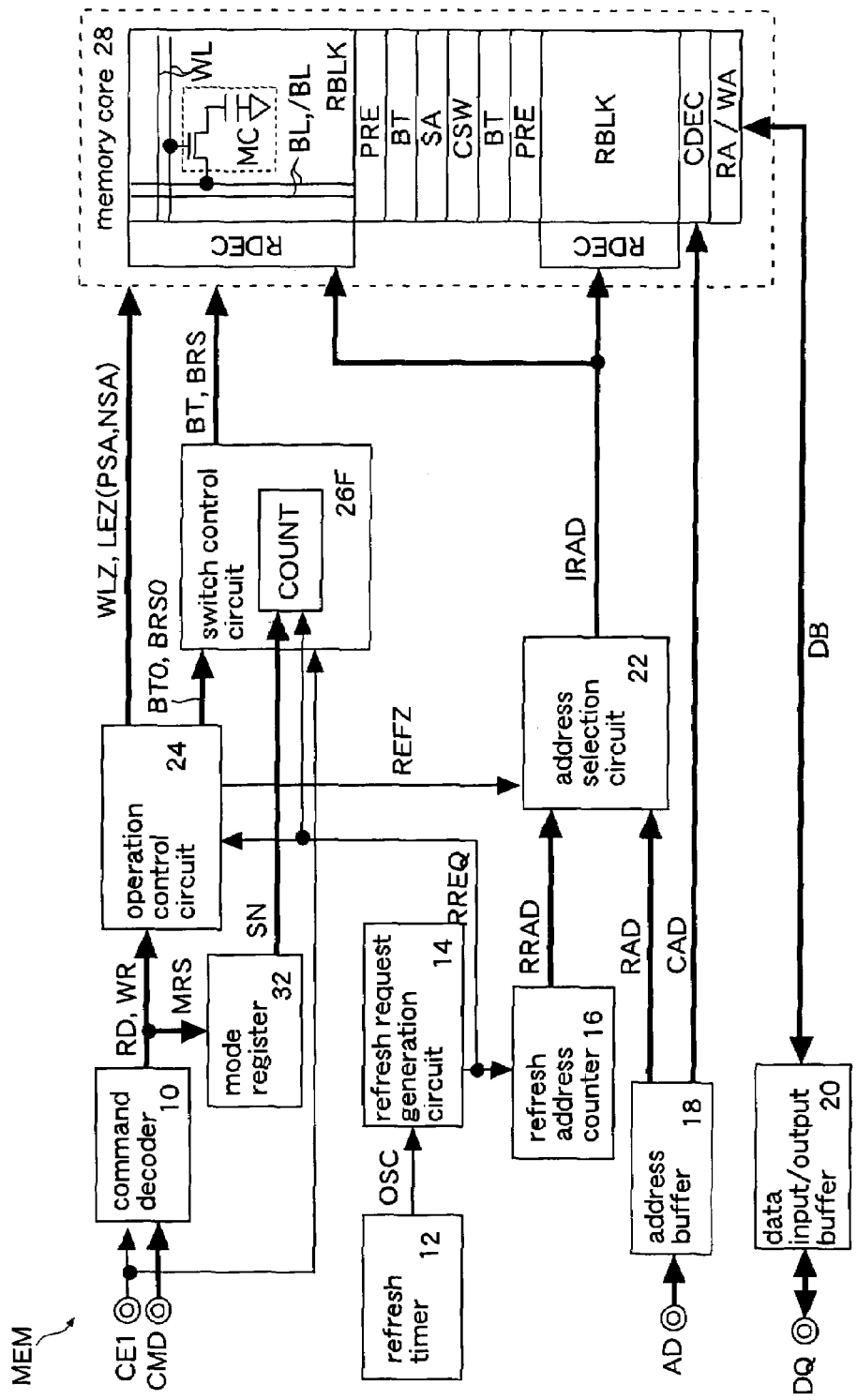
FIG. 18 is a block diagram showing a tenth embodiment of the present invention.

FIG. 18 shows a tenth embodiment of the present invention. The same symbols and numerals are attached to the same components as those described in the above embodiments and a detailed description thereof is omitted. In the present embodiment, a switch control circuit 26F is formed instead of the switch control circuit 26C in the fourth embodiment (FIG.

10). Also, a mode register 32 (set circuit) is newly formed. Other components are the same as those in the fourth embodiment.

The mode register 32 stores the number of times of self-refresh requests RREQ between the time when a self-refresh period SREFP starts and the time when the cutoff function is set, and outputs the stored number of times as a number signal SN. When, for example, a mode register set command MRS is received by the command decoder 10, the mode register 32 stores, for example, the value of the address signal AD as the above number of times.

The switch control circuit 26F has a counter COUNT for counting the number of times of refresh requests RREQ. The counter COUNT is reset when a self-refresh period SREFP is started and count operations are performed until the number of times of refresh requests RREQ becomes equal to a value indicated by the number signal SN. The switch control circuit 26F sets the cutoff function when the counter value of the counter COUNT becomes equal to the value indicated by the number signal SN.

Figure 19:
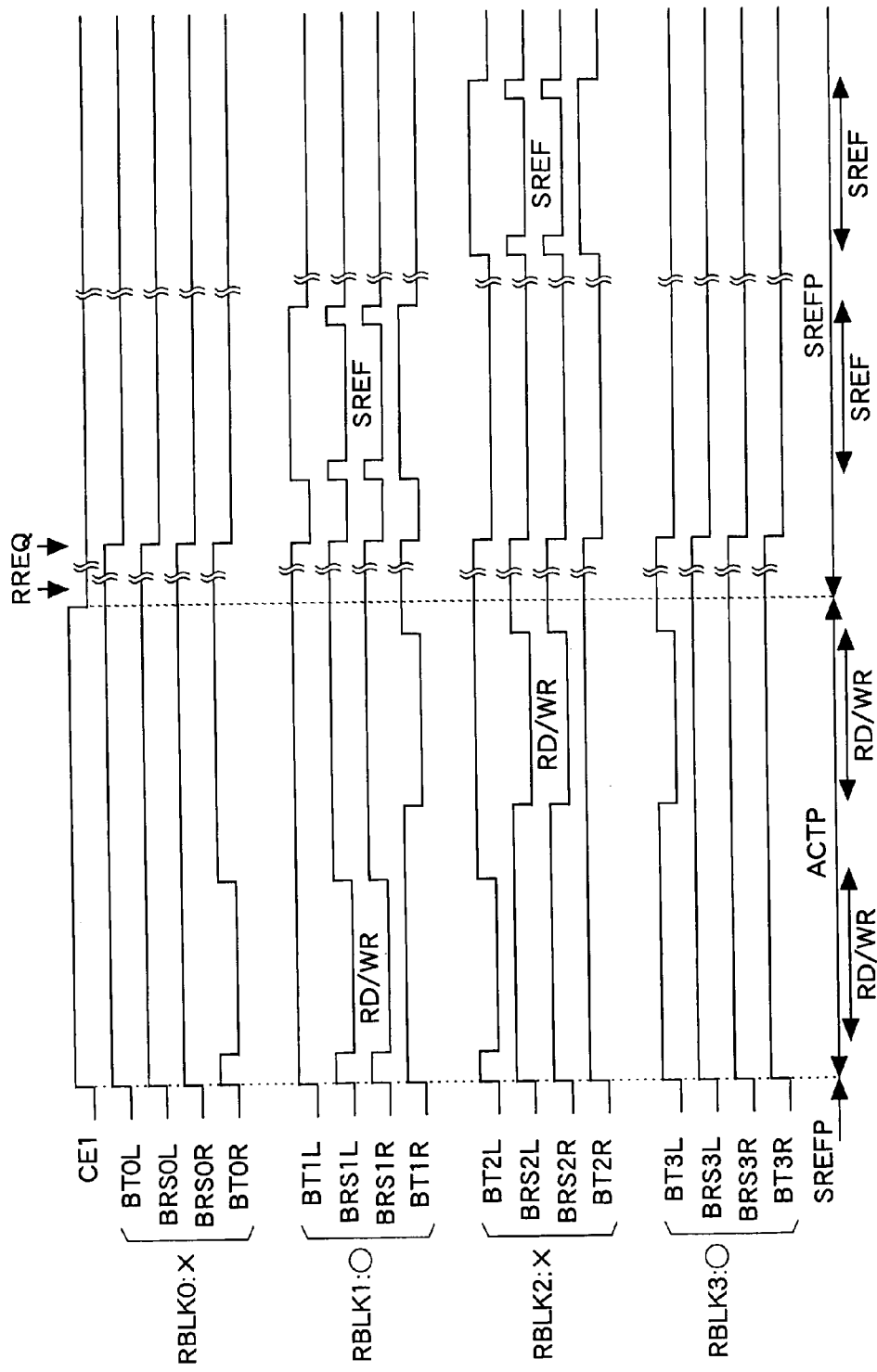
FIG. 19 is a timing chart showing operations of the tenth embodiment.

FIG. 19 shows operations of the tenth embodiment. The same symbols and numerals are attached to the same components as those described in the above embodiments and a detailed description thereof is omitted. Operations of the present embodiment are the same as those in the fourth embodiment (FIG. 11) except that the cutoff function is set after the second refresh request RREQ occurs in a self-refresh period SREFP. That is, the mode register 32 outputs the number signal SN indicating "twice."

Also in the tenth embodiment described above, the same advantages as those of the above embodiments can be obtained. Further, in the present embodiment, the cutoff function can be prevented from immediately being released after being set when the chip enable signal CE1 is temporarily inactivated. In other words, the cutoff function can be set after reliably entering the self-refresh mode by waiting until refresh requests RREQ occur a predetermined number of times before the cutoff function is set. As a result, the switch control circuit 26F can be prevented from repeatedly setting/releasing the cutoff function wastefully, thereby reducing current consumption of the memory MEM.

Figure 20:
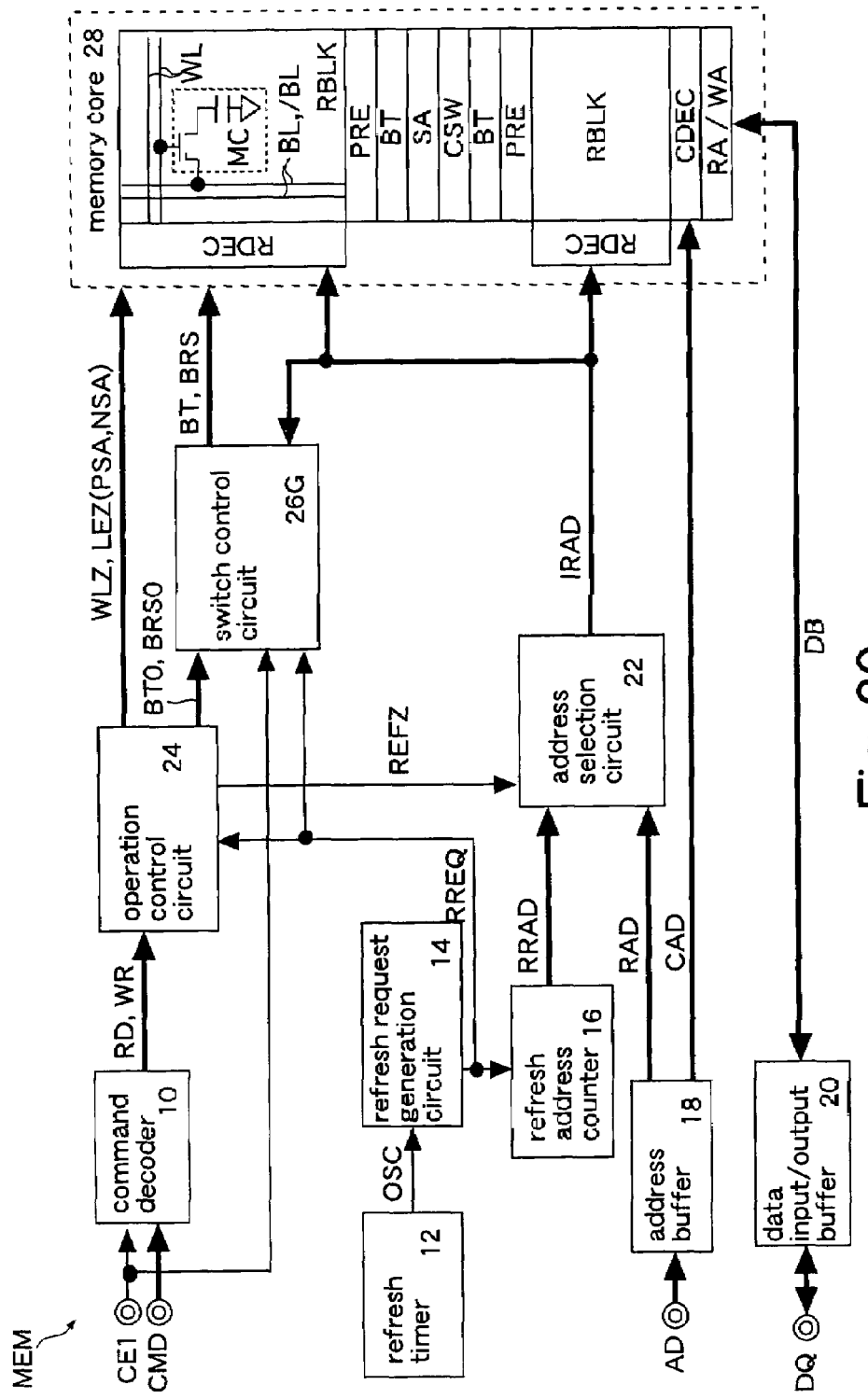
FIG. 20 is a block diagram showing an eleventh embodiment of the present invention.

FIG. 20 shows an eleventh embodiment of the present invention. The same symbols and numerals are attached to the same components as those described in the above embodiments and a detailed description thereof is omitted. In the present embodiment, a switch control circuit 26G is formed instead of the switch control circuit 26C in the fourth embodiment (FIG. 10). Other components are the same as those in the fourth embodiment.

The switch control circuit 26G sets the cutoff function after the first refresh operation SREF in response to a refresh request RREQ is performed after switching from an activation period ACTP to a self-refresh period SREFP. The switch control circuit 26G also releases the cutoff function in response to the first access request RD, WR, or SREF after switching from a self-refresh period SREFP to an activation period ACTP. The switch control circuit 26G receives the internal row address signal IRAD to set and release the cutoff function for each memory block RBLK0-3.

Figure 21:
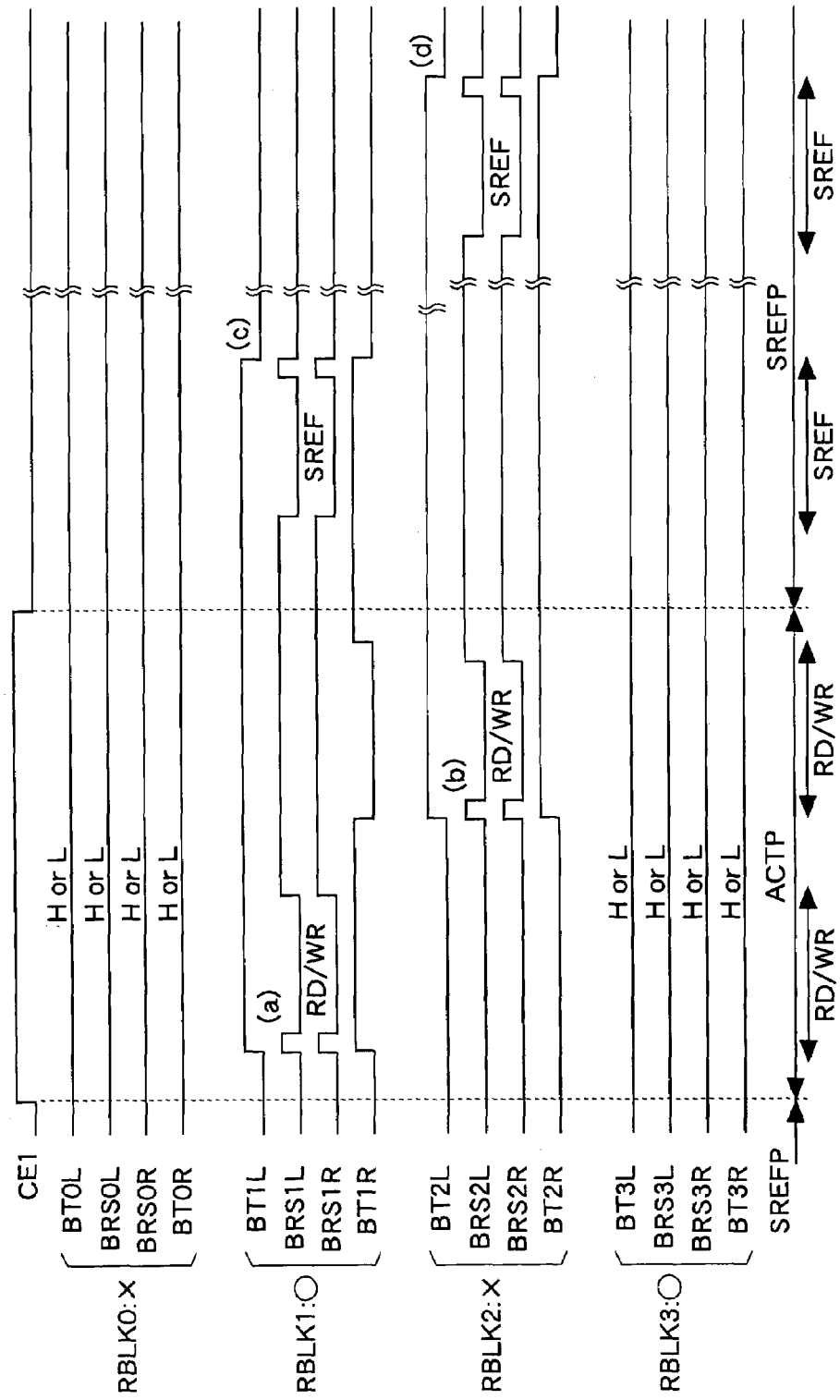
FIG. 21 is a timing chart showing operations of the eleventh embodiment.

FIG. 21 shows operations of the eleventh embodiment. The same symbols and numerals are attached to the same components as those described in the above embodiments and a detailed description thereof is omitted. Basic operations are the same as those in the fourth embodiment (FIG. 11). However, in the present embodiment, the cutoff function is released in response to the first access request RD or WR in an activation period ACTP (FIG. 21 (a, b)). Also, the cutoff function is set in synchronization with completion of the first self-refresh operation SREF in a self-refresh period SREFP (FIG. 21 (c, d)). The cutoff function is set and released for each memory block RBLK0-3.

Also in the eleventh embodiment described above, the same advantages as those of the above embodiments can be obtained. Further, in the present embodiment, wasteful operations of the switch control circuit 26G can be prevented to reduce current consumption by setting and releasing the cutoff function only for memory blocks RBLK to which an access operation RD, WR, or SREF is performed.

Figure 22:
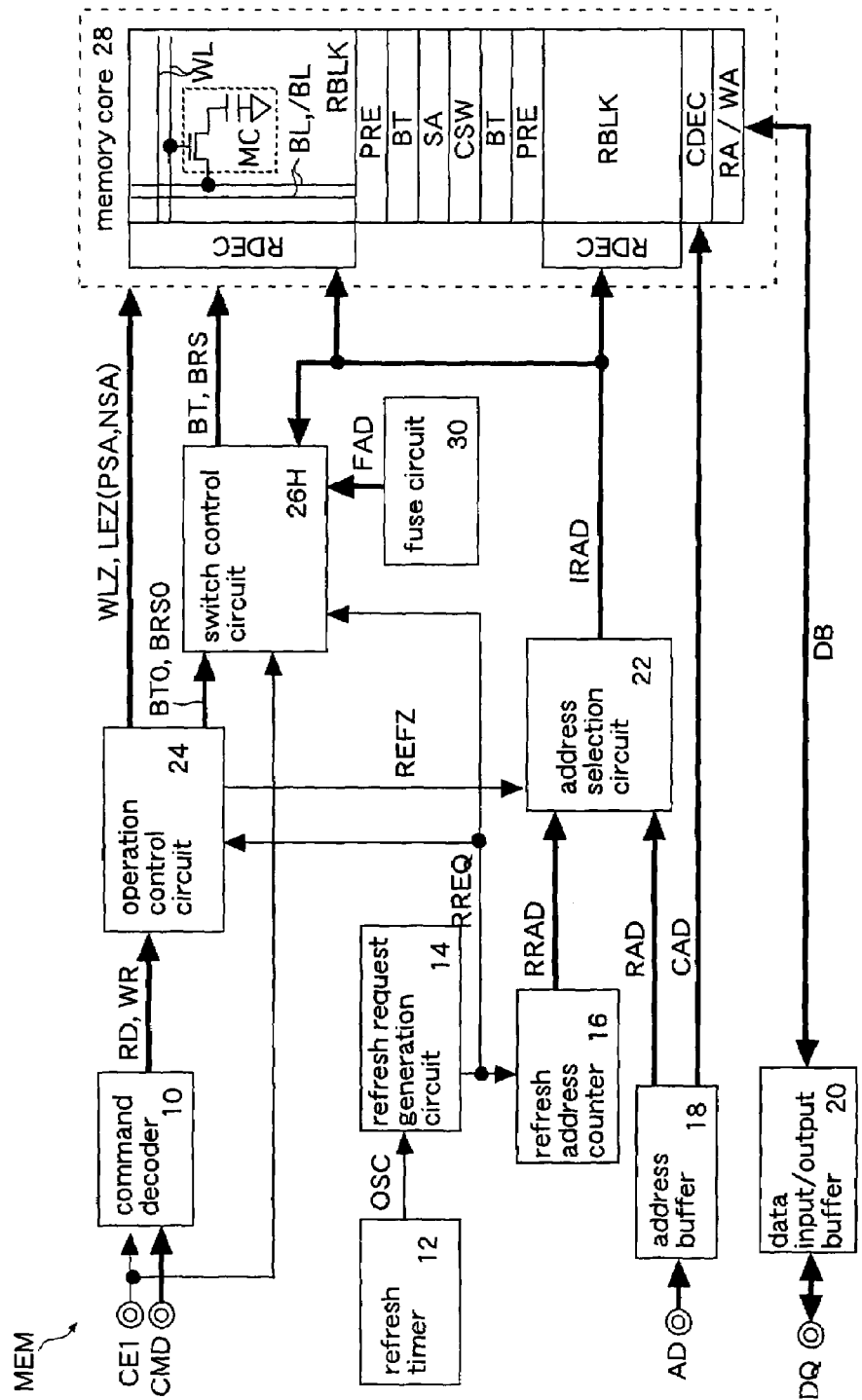
FIG. 22 is a block diagram showing a twelfth embodiment of the present invention.

FIG. 22 shows a twelfth embodiment of the present invention. The same symbols and numerals are attached to the same components as those described in the above embodiments and a detailed description thereof is omitted. In the present embodiment, a switch control circuit 26H is formed instead of the switch control circuit 26E in the sixth embodiment (FIG. 13). Other components are the same as those in the sixth embodiment.

The switch control circuit 26H releases the cutoff function of the memory block RBLK that performs a self-refresh operation SREF in response to a refresh request RREQ in a self-refresh period SREFP and sets the cutoff function of the memory block RBLK that performs a self-refresh operation SREF in response to the next refresh request RREQ.

Figure 23:
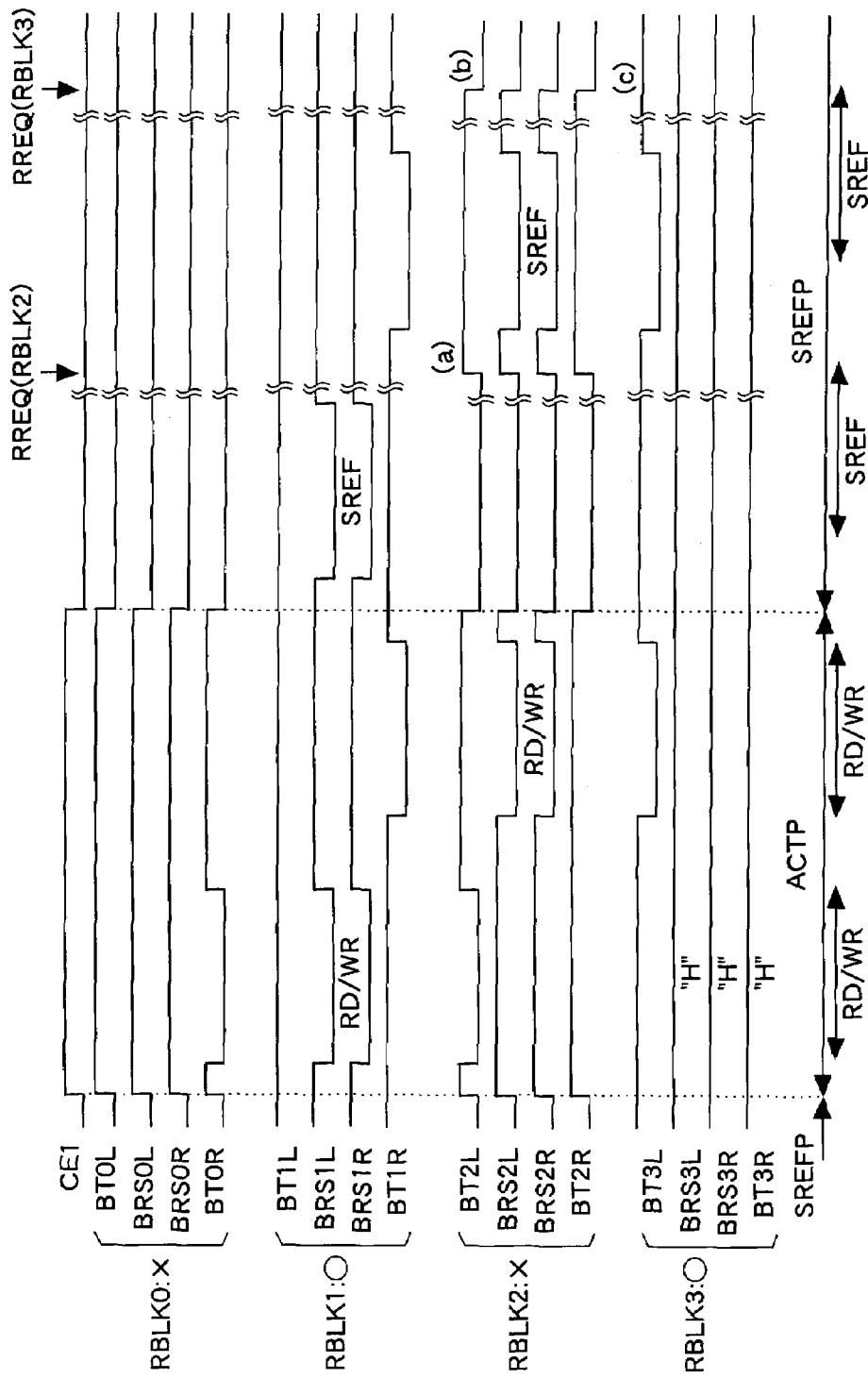
FIG. 23 is a timing chart showing operations of the twelfth embodiment.

FIG. 23 shows operations of the twelfth embodiment. The same symbols and numerals are attached to the same components as those described in the above embodiments and a detailed description thereof is omitted. Basic operations are the same as those in the eighth embodiment (FIG. 16). However, in the present embodiment, the cutoff function for the memory block RBLK2 is released in response to a refresh request RREQ corresponding to the memory block RBLK2 in a self-refresh period SREFP (FIG. 23 (a)). In response to the next refresh request RREQ (corresponding to the memory block RBLK3), the cutoff function for the memory block RBLK2 is set (FIG. 23 (b)). Since the memory block RBLK3 is a good memory block, the cutoff function is neither set nor released (FIG. 23 (c)).

Also in the twelfth embodiment described above, the same advantages as those of the above embodiments can be obtained. Further, in the present embodiment, wasteful operations of the switch control circuit 26H can be prevented to reduce current consumption by releasing the cutoff function for one memory block RBLK in response to a refresh request RREQ and setting the cutoff function for another memory block RBLK.

Figure 24:
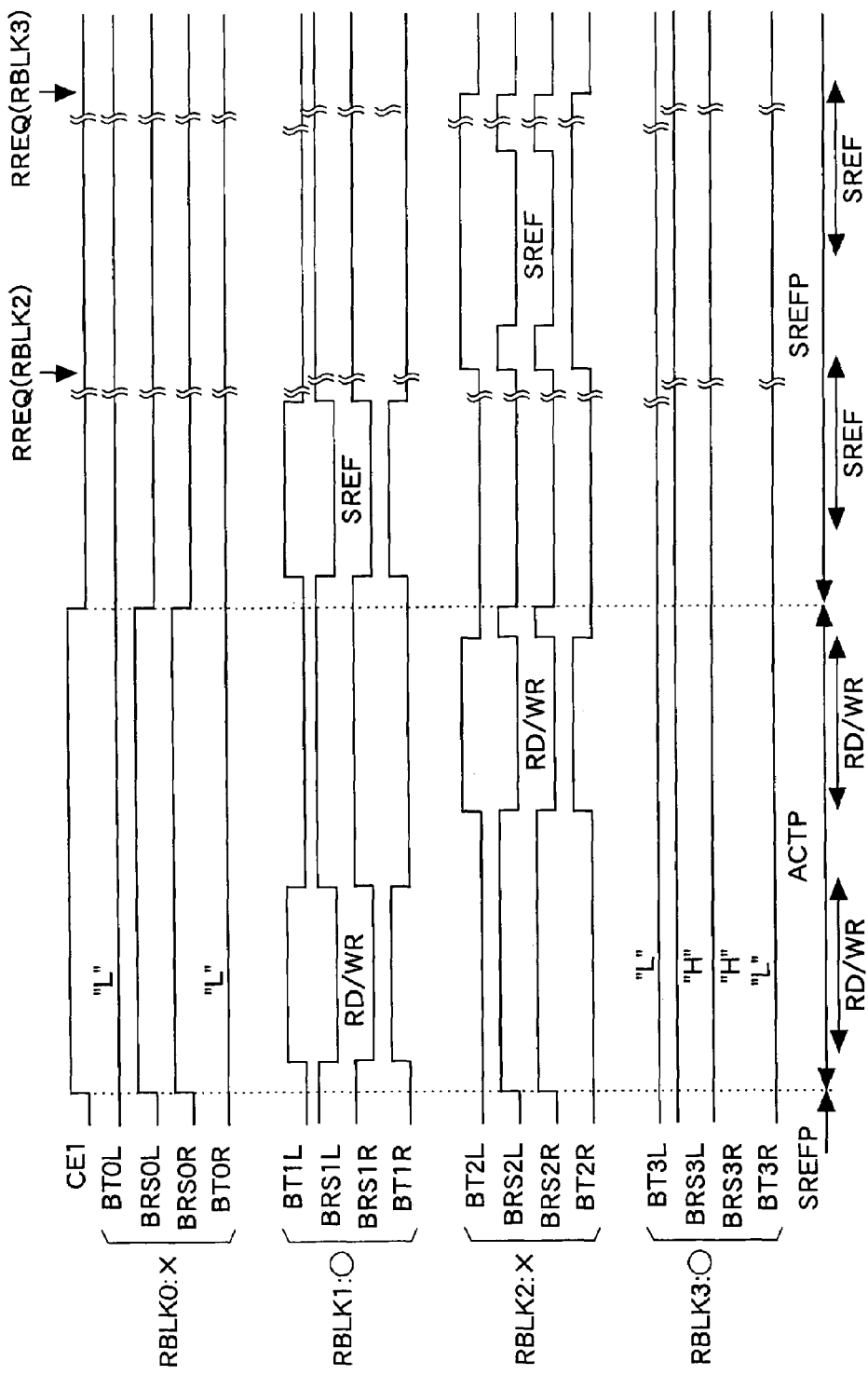
FIG. 24 is a timing chart showing operations of a thirteenth embodiment.

FIG. 24 shows operations of a thirteenth embodiment. The same symbols and numerals are attached to the same components as those described in the above embodiments and a detailed description thereof is omitted. Basic operations are the same as those in the twelfth embodiment (FIG. 23). However, in the present embodiment, the cutoff function of the connection switch BT is set in a period in which no access operation RD, WR, or SREF is performed in an activation period ACTP. Operations in the activation period ACTP are the same as those in the fifth embodiment (FIG. 12). Also in the thirteenth embodiment described above, the same advantages as those of the above embodiments can be obtained.

Figure 25:
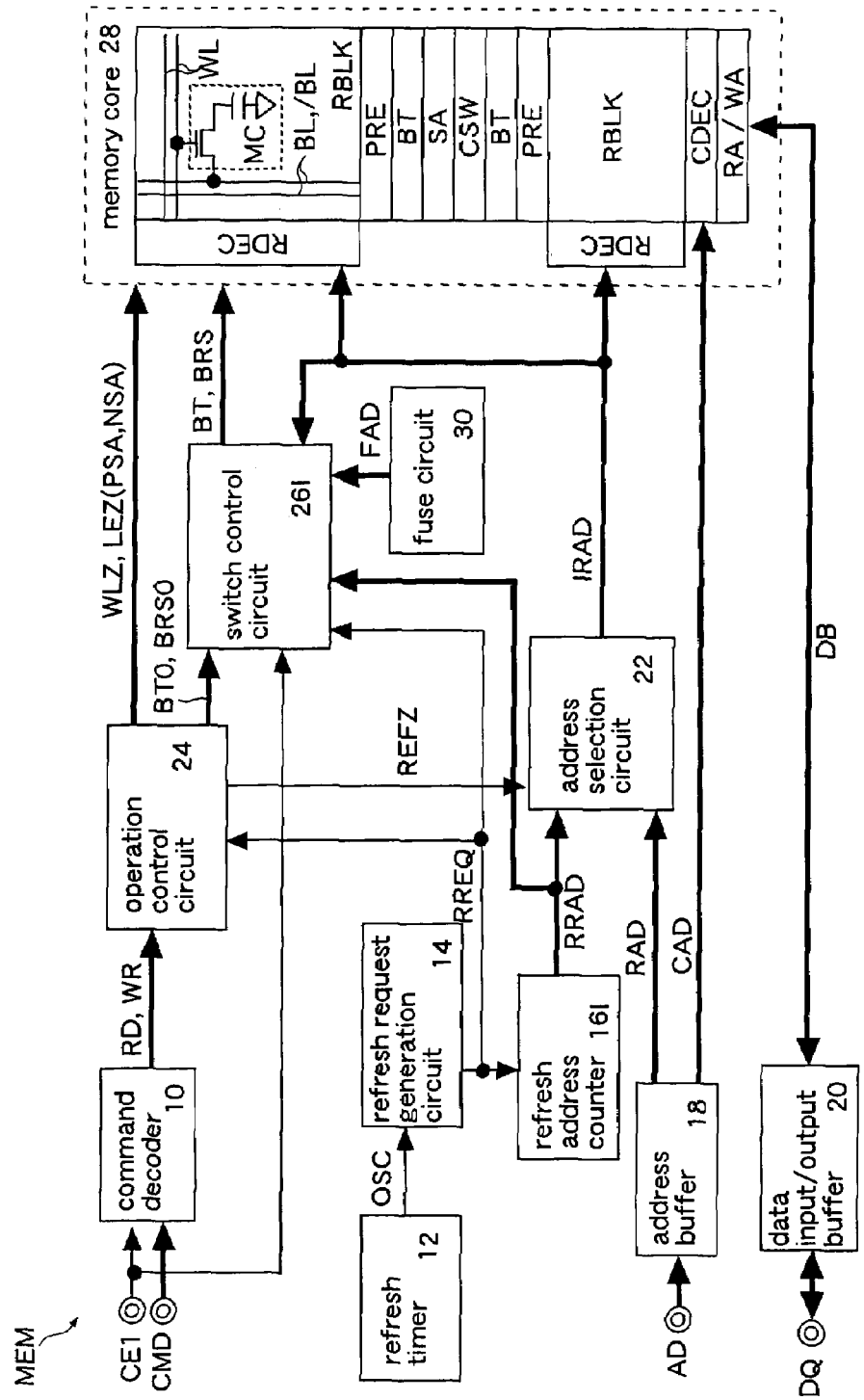
FIG. 25 is a block diagram showing a fourteenth embodiment of the present invention.

FIG. 25 shows a fourteenth embodiment of the present invention. The same symbols and numerals are attached to the same components as those described in the above embodiments and a detailed description thereof is omitted. In the present embodiment, a refresh address counter 16I and a switch control circuit 26I are formed instead of the refresh address counter 16 and the switch control circuit 26H. Other components are the same as those in the twelfth embodiment.

The refresh address counter 16I has block address bits for specifying memory blocks RBLK set to higher-order bits of the counter to intensively perform self-refresh operations SREF for each memory block RBLK.

Figure 26:
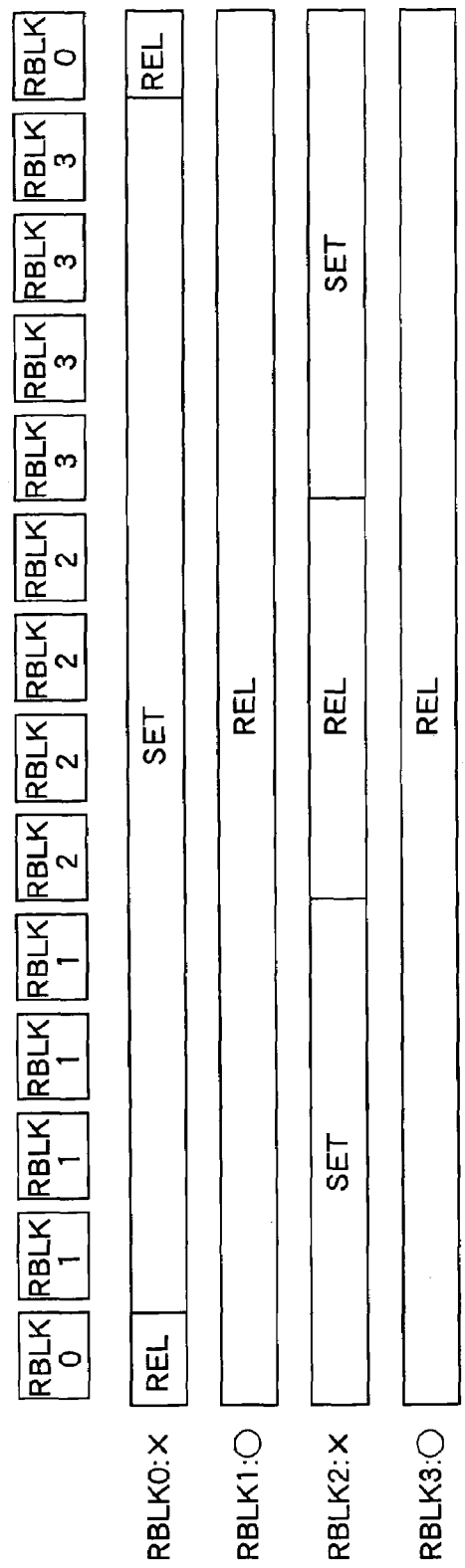
FIG. 26 is a timing chart showing operations during a refresh period in the fourteenth embodiment.

FIG. 26 shows operations in the self-refresh period SREFP in the fourteenth embodiment. The same symbols and numerals are attached to the same components as those described in the above embodiments and a detailed description thereof is omitted. Operations of the present embodiment are the same as those in the twelfth embodiment (FIG. 23) except that the setting timing and release timing of the cutoff function are different.

The switch control circuit 26I releases (REL) the cutoff function in response to the first refresh request RREQ for each bad memory block RBLK0 and 2 and sets (SET) the cutoff function after the last refresh operation is completed. The switch control circuit 26I always releases (REL) the cutoff function for the good memory blocks RBLK1 and 3. The cutoff function may be set in response to completion of all refresh operations in the corresponding memory block RBLK or in response to the first refresh request RREQ in the next memory block RBLK. Also in the fourteenth embodiment described above, the same advantages as those of the above embodiments can be obtained.

Figure 27:
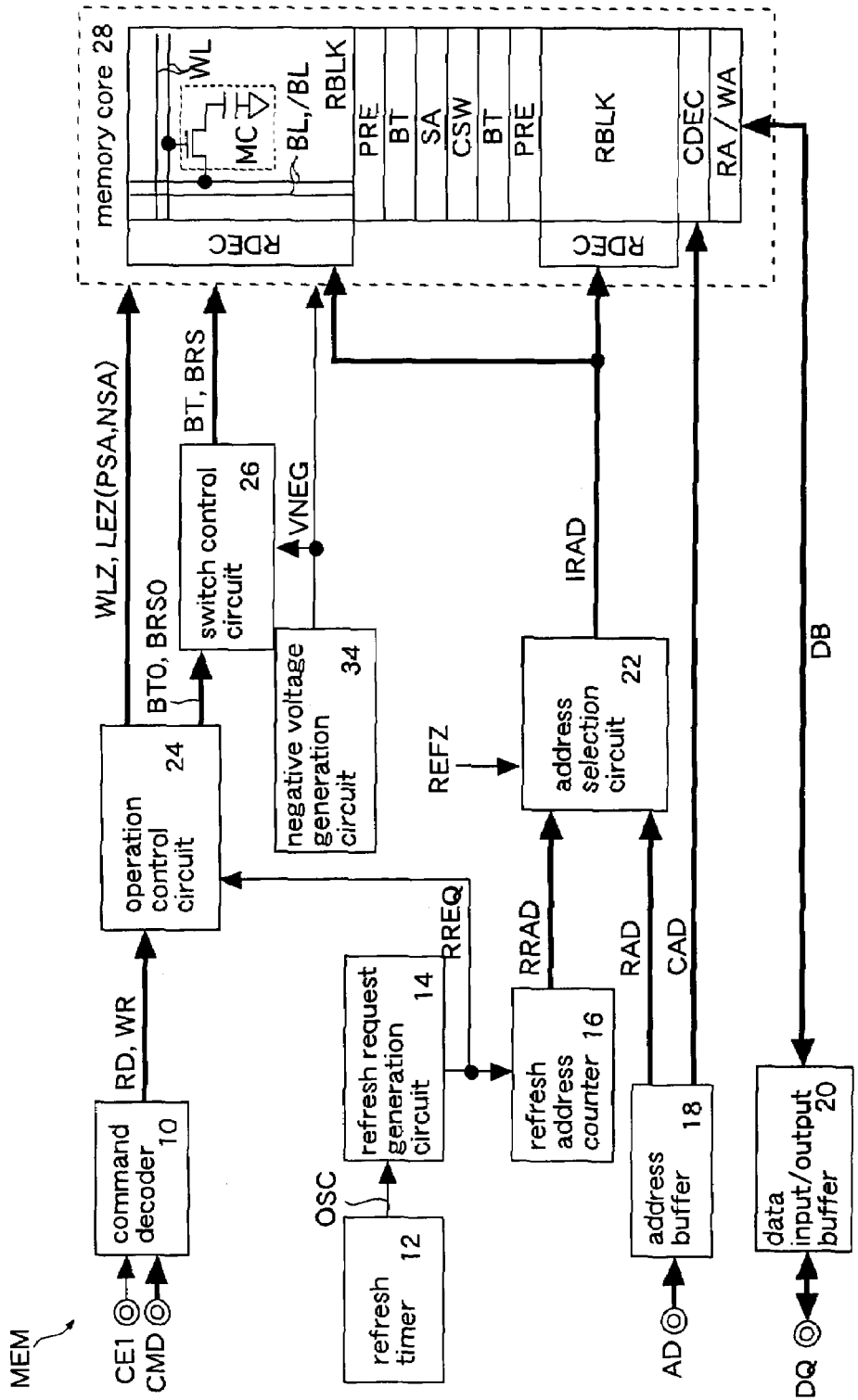
FIG. 27 is a block diagram showing a fifteenth embodiment of the present invention.

FIG. 27 shows a fifteenth embodiment of the present invention. The same symbols and numerals are attached to the same components as those described in the above embodiments and a detailed description thereof is omitted. The present embodiment is constructed by adding a negative voltage generation circuit 34 to the first embodiment (FIG. 1). Other components are the same as those in the first embodiment.

The negative voltage generation circuit 34 generates a negative voltage VNEG, which is a voltage at an inactivation level of the word line WL. When the connection switch BT shown in FIG. 3 is turned off, the switch control circuit 26 supplies the negative voltage VNEG to a gate of the connection switch BT. Also in the fifteenth embodiment described above, the same advantages as those of the above embodiments can be obtained. Further, the connection switch BT can reliably be turned off when the cutoff function is set by using the negative voltage VNEG as a gate voltage when turning off the connection switch BT. As a result, current consumption of the memory MEM, particularly a standby current can be reduced.

Figure 28:
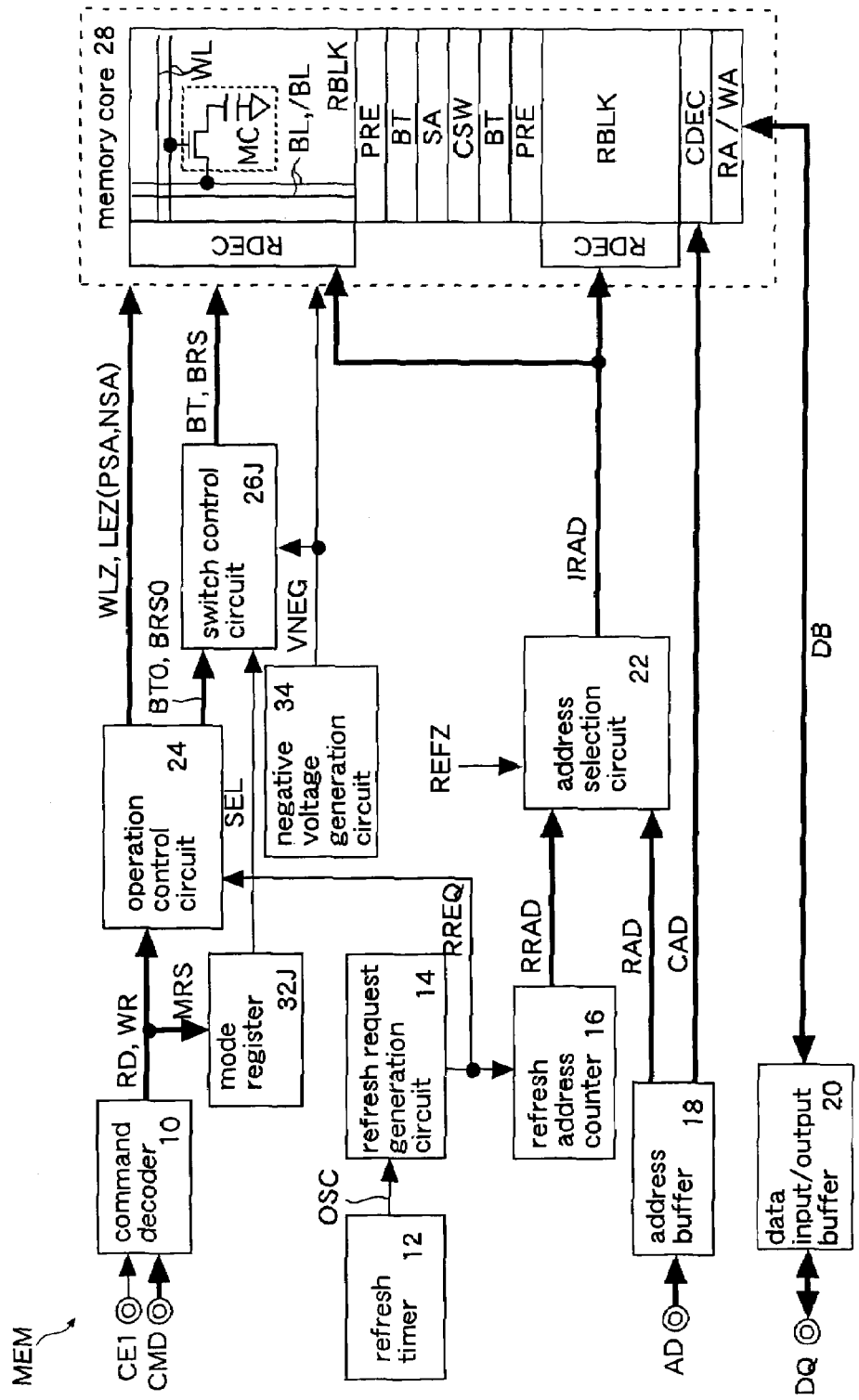
FIG. 28 is a block diagram showing a sixteenth embodiment of the present invention.

FIG. 28 is a sixteenth embodiment of the present invention. The same symbols and numerals are attached to the same components as those described in the above embodiments and a detailed description thereof is omitted. In the present embodiment, a switch control circuit 26J is formed instead of the switch control circuit 26 in the fifteenth embodiment (FIG. 27). Also, a mode register 32J is newly added. Other components are the same as those in the fifteenth embodiment. Basic specifications of the mode register 32J are the same as those in the tenth embodiment (FIG. 18).

The mode register 32J has, for example, a selection bit SEL set in accordance with a value of the address signal AD supplied together with the mode register set command MRS. The mode register 32J outputs the selection signal SEL having a logical value set to the selection bit SEL. When the selection bit SEL is at a low logical level, the switch control circuit 26J sets the voltage supplied to the gate of the connection switch BT to the ground voltage to turn off the connection switch BT. When the selection bit SEL is at a high logical level, the switch control circuit 26J sets the voltage supplied to the gate of the connection switch BT to the negative voltage VNEG to turn off the connection switch BT. Also in the sixteenth embodiment described above, the same advantages as those of the above embodiments can be obtained. Further, the voltage value supplied to the gate of the connection switch BT can be selected from a plurality of voltage values. Thus, when a leak failure is present between a word line WL and a bit line BL, causes of the failure can be analyzed in detail.

Figure 29:
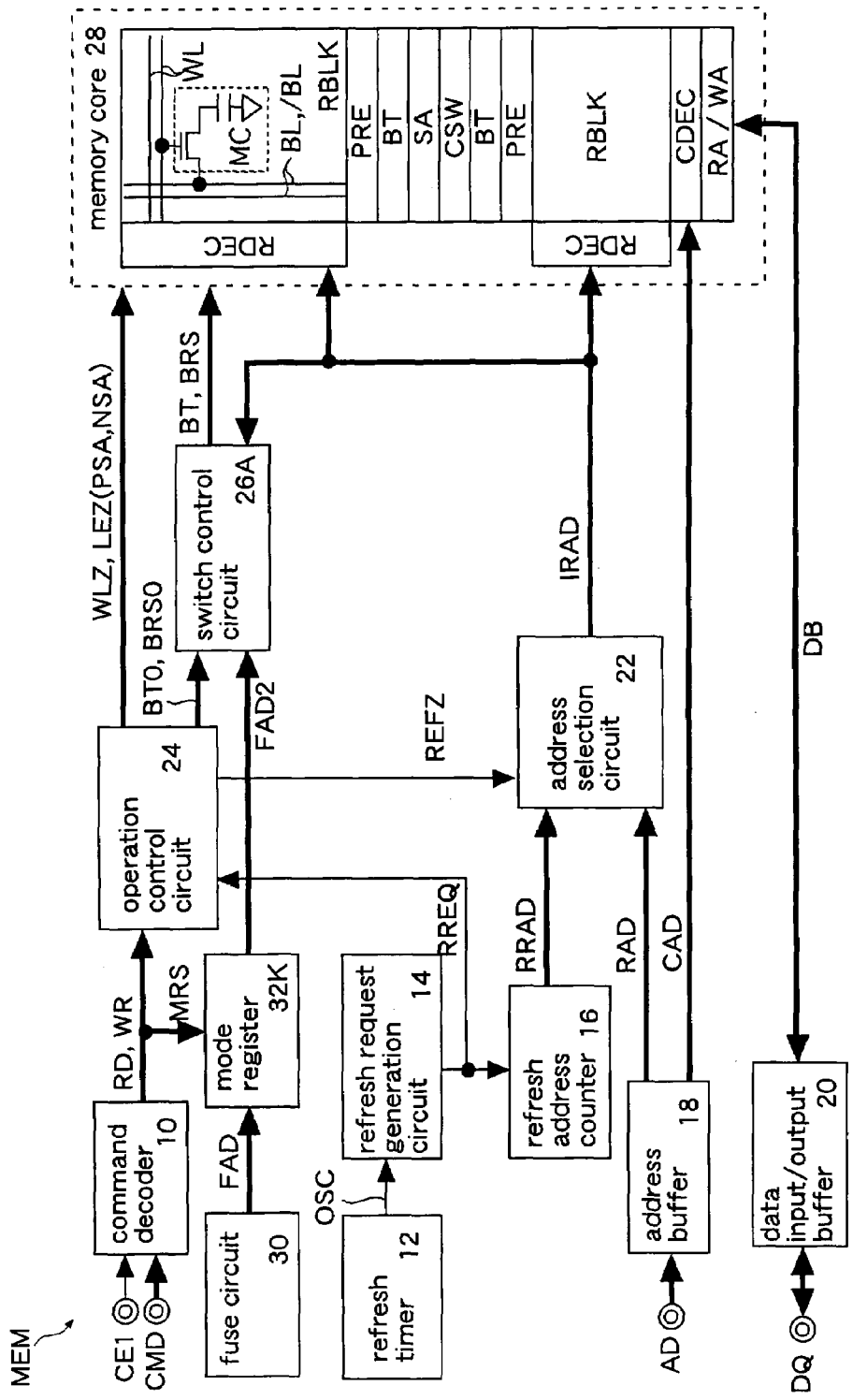
FIG. 29 is a block diagram showing a seventeenth embodiment of the present invention.

FIG. 29 is a seventeenth embodiment of the present invention. The same symbols and numerals are attached to the same components as those described in the above embodiments and a detailed description thereof is omitted. The present embodiment is constructed by newly adding a mode register 32K (register circuit) to the second embodiment (FIG. 7). Other components are the same as those in the second embodiment.

The mode register 32K has, for example, a bad address bit set in accordance with a value of the address signal AD supplied together with the mode register set command MRS. When a bad address is stored in the bad address bit, the mode register 32K outputs the set bad address as a temporary bad address FAD2. When no bad address is stored in the bad address bit, the mode register 32K outputs a bad address FAD programmed in the fuse circuit 30 as a bad address FAD2. Operations of the switch control circuit 26A are the same as those in the first embodiment.

Also in the seventeenth embodiment described above, the same advantages as those of the above embodiments can be obtained. Further, any memory block RBLK can be caused to function as a bad memory block regardless of the value programmed in the fuse circuit 30 by rewriting the mode register 32K. As a result, when a leak failure is present between a word line WL and a bit line BL, causes of the failure can be analyzed in detail. Particularly, by masking information of the fuse circuit 30 after the fuse circuit 30 being programmed, causes of the failure can be analyzed in detail.

Figure 30:
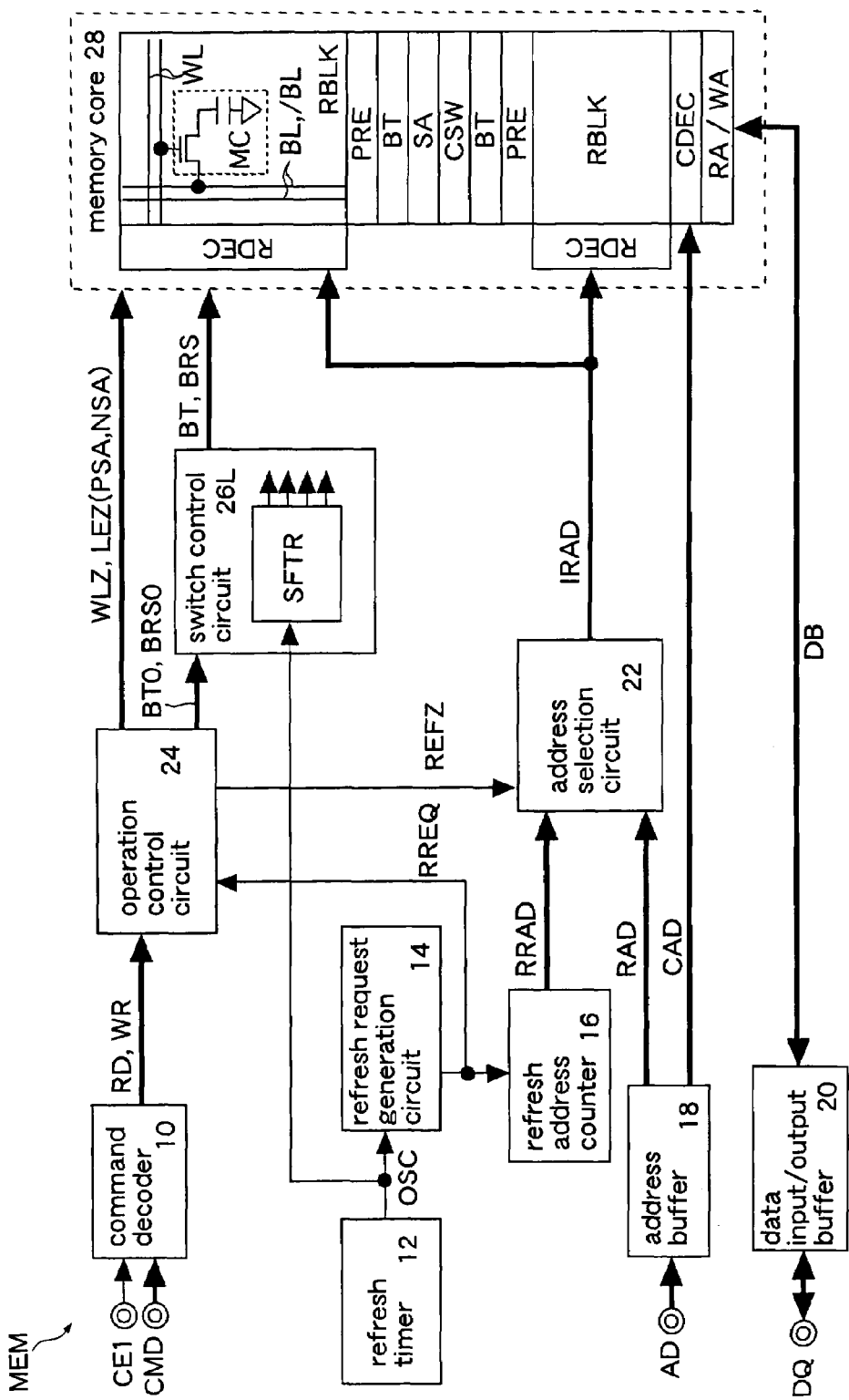
FIG. 30 is a block diagram showing an eighteenth embodiment of the present invention.

FIG. 30 shows an eighteenth embodiment of the present invention. The same symbols and numerals are attached to the same components as those described in the above embodiments and a detailed description thereof is omitted. In the present embodiment, a switch control circuit 26L is formed instead of the switch control circuit 26 in the first embodiment (FIG. 1). Other components are the same as those in the first embodiment.

The switch control circuit 26L has a shift register that performs shift operation in synchronization with an oscillating signal OSC (timing signal). The shift register SFTR has four memory stages corresponding to each memory block RBLK0-3. Each memory stage outputs a stored logical value. At power-on of the memory MEM, for example, one memory stage is set to the high logical level and remaining memory stages are set to the low logical level. Output of the last memory stage is connected to input of the first memory stage. Then, the shift register SFTR performs a shift operation, for example, in synchronization with a rising edge of the oscillating signal OSC to shift the memory stage one by one that outputs a high logical level.

The switch control circuit 26L performs a precharge operation for the memory block RBLK corresponding to the memory stage that outputs a high logical level in synchronization with a shift operation of the shift register SFTR. This enables the precharge circuit PRE to perform a precharge operation periodically even when the precharge circuit PRE is turned off except for an access operation by a setting of the cutoff function.

Incidentally, for example, the fuse circuit 30 may be formed in the memory MEM to perform a precharge operation periodically only for bad memory blocks RBLK. Or, a precharge operation may be performed for all memory blocks RBLK in synchronization with an oscillating signal OSC without forming the shift register SFTR in the switch control circuit 26L. A precharge operation may also be performed in response to a refresh request RREQ instead of the oscillating signal OSC. Also, a dedicated oscillator for performing a precharge operation may be formed in the memory MEM.

Also in the eighteenth embodiment described above, the same advantages as those of the above embodiments can be obtained. Further, by periodically performing a precharge operation, a shift of the voltage of the bit lines BL and /BL from the precharge voltage VPR can be minimized. As a result, a precharge operation temporarily performed when starting a self-refresh operation can be made shorter and a self-refresh operation time can be made equal to a read operation time and a write operation time. That is, timing control of the operation control circuit 24 can be prevented from becoming more complex.

Figure 31:
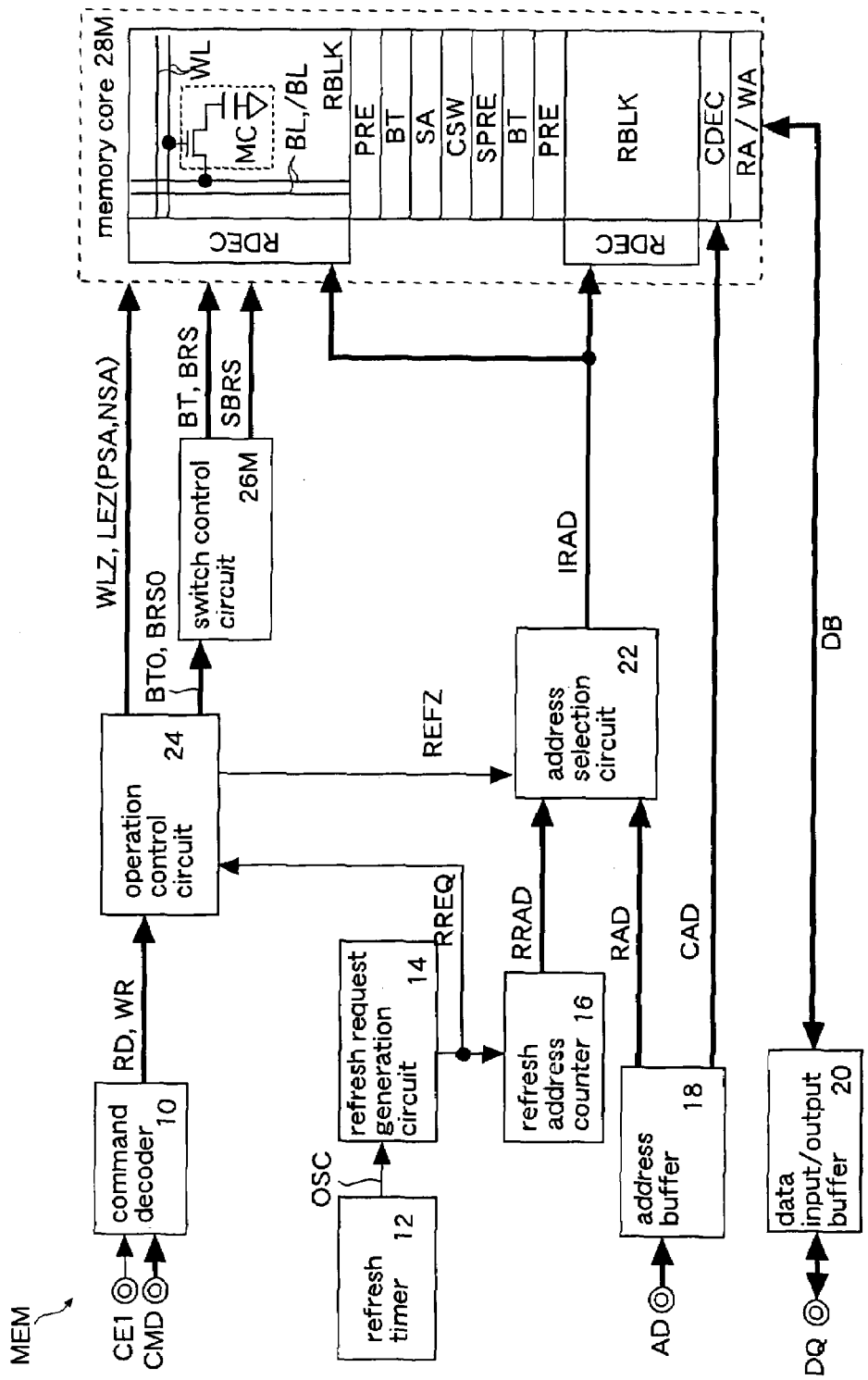
FIG. 31 is a block diagram showing a nineteenth embodiment of the present invention.

FIG. 31 shows a nineteenth embodiment of the present invention. The same symbols and numerals are attached to the same components as those described in the above embodiments and a detailed description thereof is omitted. In the present embodiment, a switch control circuit 26M and a memory core 28M are formed instead of the switch control circuit 26 and the memory core 28 in the first embodiment (FIG. 1). Other components are the same as those in the first embodiment.

The memory core 28M is constructed by adding a sub precharge circuit SPRE (sub precharge switch) to the memory core 28 in the first embodiment. The switch control circuit 26M is the same as the switch control circuit 26 in the first embodiment except that the switch control circuit 26M outputs a sub precharge control signal SBRS for operating the sub precharge circuit SPRE.

Figure 32:
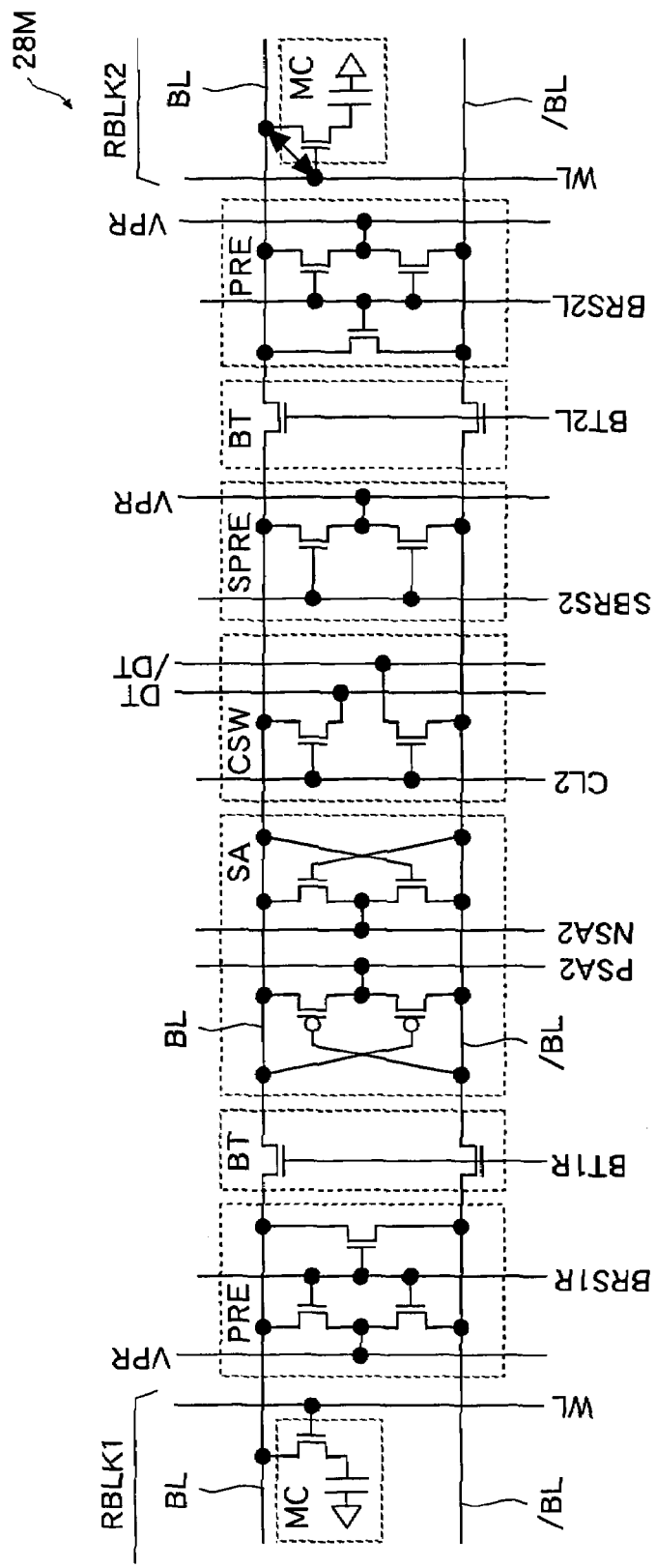
FIG. 32 is a circuit diagram showing details of a main portion of a memory core shown in FIG. 31.

FIG. 32 shows details of a main portion of the memory core 28M shown in FIG. 31. The configuration excluding the sub precharge circuit SPRE is the same as that in the first embodiment (FIG. 3). The sub precharge circuit SPRE is arranged at the position sandwiched by two connection switches BT together with the sense amplifier SA and column switch CSW. The sub precharge circuit SPRE has a pair of nMOS transistors for connecting each of complementary bit lines BL and /BL to the precharge voltage line VPR. A gate of the nMOS transistor receives the sub precharge control signal SBRS (BRS2). The sub precharge circuit SPRE supplies the precharge voltage VPR to the bit lines BL and /BL while receiving the sub precharge control signal SBRS at the high logical level.

Figure 33:
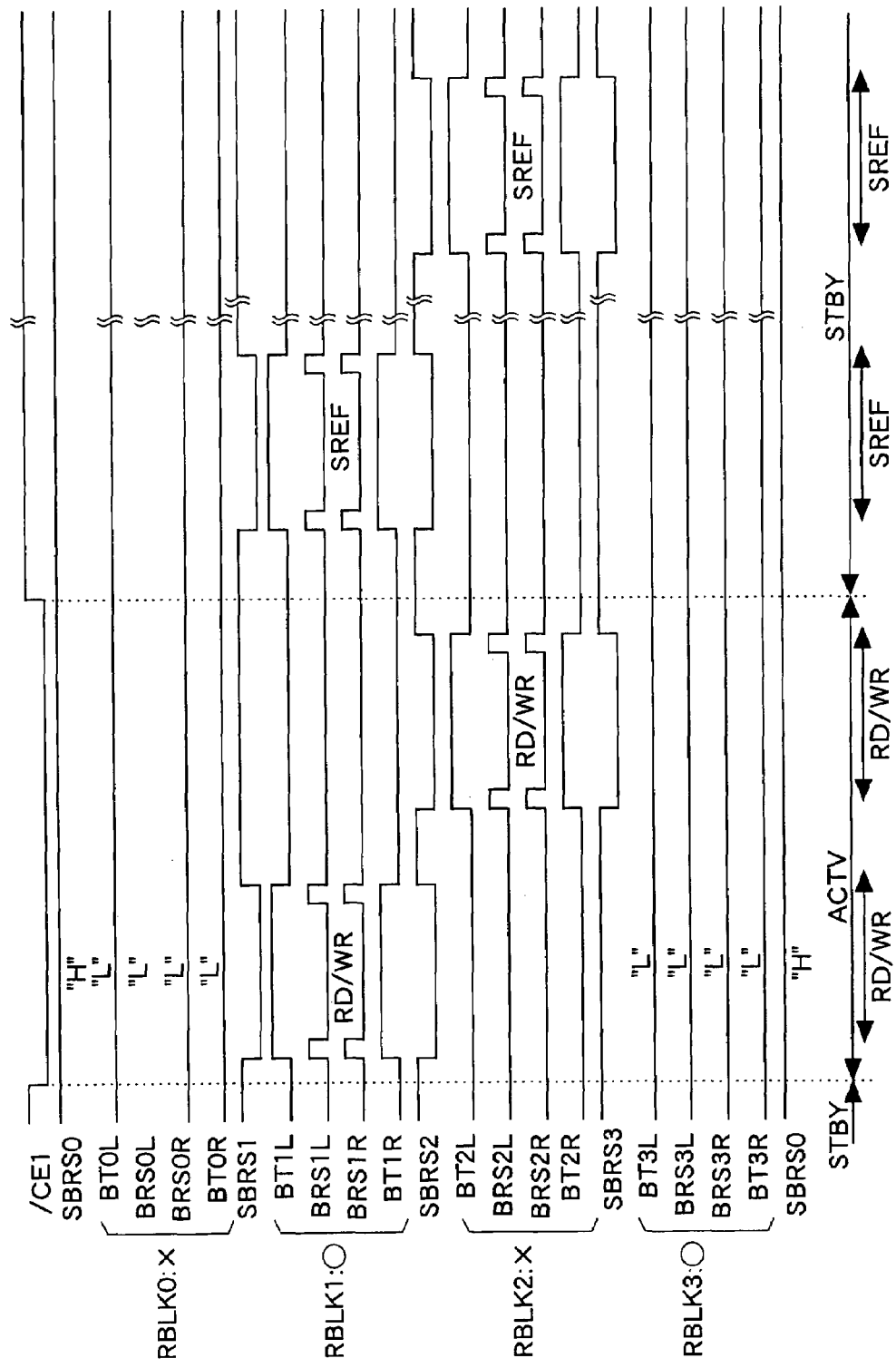
FIG. 33 is a timing chart showing operations of the nineteenth embodiment.

FIG. 33 shows operations of the nineteenth embodiment. The same symbols and numerals are attached to the same components as those described in the above embodiments and a detailed description thereof is omitted. Basic operations are the same as those in the first embodiment (FIG. 5). However, the sub precharge control signal SBRS is held at the high logical level except when the corresponding sense amplifier SA is operating. Thus, the sub precharge circuit SPRE is turned on except for a period when the corresponding sense amplifier SA is operating, thereby supplying the precharge voltage VPR to the bit lines BL and /BL sandwiched by the connection switches BT. Incidentally, waveforms of the sub precharge control signal SBRS have reverse logic of those of the switch control signal BT.

Also in the nineteenth embodiment described above, the same advantages as those of the above embodiments can be obtained. Further, by means of the sub precharge circuit SPRE, the bit lines BL and /BL connected to the sense amplifier SA and column switch CSW can be prevented from becoming floating state even when the cutoff function is set. As a result, a precharge operation temporarily performed when starting an access operation RD, WR, or SREF can be made shorter. Particularly, this is effective for a self-refresh period SREFP in which an access operation SREF is infrequently performed. Accordingly, a self-refresh operation time can be set equal to a read operation time and a write operation time. That is, timing control of the operation control circuit 24 can be prevented from becoming more complex.

Figure 34:
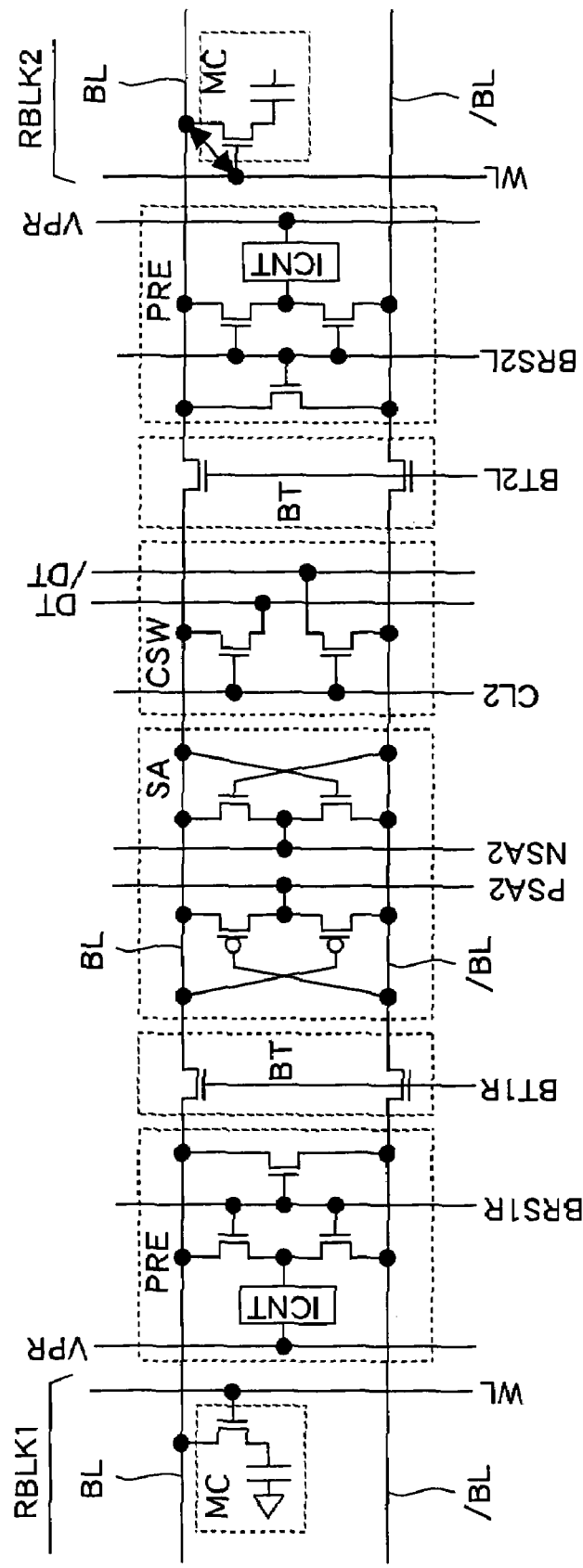
FIG. 34 is a circuit diagram showing details of the main portion of a memory core in a twentieth embodiment of the present invention.

FIG. 34 shows details of the main portion of a memory core in a twentieth embodiment of the present invention. The same symbols and numerals are attached to the same components as those described in the above embodiments and a detailed description thereof is omitted. The present embodiment is different from the first embodiment (FIG. 3) in a precharge circuit PRE. Other components are the same as those in the first embodiment.

In the precharge circuit PRE, a current suppression element ICNT for suppressing a current is arranged between the n MOS transistors for supplying the precharge voltage VPR to the bit lines BL and /BL and the precharge voltage line VPR. The current suppression element ICNT is, for example, a high-resistance element or a transistor. A transistor whose ratio W/L of a gate width W and a channel length L is small is used. The transistor is, for example, a depression type. When an enhancement type is used, a threshold voltage is set lower.

Also in the twentieth embodiment described above, the same advantages as those of the above embodiments can be obtained. Further, by inserting the current suppression element ICNT between the precharge voltage line VPR and bit lines BL and /BL, a leak amount when a leak failure is present between a word line WL and the bit line BL, and the bit line BL (or /BL) is connected to the precharge voltage line VPR can be reduced.

Figure 35:
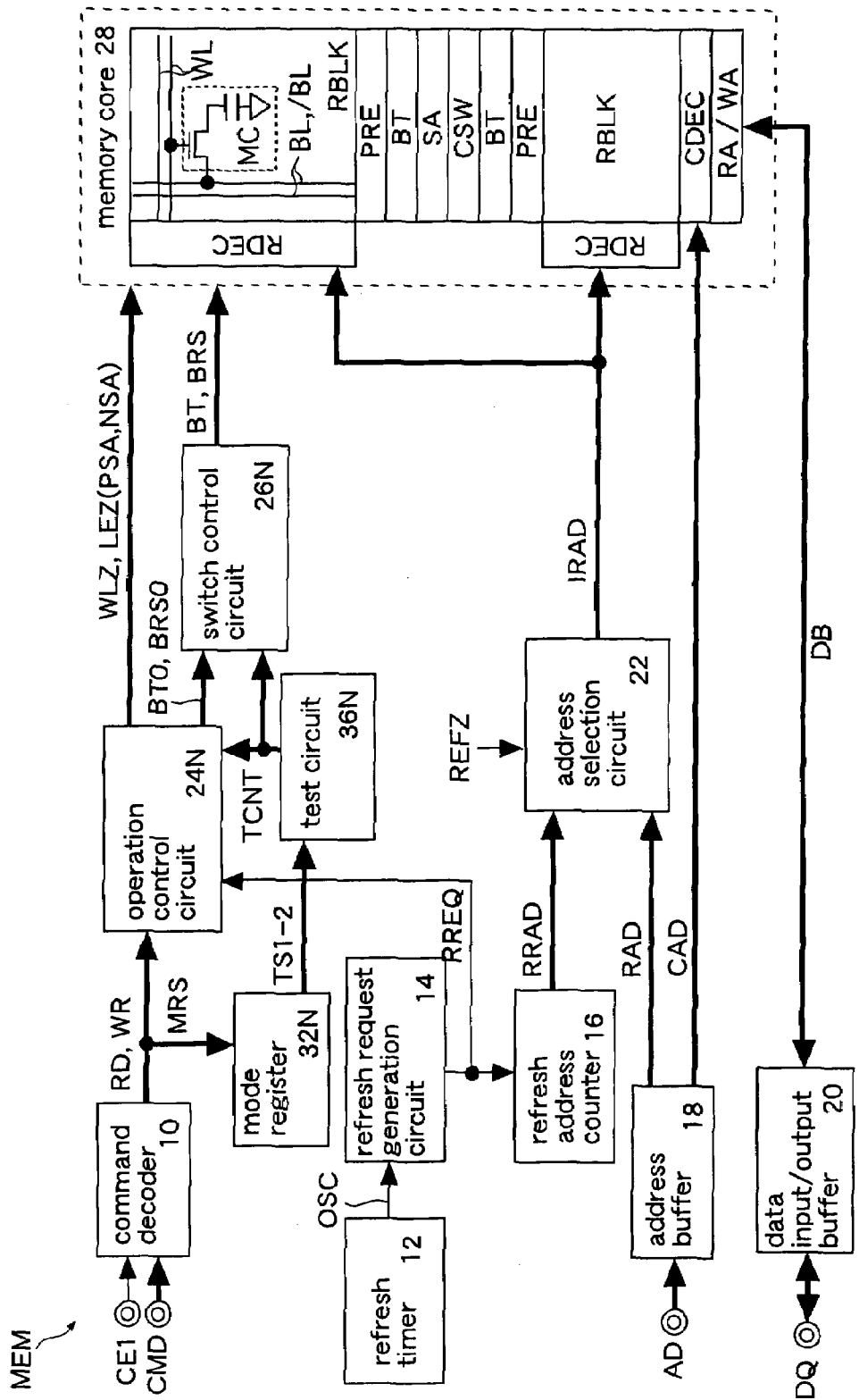
FIG. 35 is a block diagram showing a twenty-first embodiment of the present invention.

FIG. 35 shows a twenty-first embodiment. The same symbols and numerals are attached to the same components as those described in the above embodiments and a detailed description thereof is omitted. In the present embodiment, an operation control circuit 24N and a switch control circuit 26N are formed instead of the operation control circuit 24 and the switch control circuit 26 in the first embodiment (FIG. 1). Also, a mode register 32N and a test circuit 36N are added. Other components are the same as those in the first embodiment. Basic specifications of the mode register 32N are the same as those in the tenth embodiment (FIG. 18).

The mode register 32N has, for example, test bits TS1-2 set in accordance with a value of the address signal AD supplied together with the mode register set command MRS (test request). The mode register 32N outputs a logical value set to the test bits TS1-2 as a test signal TS1-2. The test bit TS1 is set when a first test is performed and the test bit TS2 is set when a second test is performed. The mode register set command MR is supplied, for example, by an LSI tester testing memory MEM.

The test circuit 36N outputs a test control signal TCNT in accordance with the test signal TS1-2 to the operation control circuit 24N and the switch control circuit 26N. The operation control circuit 24N operates in response to access requests RD, WR, and RREQ and also in response to the test control signal TCNT. The switch control circuit 26N sets the cutoff function in a period in which no access operation is performed and, when a test control signal TCNT is received, sets/releases the cutoff function in accordance with the test control signal TCNT.

Figure 36:
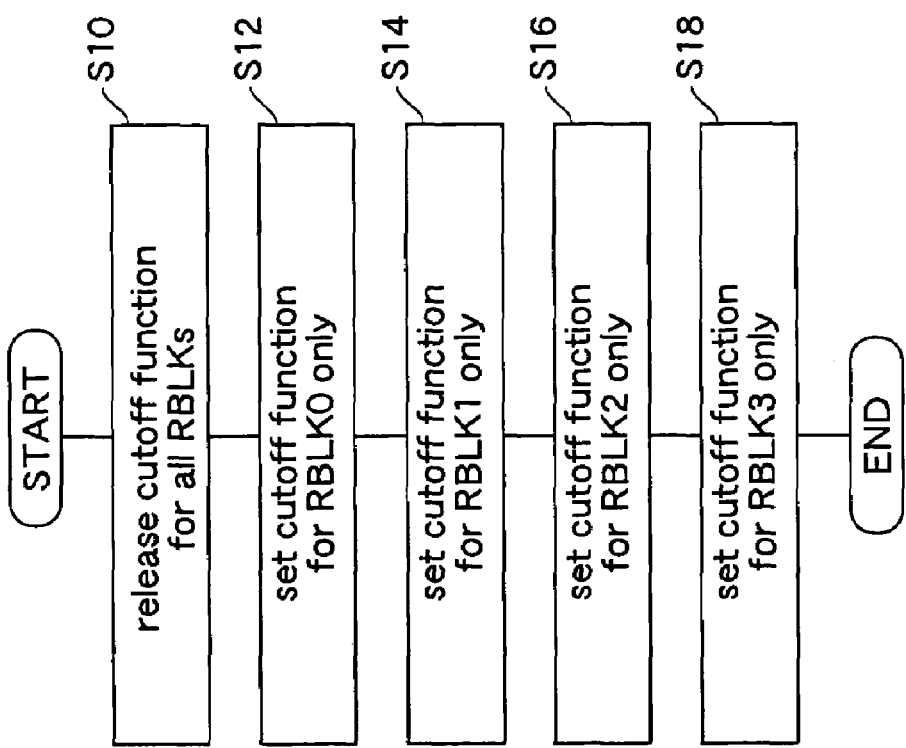
FIG. 36 is a flow diagram showing operations of an operation control circuit and a switch control circuit shown in FIG. 35.

FIG. 36 shows an operation flow of the switch control circuit 26N shown in FIG. 35.

In this example, only the test bit TS1 in the mode register 32N is set and the first test is performed. In accordance with the test signal TS1 (test request), the test circuit 36N outputs a test control signal TCNT for performing the first test to the operation control circuit 24N and the switch control circuit 26N.

First in step S10, the switch control circuit 26N releases the cutoff function for all memory blocks RBLK. In this state, an LSI tester testing the memory MEM measures a standby current (power supply current). If a leak failure is present between a word line WL and a bit line BL, the standby current is large. The operation control circuit 24N masks refresh requests RREQ while performing the first test. Incidentally, a self-refresh operation SREF may be performed in response to a refresh request RREQ.

Next, in steps S12, S14, S16, and S18, the switch control circuit 26N sets the cutoff function in the memory blocks RBLK0-3 respectively. That is, the connection switch BT is turned off in each memory block RBLK. In each step S12 to S18, the LSI tester measures the standby current. If a memory block RBKL has a leak failure present between a word line WL and a bit line BL, the standby current becomes small if the cutoff function is set for the memory block RBKL.

Subsequently, differences between the standby current measured in step S10 and standby currents measured in steps S12 to S18 are determined using, for example, the LSI tester. If the current difference is larger than a predetermined value (decision value), the memory block RBLK is determined to have a failure between a word line WL and a bit line BL. In that case, detailed tests are performed or a relieving process for the failure is performed.

Figure 37:
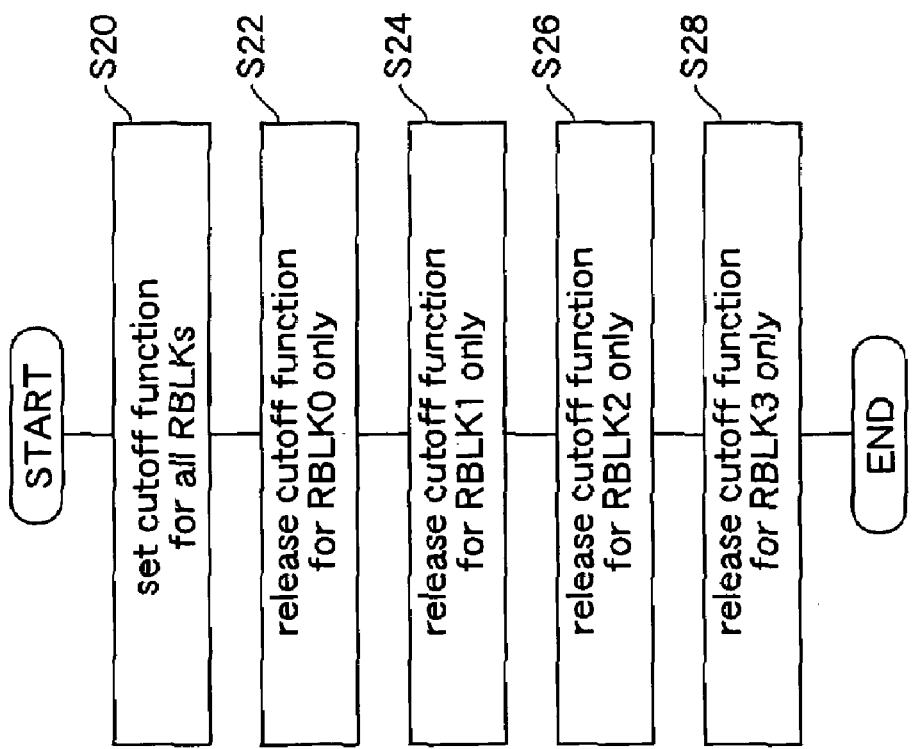
FIG. 37 is a flow diagram showing other operations of the operation control circuit and the switch control circuit shown in FIG. 35.

FIG. 37 shows another operation flow of the operation control circuit 24N and the switch control circuit 26N shown in FIG. 35. In this example, only the test bit TS2 in the mode register 32N is set and the second test is performed. In accordance with the test signal TS2 (test request), the test circuit 36N outputs a test control signal TCNT for performing the second test to the operation control circuit 24N and the switch control circuit 26N.

First, in step S20, the switch control circuit 26N sets the cutoff function for all memory blocks RBLK. In this state, an LSI tester testing the memory MEM measures a standby current (power supply current). Since all connection switches BT are turned off, the standby current is not large even when a leak failure is present between a word line WL and a bit line BL. The operation control circuit 24N masks refresh requests RREQ while performing the second test. Incidentally, a self-refresh operation SREF may be performed in response to a refresh request RREQ.

Next, in steps S22, S24, S26, and S28, the switch control circuit 26N releases the cutoff function in the memory blocks RBLK0-3 respectively. That is, the connection switch BT is turned on in each memory block RBLK0-3. In each step S22 to S28, the LSI tester measures the standby current. If a memory block RBKL has a leak failure present between a word line WL and a bit line BL, the standby current becomes large if the cutoff function is released for the memory block RBKL.

Subsequently, differences between the standby current measured in step S20 and standby currents measured in steps S22 to S28 are determined using, for example, the LSI tester. If the current difference is larger than a predetermined value (decision value), the memory block RBLK is determined to have a failure between a word line WL and a bit line BL. In that case, detailed tests are performed or a relieving process for the failure is performed.

Also in the twenty-first embodiment described above, the same advantages as those of the above embodiments can be obtained. Further, by means of the test circuit 36N, memory blocks RBLK having a leak failure between a word line WL and a bit line BL can easily be detected.

Figure 38:
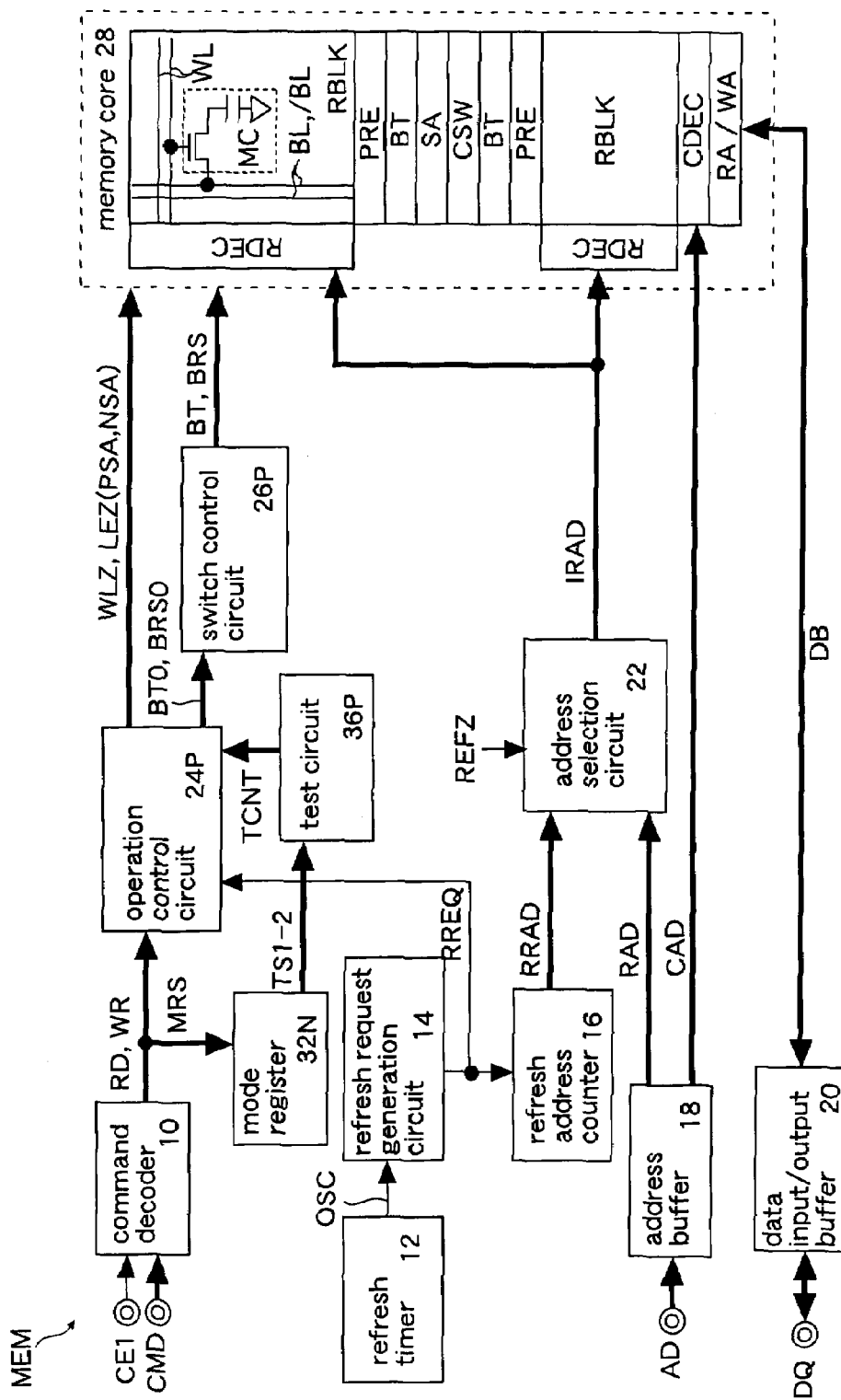
FIG. 38 is a block diagram showing a twenty-second embodiment of the present invention.

FIG. 38 shows a twenty-second embodiment. The same symbols and numerals are attached to the same components as those described in the above embodiments and a detailed description thereof is omitted. In the present embodiment, a test circuit 36P, an operation control circuit 24P, and a switch control circuit 26P are formed instead of the test circuit 36N, the operation control circuit 24N, and the switch control circuit 26N in the twenty-first embodiment (FIG. 35). Other components are the same as those in the twenty-first embodiment.

When a test signal TS1-2 is received, the test circuit 36P outputs a test control signal TCNT for performing a third test or a fourth test. The operation control circuit 24P operates in response to an access request RD, WR, or RREQ and also in response to the test control signal TCNT. When a test control signal TCNT for performing the third test is received, the operation control circuit 24P changes from the normal operation mode to the test mode and sets a time period between the time when the precharge switch PRE is turned off in response to an access request RD, WR, or RREQ and the time when a word line WL is activated to be longer than a time in normal operation mode in which no test is performed. That is, while performing the third test, a time period between the time when the precharge control signal BRS0 changes to the low logical level and the time when the word line activation signal WLZ changes to the high logical level is set to be longer than a time in normal operation mode.

When a test control signal TCNT for performing the fourth test is received, the operation control circuit 24P changes from the normal operation mode to the test mode and sets a time period between the time when the word line WL is activated in response to an access request RD, WR, or RREQ and the time when the sense amplifier SA is activated to be longer. That is, while performing the fourth test, a time period between the time when the word line activation signal WLZ changes to the high logical level and the time when the sense amplifier activation signal LEZ changes to the high logical level is set to be longer than a time in normal operation mode. When a test control signal TCNT for performing the third or fourth test is received, the switch control circuit 26P, for example, releases the cutoff function. Incidentally, the cutoff function may not be released.

Figure 39:
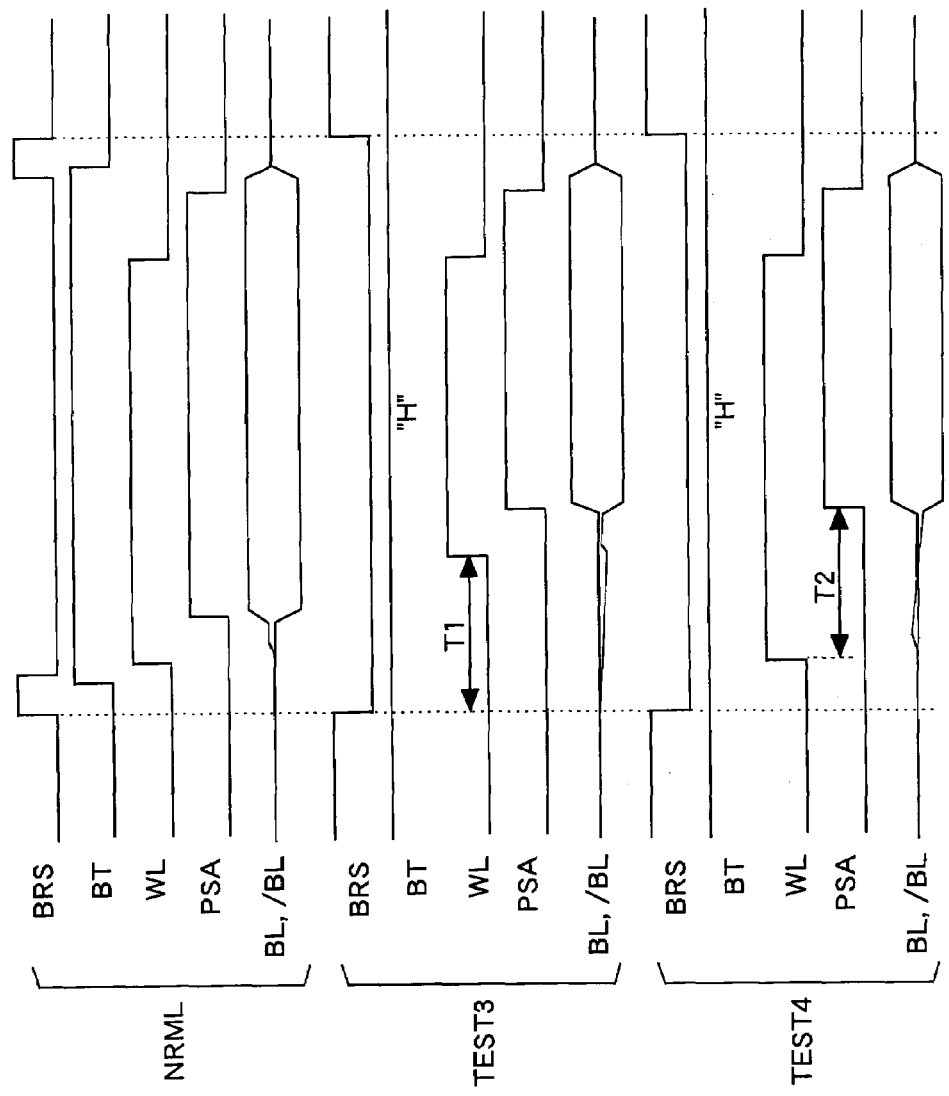
FIG. 39 is a timing chart showing an outline of operations of the twenty-second embodiment.

FIG. 39 shows an outline of operations of the twenty-second embodiment. Waveforms in normal operation mode NRML are the same as those in the first embodiment (FIG. 6). In a third test TEST3, a time T1 between the time when the precharge control signal BRS changes to the low logical level and the time when a word line WL is activated is longer than a time in normal operation mode NRML. Thus, if a leak failure is present between the word line WL and a bit line BL, for example, the voltage of the bit line BL drops from the precharge voltage VPR to a reset voltage (for example, the ground voltage) of the word line WL after the precharge control signal BRS changes to the low logical level. Therefore, when the word line WL is activated and data is read from memory cells MC to the bit line BL, the voltage of the bit line BL is below that of the bit line /BL (=VPR). As a result, a correct data signal is not amplified in a read operation RD and a leak failure between the word line WL and bit line BL can be detected.

In the same manner, in a fourth test TEST4, a time T2 between the time when a word line WL is activated and the time when the sense amplifier activation signal LEZ changes to the high logical level is longer than a time in normal operation mode NRML. Thus, if a leak failure is present between the word line WL and a bit line BL, for example, the voltage of data read from memory cells MC to the bit line BL after activation of the word line WL drops to the reset voltage (for example, the ground voltage) of the word line WL. Therefore, when the sense amplifier activation signal LEZ is activated and the sense amplifier SA starts an amplification operation, the voltage of the bit line BL is below that of the bit line /BL (=VPR). As a result, a correct data signal is not amplified in a read operation RD and a leak failure between the word line WL and bit line BL can be detected.

If the cutoff function is not released, the precharge control signal BRS and the switch control signal BT have the same waveforms as those in normal operation mode NRML in the third and fourth tests TEST3-4.

Figure 40:
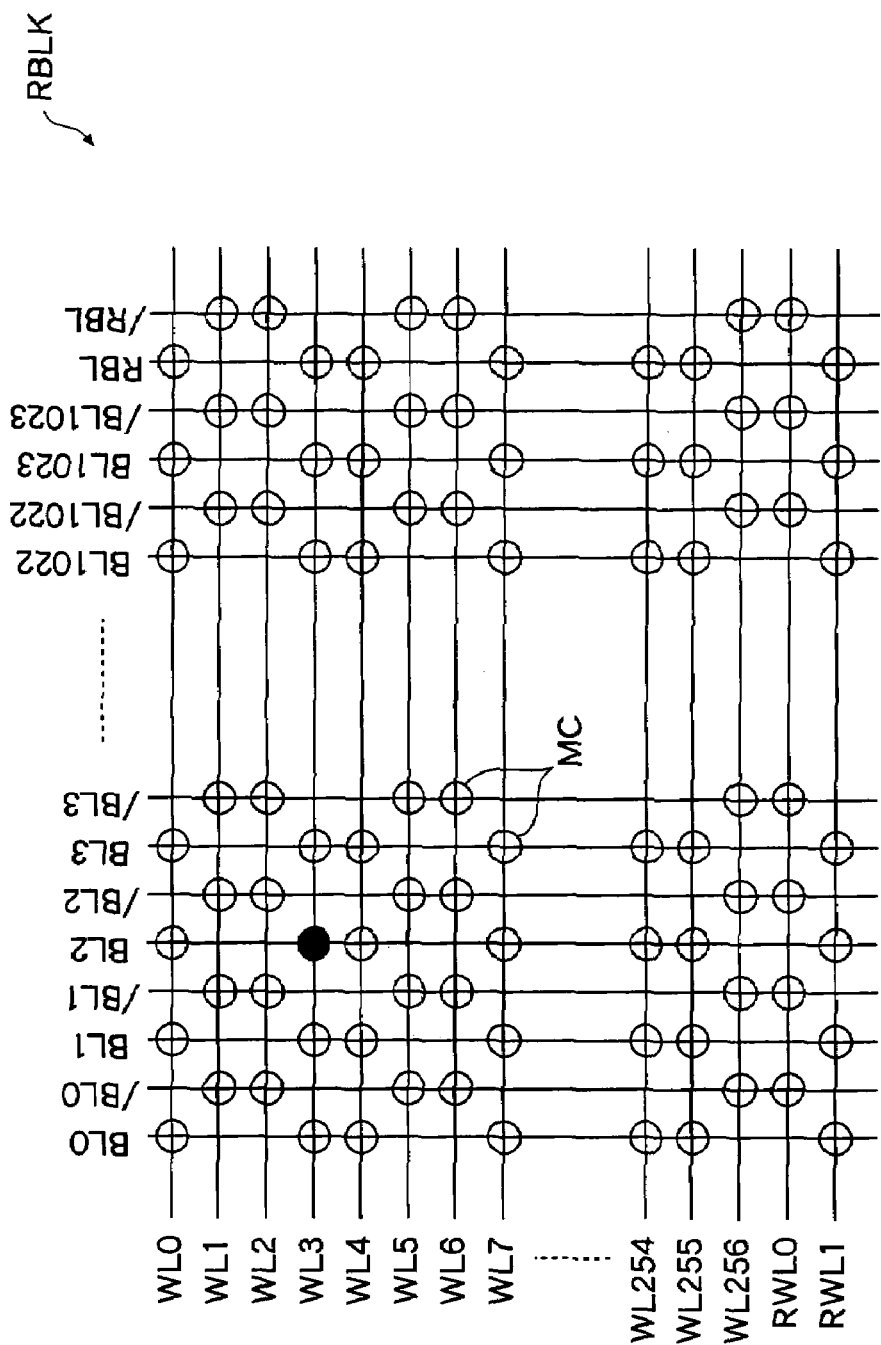
FIG. 40 is a block diagram showing details of a memory block of a memory core.

FIG. 40 shows details of a memory block RBLK of the memory core 28. Each memory block RBLK has, for example, 256 word lines WL0-255, two redundant word lines RWL0-1, 1024 pairs of bit line pairs BL and /BL, and a pair of redundant bit lines RBL and /RBL. A circle at an intersection of a word line WL and a bit line BL or /BL denotes a memory cell MC. Before performing the third test TEST3 and the fourth test TEST4, logic 1 data is written into all memory cells MC.

If, for example, a leak failure is present in the word line WL3 and the bit line BL2 connected to a memory cell MC denoted as a black circle in the diagram, a failure is detected when the word lines WL0, WL3, WL4, WL7 and so on are activated to access memory cells MC connected to the bit line BL2. In contrast, when memory cells MC connected to the bit line /BL2 are accessed, no failure is detected because the bit line BL2 functions as a reference bit line and changes to the low logical level during amplification operation.

If a leak failure is present between a word line WL and a bit line BL, a relief (column relief) by the redundant bit line pair RBL and /RBL must be afforded instead of a relief (row relief) by the redundancy word lines RWL0-1. This is because a read failure (rewrite failure) occurs in all memory cells MC connected to the bit line BL2 having a leak failure. To force a column relief, only more word line failures than the number of redundancy word lines RWL0-1 need to be caused. More specifically, word lines WL (WL0, WL3, WL4 and so on) connected to the bit line BL2 via memory cells MC need to be accessed three times or more. If word lines WL are sequentially accessed, the column relief can forcibly be afforded by sequentially accessing twice or more "number of redundancy word line RWL+2" of word lines WL.

Also in the twenty-second embodiment described above, the same advantages as those of the above embodiments can be obtained. Further, a column relief can forcibly be afforded when a leak failure is present between a word line WL and a bit line BL. This improves relief efficiency and also yields of memory MEM.

Figure 41:
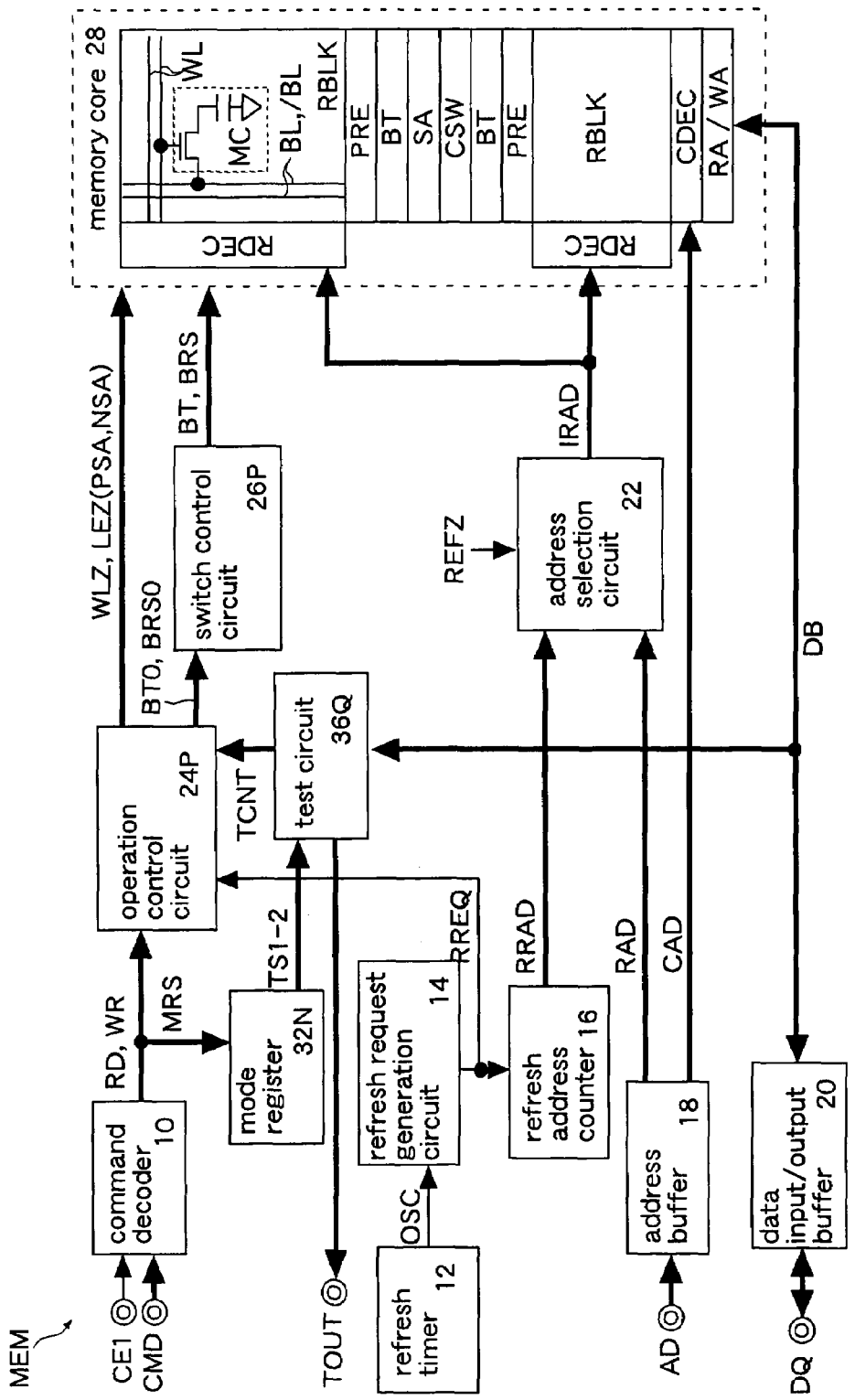
FIG. 41 is a block diagram showing a twenty-third embodiment of the present invention.

FIG. 41 shows a twenty-third embodiment. The same symbols and numerals are attached to the same components as those described in the above embodiments and a detailed description thereof is omitted. In the present embodiment, a test circuit 36Q is formed instead of the test circuit 36P in the twenty-second embodiment (FIG. 38). Also, a test output terminal TOUT is newly formed. Other components are the same as those in the twenty-second embodiment.

The test circuit 36Q has a function to perform the third test TEST3 and the fourth test TEST4 by outputting a test access request to the operation control circuit 24P to access a plurality of word lines WL. The test circuit 36Q also has a function to detect an occurrence of failure by receiving read data via the data bus DB when performing the third test TEST3 or the fourth test TEST4 described in the twenty-second embodiment. Further, the test circuit 36Q has a function to output a failure detection signal TOUT to the test output terminal TOUT when a leak failure is detected between a word line WL and a bit line BL. That is, the test circuit 36Q functions as a BIST (Built-In Self-Test) circuit.

Figure 42:
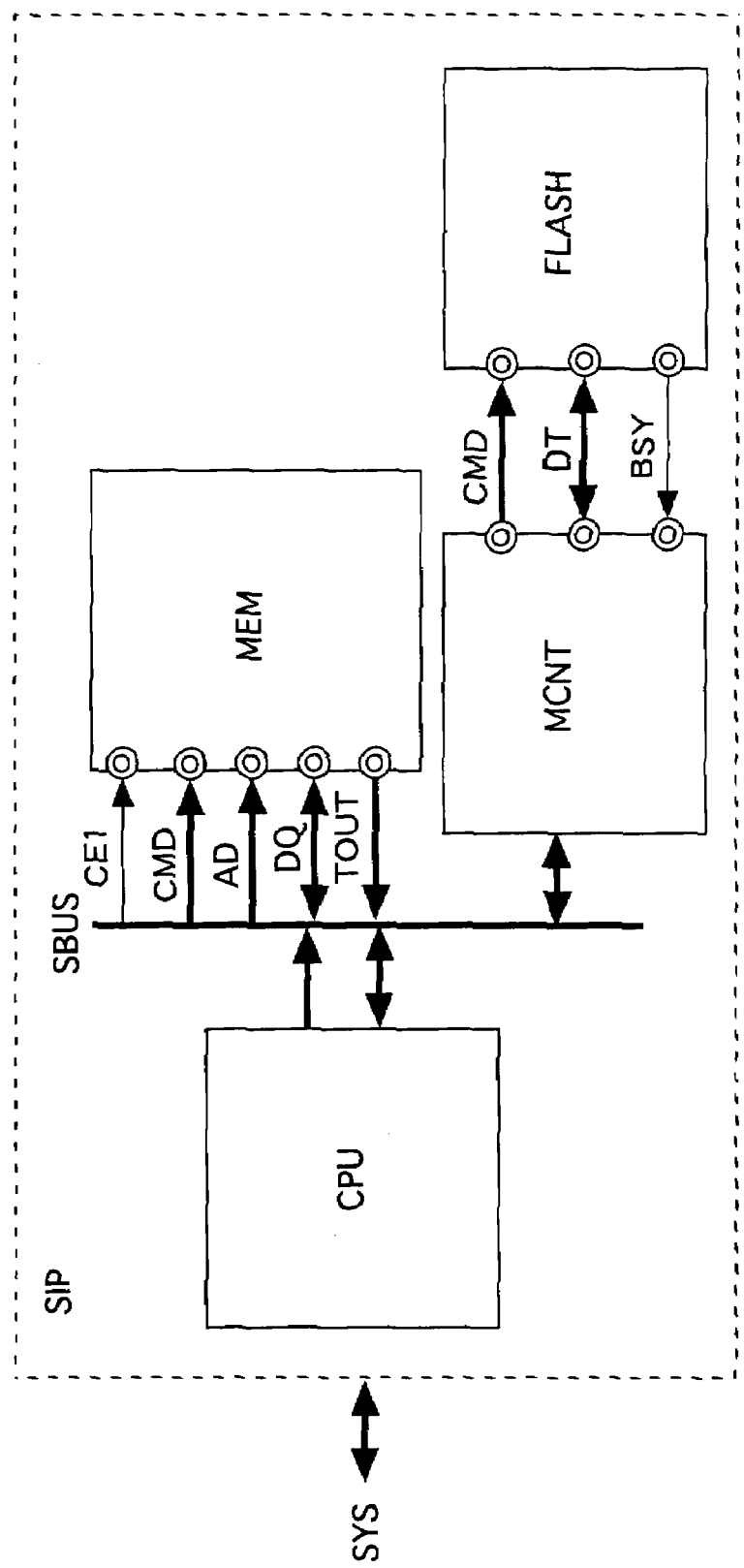
FIG. 42 is a block diagram showing a memory system in the twenty-third embodiment.

FIG. 42 shows a memory system in the twenty-third embodiment. A detailed description of the same components as those shown in FIG. 4 is omitted. A CPU mounted in the memory system in the present embodiment has a function to output an access request and a test request to the memory MEM and to receive a failure detection signal TOUT (test result) from the memory MEM. The test request is recognized by the memory MEM, for example, by rewriting the test bits TS1-2 of the mode register 32N through the mode register set command MRS. When the memory MEM recognizes the test request, the memory MEM performs a self test by the test circuit 36Q.

Also in the twenty-third embodiment described above, the same advantages as those of the above embodiments can be obtained. Further, by means of the test circuit 36Q having the BIST function, the third test TEST3 and the fourth test TEST4 are automatically performed and test results are output to the CPU (controller) in the memory system via the test output terminal TOUT so that memory blocks RBLK having a leak failure between a word line WL and a bit line BL can be detected without using a high-priced device such as an LSI tester. As a result, test costs can be reduced.

Figure 43:
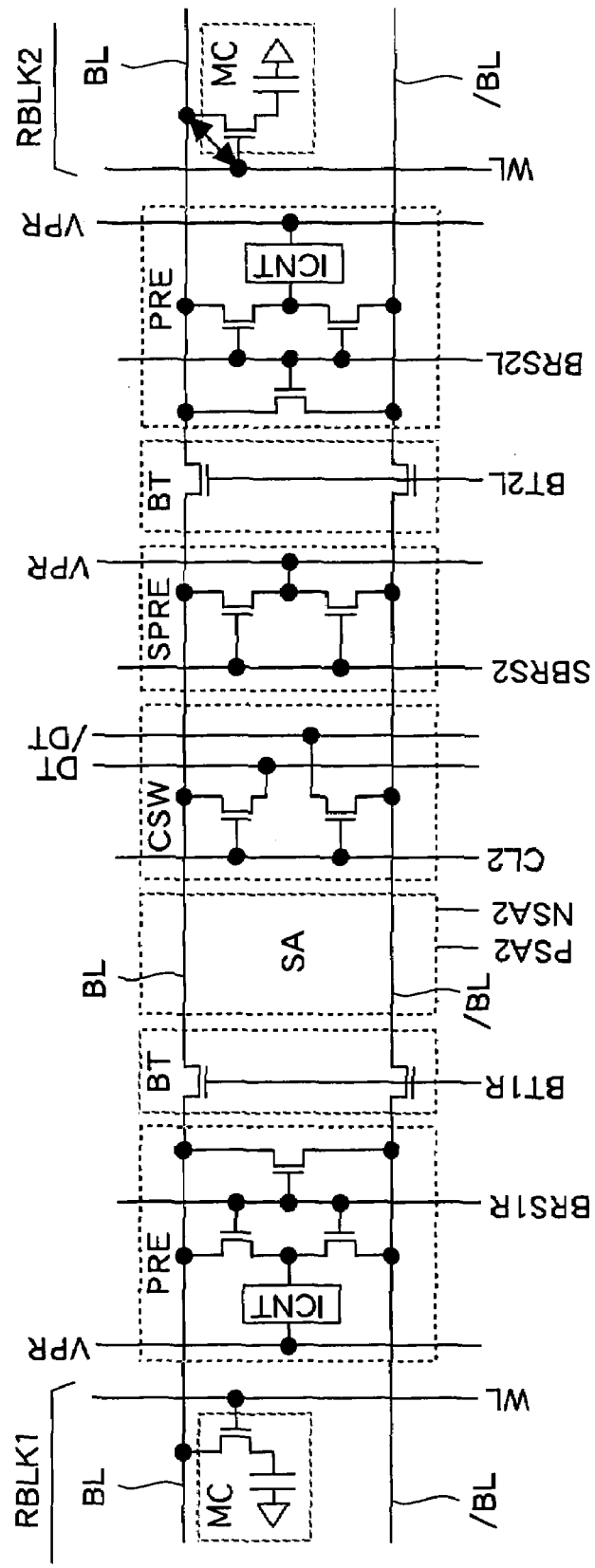
FIG. 43 is a circuit diagram showing another example of the memory core.
Figure 44:
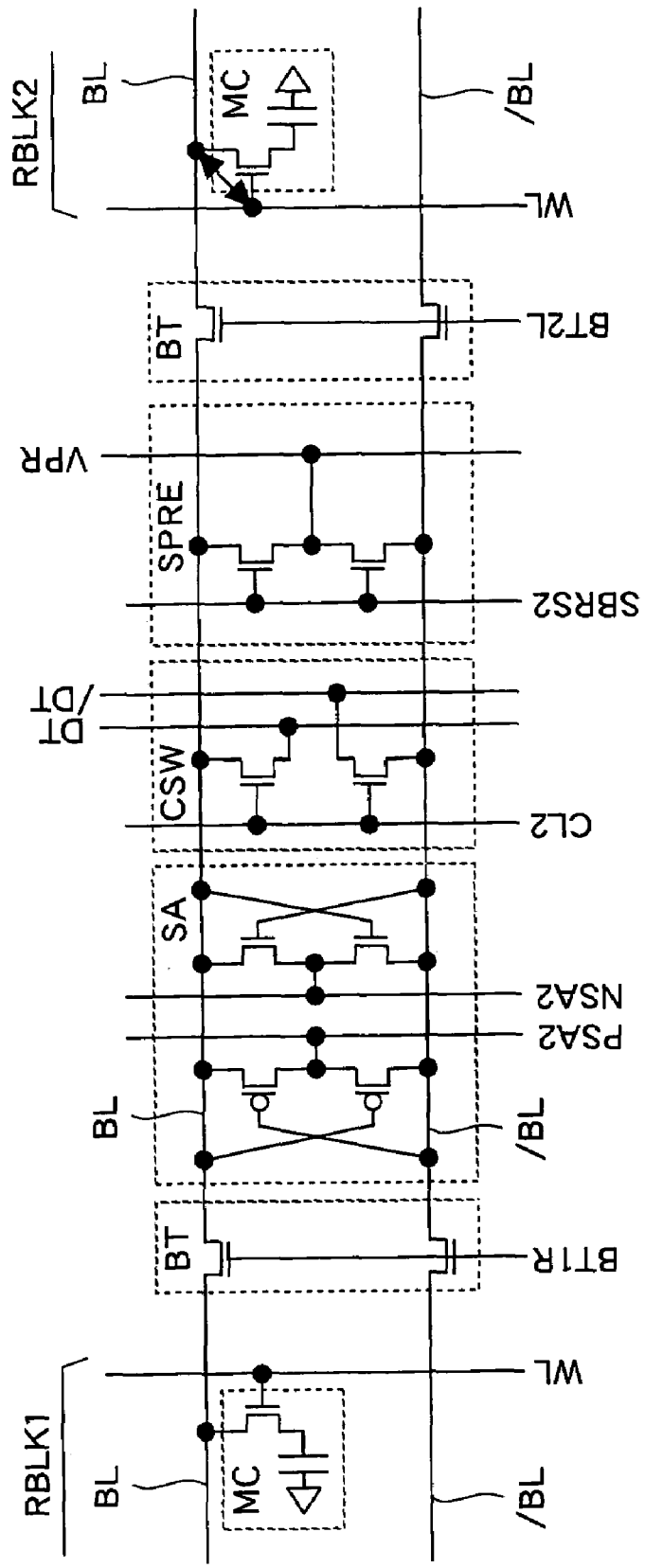
FIG. 44 is a circuit diagram showing another example of the memory core.
Figure 45:
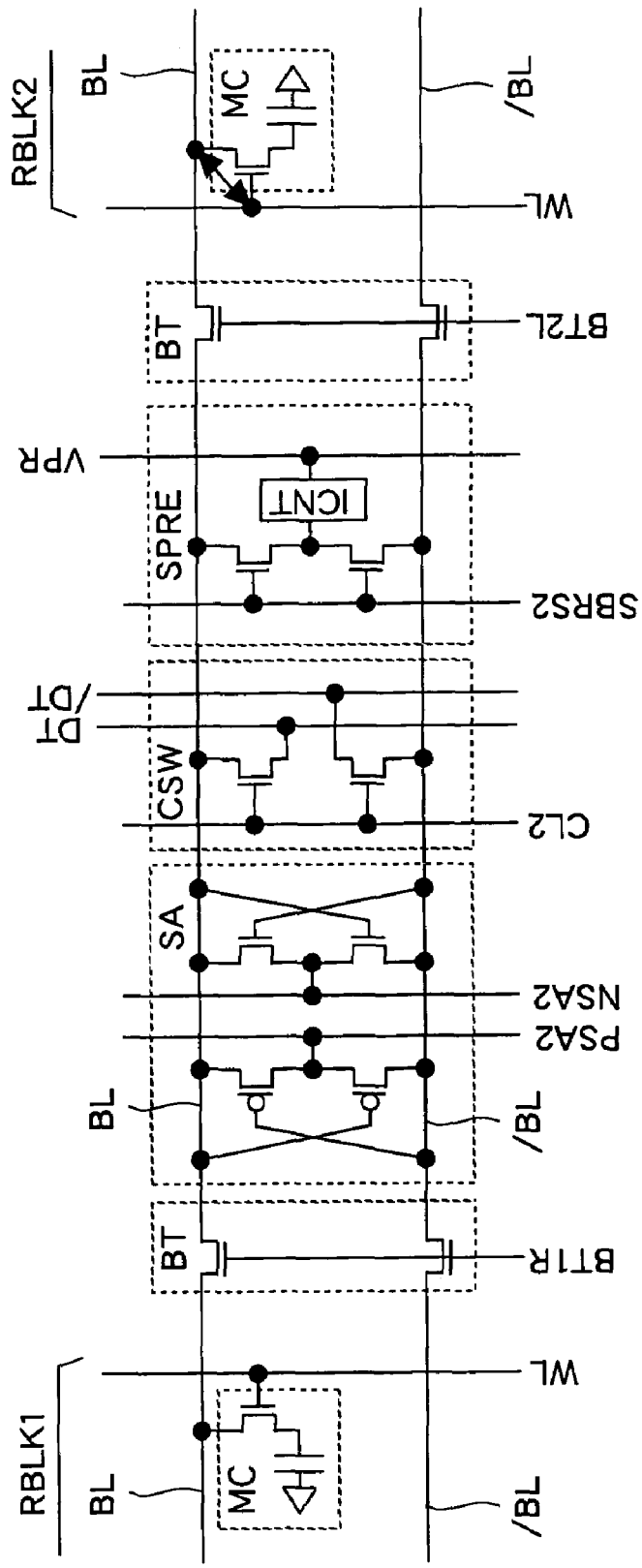
FIG. 45 is a circuit diagram showing another example of the memory core.
Figure 46:
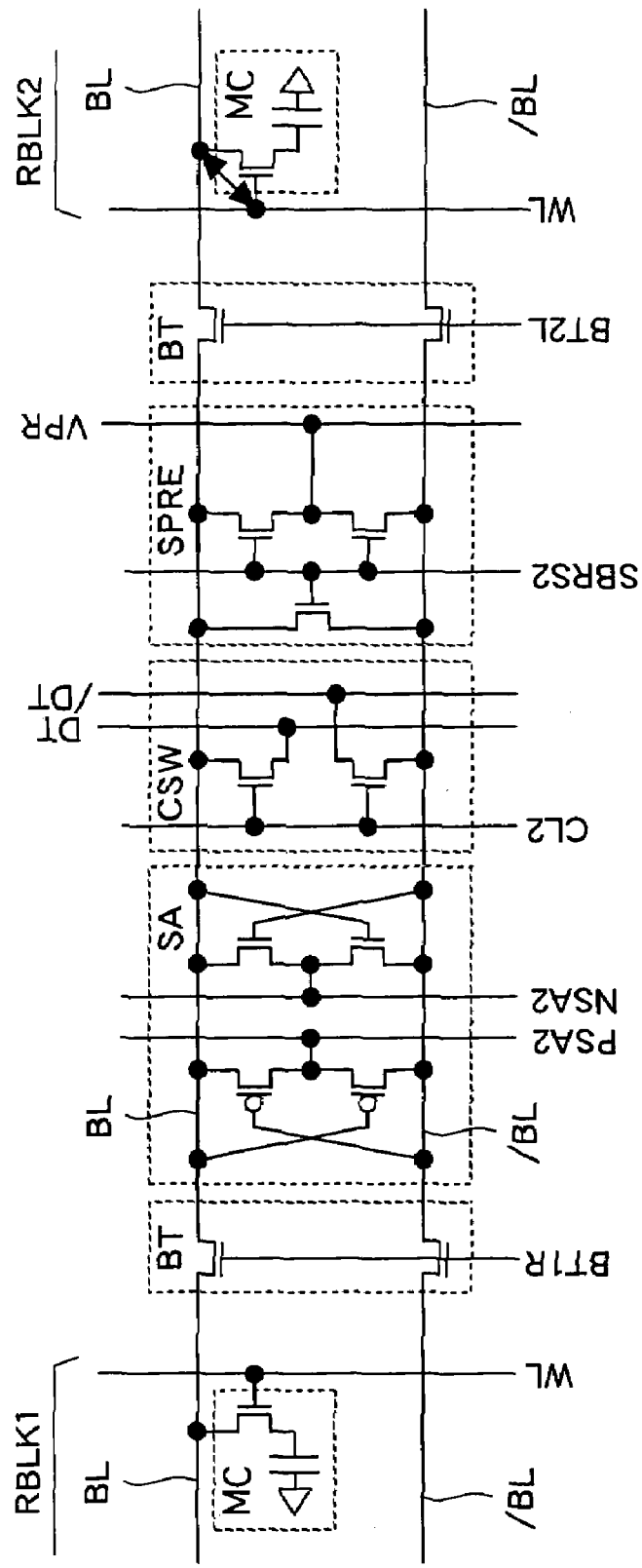
FIG. 46 is a circuit diagram showing another example of the memory core.
Figure 47:
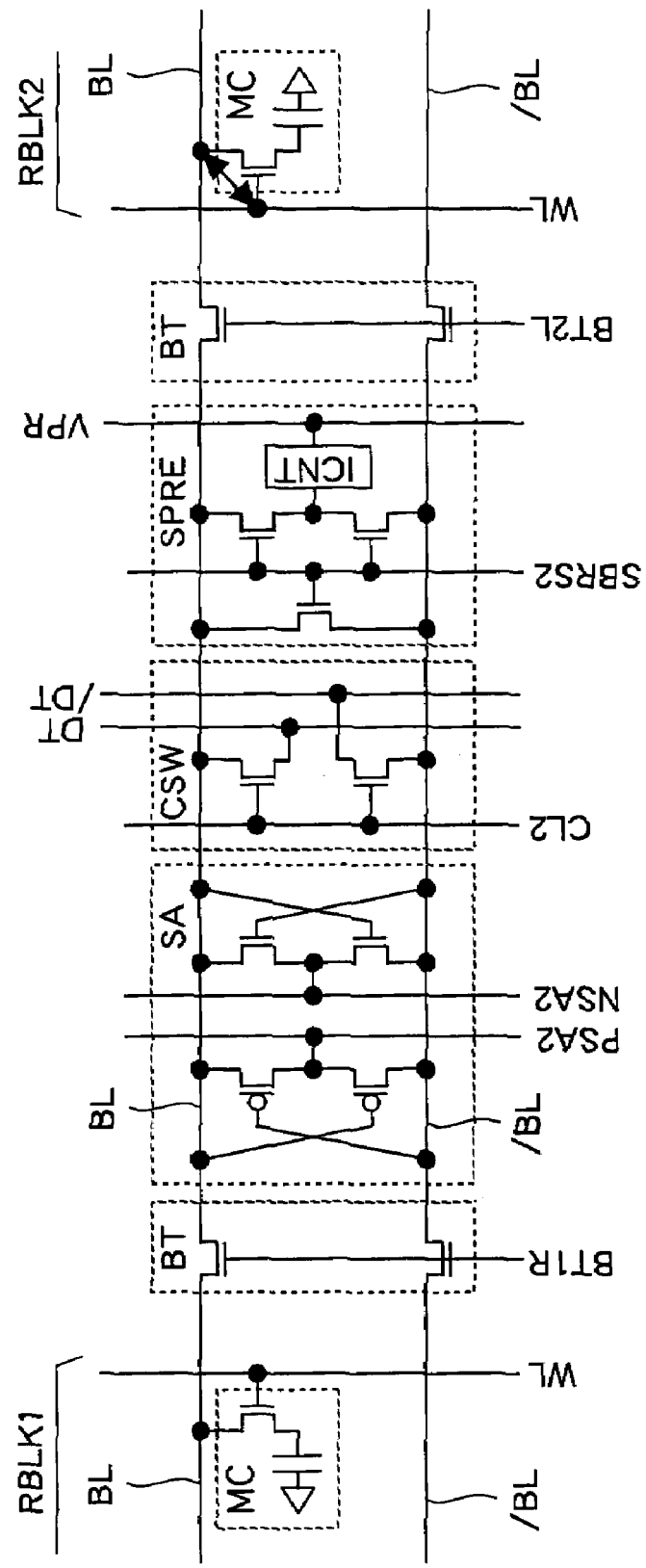
FIG. 47 is a circuit diagram showing another example of the memory core.

In the above twentieth embodiment (FIG. 34), an example in which a memory core is constructed by arranging the current suppression element ICNT in the precharge circuit PRE was described. However, the present invention is not limited to such an embodiment. As shown in FIG. 43, for example, the sub precharge circuit SPRE used in the nineteenth embodiment (FIG. 32) may be added to the memory core shown in FIG. 34. Also as shown in FIG. 44, the precharge circuit PRE may be removed from the memory core in the nineteenth embodiment (FIG. 32). Further, as shown in FIG. 45, a current suppression element ICNT may be arranged in the sub precharge circuit SPRE of the memory core in FIG. 44. Also, as shown in FIG. 46, an nMOS transistor mutually connecting the bit lines BL and /BL may be added to the sub precharge circuit SPRE in the memory core in FIG. 44. Also, as shown in FIG. 47, an nMOS transistor mutually connecting the bit lines BL and /BL may be added to the sub precharge circuit SPRE in the memory core in FIG. 45. In addition, a sub precharge circuit SPRE and a current suppression element ICNT can be added to each embodiment. If a sub precharge circuit SPRE is added, the precharge circuit PRE may be removed.

In the above embodiments, examples in which the present invention is applied to FCRAM (pseudo SRAM) have been described. However, the present invention is not limited to such embodiments. For example, the present invention may be applied to DRAM or SDRAM. In such cases, an external refresh operation in response to an external refresh request is performed as an external access operation. Further, the present invention may be applied to SRAM, nonvolatile memory, and so on.

Figure 48:
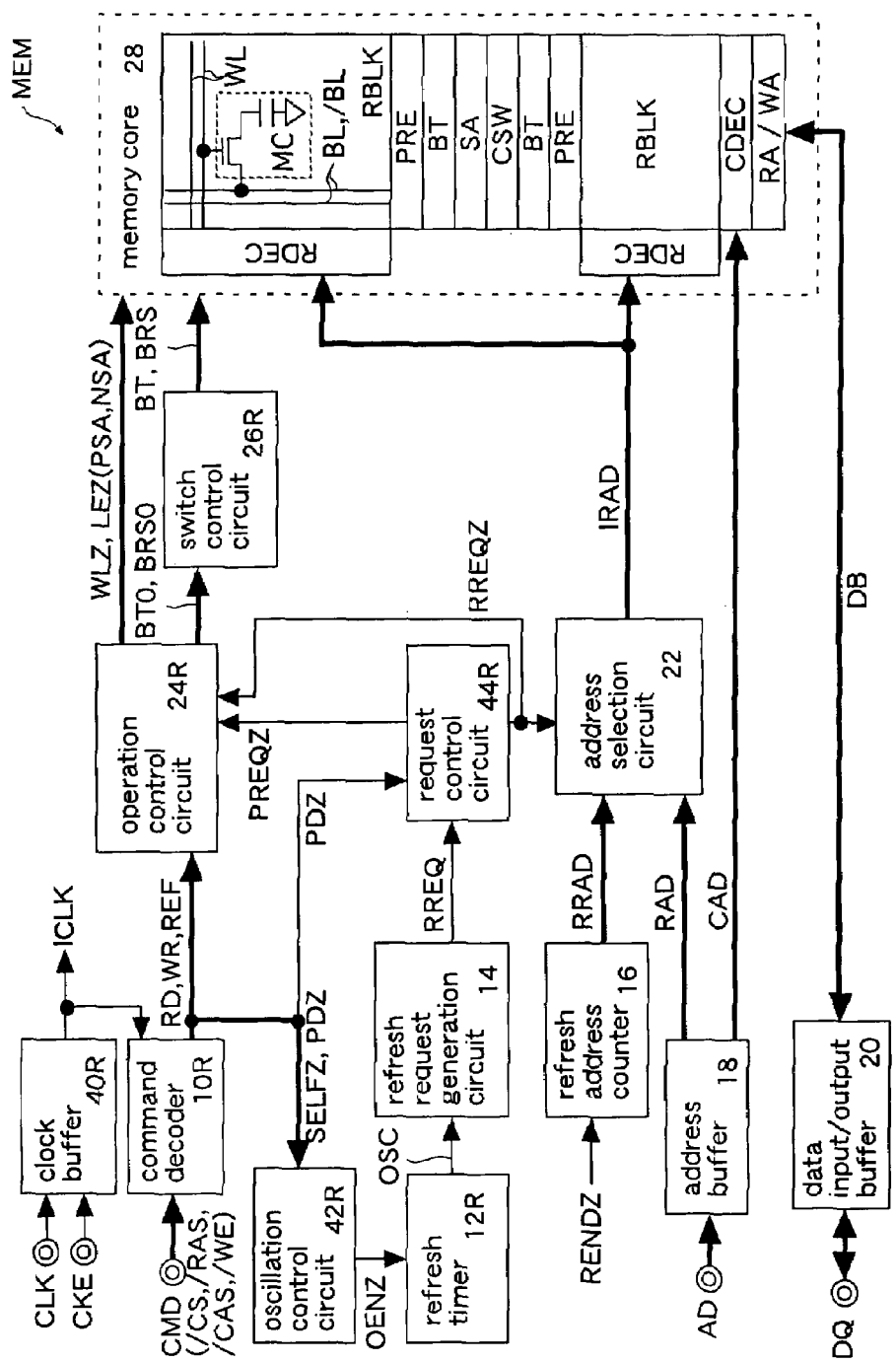
FIG. 48 is a block diagram showing a twenty-fourth embodiment of the present invention.

FIG. 48 shows a twenty-fourth embodiment of the present invention. The same symbols and numerals are attached to the same components as those described in the first embodiment and a detailed description thereof is omitted. In the present embodiment, a semiconductor memory MEM is, for example, an SDRAM. The memory MEM includes a clock buffer 40R, a command decoder 10R, an oscillation control circuit 42R, a refresh timer 12R, the refresh request generation circuit 14, a request control circuit 44R, the refresh address counter 16, the address buffer 18, the data input/output buffer 20, the address selection circuit 22, an operation control circuit 24R, a switch control circuit 26R, and the memory core 28. The memory MEM constitutes, as shown in FIG. 4, a memory system together with a CPU.

The clock buffer 40R outputs a clock signal CLK as an internal clock signal ICLK when a clock enable signal CKE is at the high logical level. The internal clock signal ICLK is supplied to circuits operating in synchronization with the clock signal CLK such as the command decoder 10R, the address buffer 18, the data input/output buffer 20, and the operation control circuit 24R. The clock buffer 40R stops outputting the internal clock signal ICLK when the clock enable signal CKE is at the low logical level. When the internal clock signal ICLK stops, the memory MEM enters a power-down mode in which input circuits (such as the command decoder 10R, the address buffer 18, and the data input/output buffer 20) receiving external access requests and so on are inactivated. With inactivation of the input circuits, a power supply current in the input circuits is reduced, leading to a substantial reduction in power consumption of the memory MEM. With the clock enable signal CKE changing from the low logical level to the high logical level, the memory MEM exits from the power-down mode to return to the normal operation mode.

The command decoder 10R outputs a command recognized in accordance with a logical level of a command signal CMD as a read command RD, a write command WR, a refresh command REF or the like for performing an access operation of the memory core 28. Also, the command decoder 10R activates a self-refresh mode signal SELFZ when the command signal CMD indicates an entry of a self-refresh command and inactivates a self-refresh mode signal SELF when the command signal CMD indicates an exit of the self-refresh command. The command decoder 10R inactivates a power-down mode signal PDZ while the internal clock signal ICLK is supplied and activates the power-down mode signal PDZ when a supply of the internal clock signal ICLK stops. The commands RD, WR, and REF are external access requests for performing an access operation of the memory core 28. For example, the command signal CMD includes a chip select signal /CS, a row address strobe signal /RAS, a column address strobe signal /CAS, and a write enable signal /WE.

Figure 49:
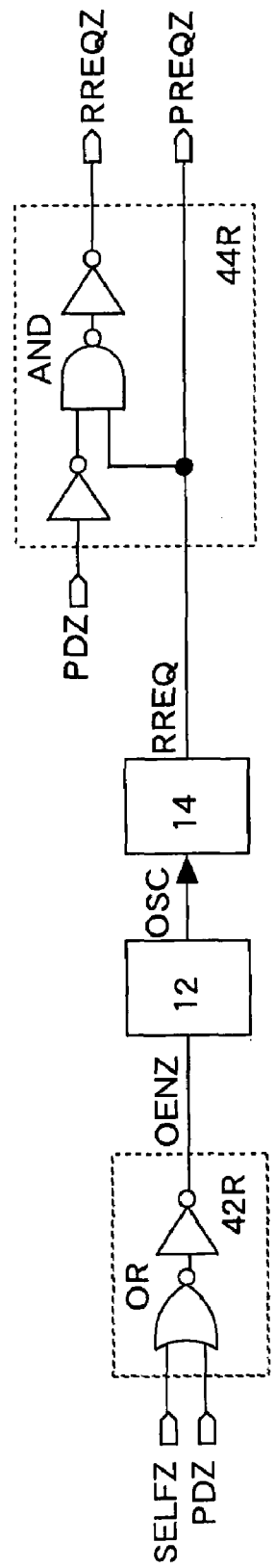
FIG. 49 is a circuit diagram showing details of an oscillation control circuit and a request control circuit in FIG. 48.

The oscillation control circuit 42R activates an oscillation enable signal OENZ while the self-refresh mode signal SELFZ or the power-down mode signal PDZ is activated. The refresh timer 12R (signal generation circuit) operates while the oscillation enable signal OENZ is activated to output an oscillation signal OSC (timing signal) and stops its operation while the oscillation enable signal OENZ is inactivated. The request control circuit 44R outputs a refresh request signal RREQZ or a precharge request signal PREQZ in synchronization with a refresh request signal RREQ. The power-down mode signal PDZ is used, as shown in FIG. 49, to mask output of the refresh request signal RREQZ.

The refresh address counter 16 performs count operations in synchronization with a refresh end signal RENDZ generated in synchronization with completion of a refresh operation and updates a refresh address signal RRAD. The refresh end signal RENDZ is generated by the operation control circuit 24R. The address selection circuit 22 outputs the refresh address signal RRAD to the memory core 28 as an internal row address signal IRAD to perform a refresh operation in response to activation of the refresh request signal RREQZ. The operation control circuit 24R outputs control signals WLZ, LEZ, BT0, and BRS0 for causing the memory core 28 to perform a read operation, a write operation, or a refresh operation in response to a read command RD, a write command WR, a refresh command REF (external access request), or a refresh request signal RREQZ (internal access request). Further, the operation control circuit 24R outputs a precharge control signal BRS0 for precharging the bit lines BL and /BL in response to a precharge request signal PREQZ.

The read command RD, write command WR, and refresh command REF are supplied in normal operation mode. A refresh request signal RREQZ is generated in self-refresh mode. A precharge request signal PREQZ is generated in self-refresh mode and power-down mode.

The switch control circuit 26R sets precharge control signals BRS (three pairs from BRS0L/0R, BRS1L/1R, BRS2L/2R, and BRS3L/3R) of memory blocks RBLK that do not perform a self-refresh operation in self-refresh mode to the high logical level only during a predetermined period in response to a precharge control signal BRS0. Also, the switch control circuit 26R sets precharge control signals BRS of all memory blocks RBLK to the high logical level only in a predetermined period in response to a precharge control signal BRS0. Waveforms of the precharge control signal BRS of memory blocks RBLK performing a self-refresh operation are the same as those of BRS2L and BRS2R in FIG. 6. Operations of the switch control circuit 26R in normal operation mode are the same as those in an activation period ACT in FIG. 5 and those in FIG. 6.

Figure 50:
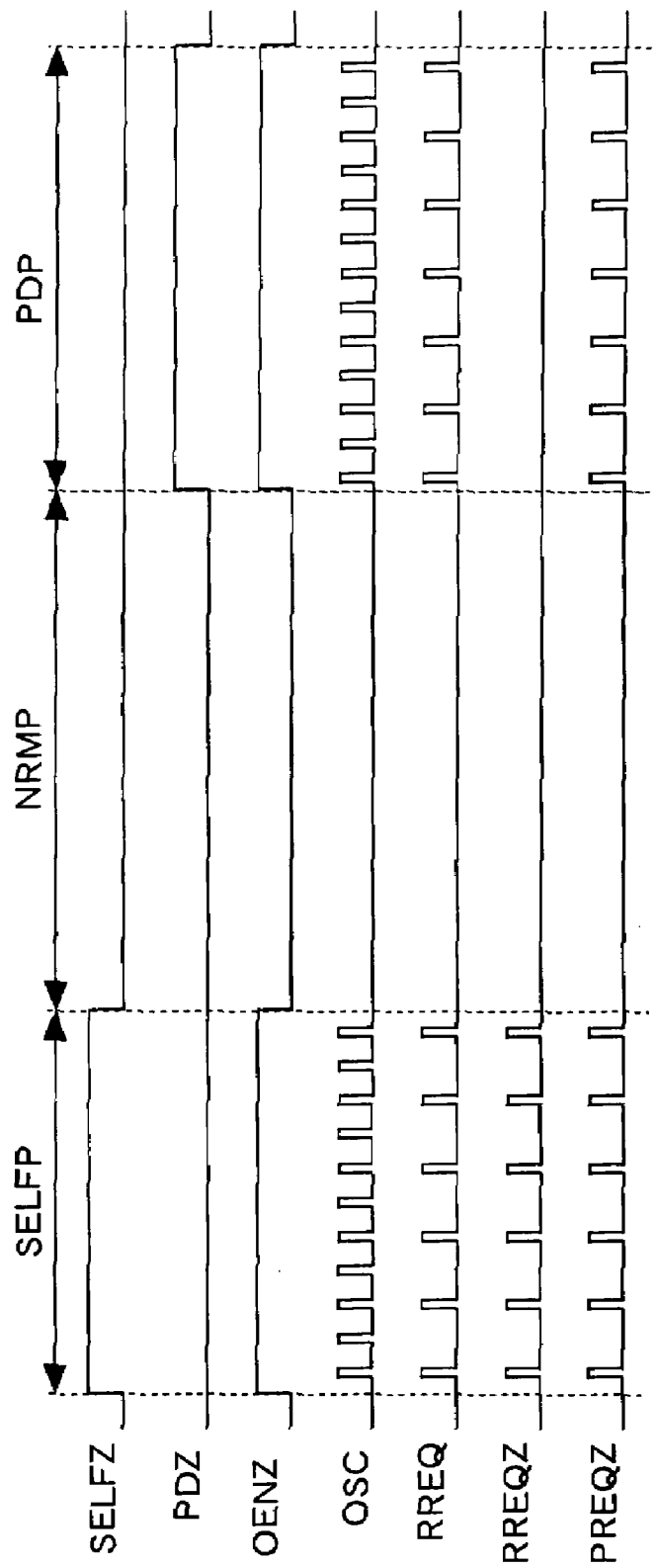
FIG. 50 is a timing chart showing operations of the twenty-fourth embodiment.

FIG. 49 shows details of the oscillation control circuit 42R and the request control circuit 44R in FIG. 48. The oscillation control circuit 42R is constituted by an OR circuit. The request control circuit 44R has an AND circuit receiving inverted logic of a power-down signal PDZ and a refresh request signal RREQ. The request control circuit 44R outputs the refresh request signal RREQ as a precharge request signal PREQZ and outputs a refresh request signal RREQZ in synchronization with a refresh request signal RREQ while the power-down signal PDZ is inactivated. That is, as shown in FIG. 50, the precharge request signal PREQZ is generated in synchronization with the refresh request signal RREQ in self-refresh mode and in power-down mode. The refresh request signal RREQZ is generated in synchronization with the refresh request signal RREQ only in self-refresh mode and its generation is prohibited in power-down mode.

FIG. 50 shows operations of the twenty-fourth embodiment. The self-refresh mode signal SELFZ is activated only in a self-refresh period SELFP. The power-down mode signal PDZ is activated only in a power-down period PDP. Therefore, the oscillation signal OSC is output only in a self-refresh period SELFP and a power-down period PDP and is not output in a normal operation mode period NRMP. In other words, in contrast to a pseudo SRAM, a self-refresh operation in normal operation mode is performed in an SDRAM in response to only an external refresh request REF. A self-refresh operation is performed only in a self-refresh period SELFP in response to a refresh request signal RREQZ (internal access request) periodically degenerated inside the memory MEM.

In a self-refresh period SELFP, the request control circuit 44R outputs a refresh request signal RREQZ and a precharge request signal PREQZ in response to a refresh request signal RREQ. In a power-down period PDP, the request control circuit 44R outputs only a precharge request signal PREQZ in response to a refresh request signal RREQ and prohibits generation of the refresh request signal RREQZ. Incidentally, in the present embodiment, the cutoff function does not depend on the operation mode and is set for all memory blocks RBLK0-3.

The normal operation mode is an external operation mode permitting reception of external access requests RD, WR, and REF. The self-refresh mode and the power-down mode are internal operation modes prohibiting reception of external access requests RD, WR, and REF.

Figure 51:
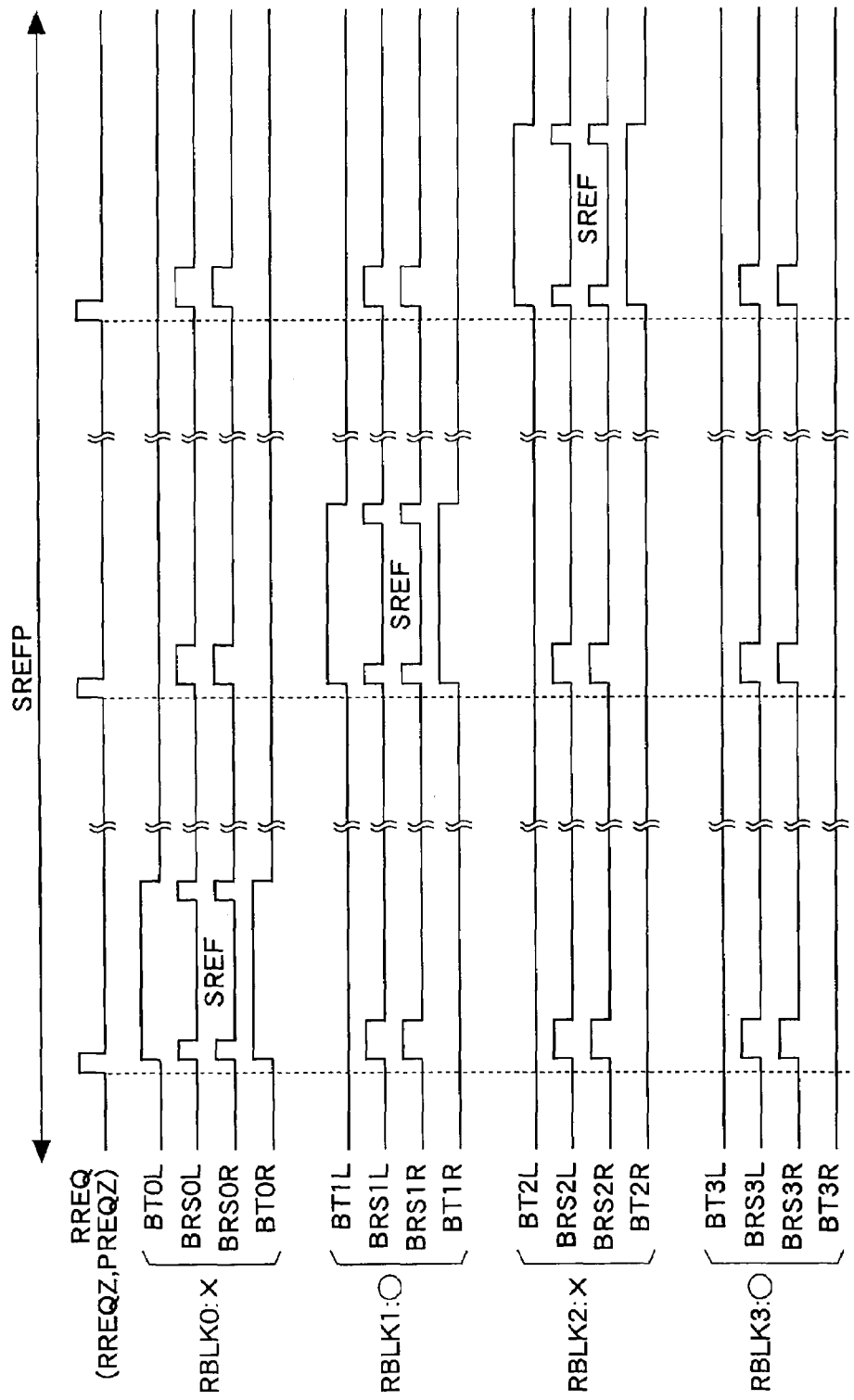
FIG. 51 is a timing chart showing operations in self-refresh mode of the twenty-fourth embodiment.

FIG. 51 shows operations in self-refresh mode of the twenty-fourth embodiment. A detailed description of the same operations as those in FIG. 5 described above is omitted. Like the above embodiments, bad memory blocks denoted by X marks in FIG. 51 replace a word line WL or bit lines BL and /BL having leak failure with a redundancy circuit (a redundancy word line or redundancy bit lines). Memory blocks RBLK in which a self-refresh operation SREF is performed are sequentially switched in response to a refresh address signal RRAD generated for each refresh request signal RREQZ. Waveforms of the self-refresh operation SREF are the same as those in FIG. 5.

Further, in the present embodiment, memory blocks RBLK that do not perform a self-refresh operation SREF receive a precharge control signal BRS that temporarily changes to the high logical level in response to a precharge request signal PREQZ. A precharge operation of the bit lines BL and /BL is thereby performed. A self-refresh operation SREF is performed in each memory block RBLK less frequently in self-refresh mode. Thus, if the cutoff function is set, the precharge control signal BRS is set to a low level for a long time. Generally, a minute leak path that does not affect ordinary operations exists between bit lines BL and /BL and a ground line VSS. Due to the leak path, the voltage level of the bit lines BL and /BL in a floating state gradually decreases from a precharge level VPR with the passage of time.

However, in the present embodiment, a precharge operation is periodically performed. Accordingly, a short circuit between a word line WL and a bit line BL (or /BL) physically exists and even when the cutoff function is set, the voltage level of the bit lines BL and /BL can be held at the precharge level VPR. In other words, even when a short circuit physically exists between a word line WL and a bit line BL (or /BL), the leak current can be minimized by the cutoff function and the voltage level of the bit lines BL and /BL can be held at the precharge level VPR. Therefore, malfunctions of the sense amplifier SA in a self-refresh operation SREF or an access operation RD, WR, or REF after returning from the self-refresh mode to the normal operation mode can be prevented. More specifically, reduction in read margin of memory cells MC retaining logic "0" can be prevented.

Figure 52:
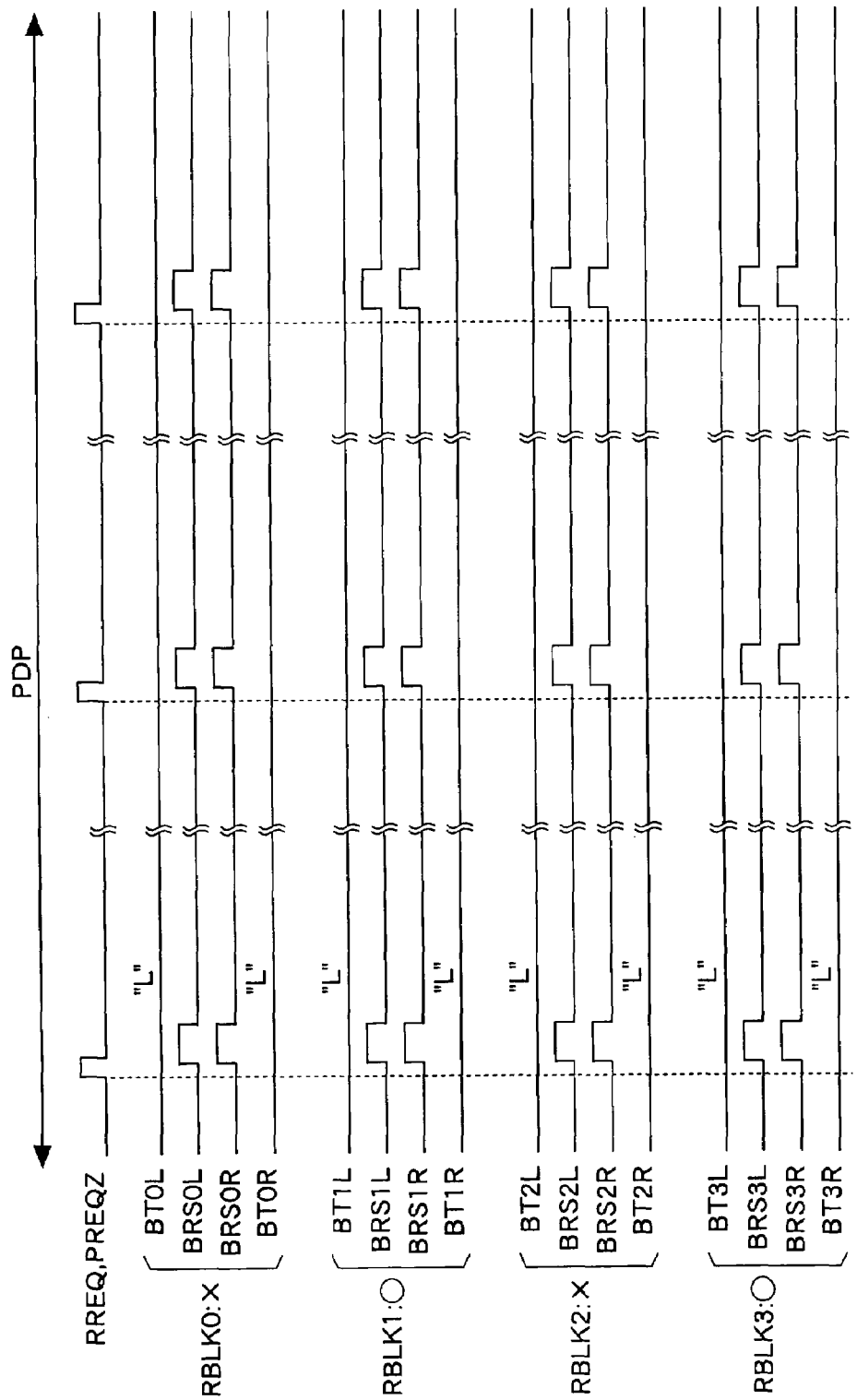
FIG. 52 is a timing chart showing operations in power-down mode of the twenty-fourth embodiment.

FIG. 52 shows operations in power-down mode of the twenty-fourth embodiment. Reception of external access requests RD, WR, and REF are prohibited in power-down mode and also generation of the refresh request signal RREQZ (internal access request) is prohibited. Thus, only a precharge request signal PREQZ is generated in response to a refresh request signal RREQ. All memory blocks RBLK0-3 receive a precharge control signal BRS that temporarily changes to the high logical level in response to a precharge request signal PREQZ. Then, a precharge operation is performed in all memory blocks RBLK. Thus, like the self-refresh mode, even when a short circuit physically exists between a word line WL and a bit line BL (or /BL), the leak current can be minimized by the cutoff function and the voltage level of the bit lines BL and /BL can be held at the precharge level VPR.

Also in the twenty-fourth embodiment described above, the same advantages as those of the above embodiments can be obtained. Further, in the present embodiment, the cutoff function is set and the voltage level of the bit lines BL and /BL can be held at the precharge level VPR even if a floating period of the bit lines BL and /BL is long. Therefore, malfunctions of the sense amplifier SA in an access operation RD, WR, or REF after returning from the self-refresh mode or power-down mode to the normal operation mode can be prevented.

Figure 53:
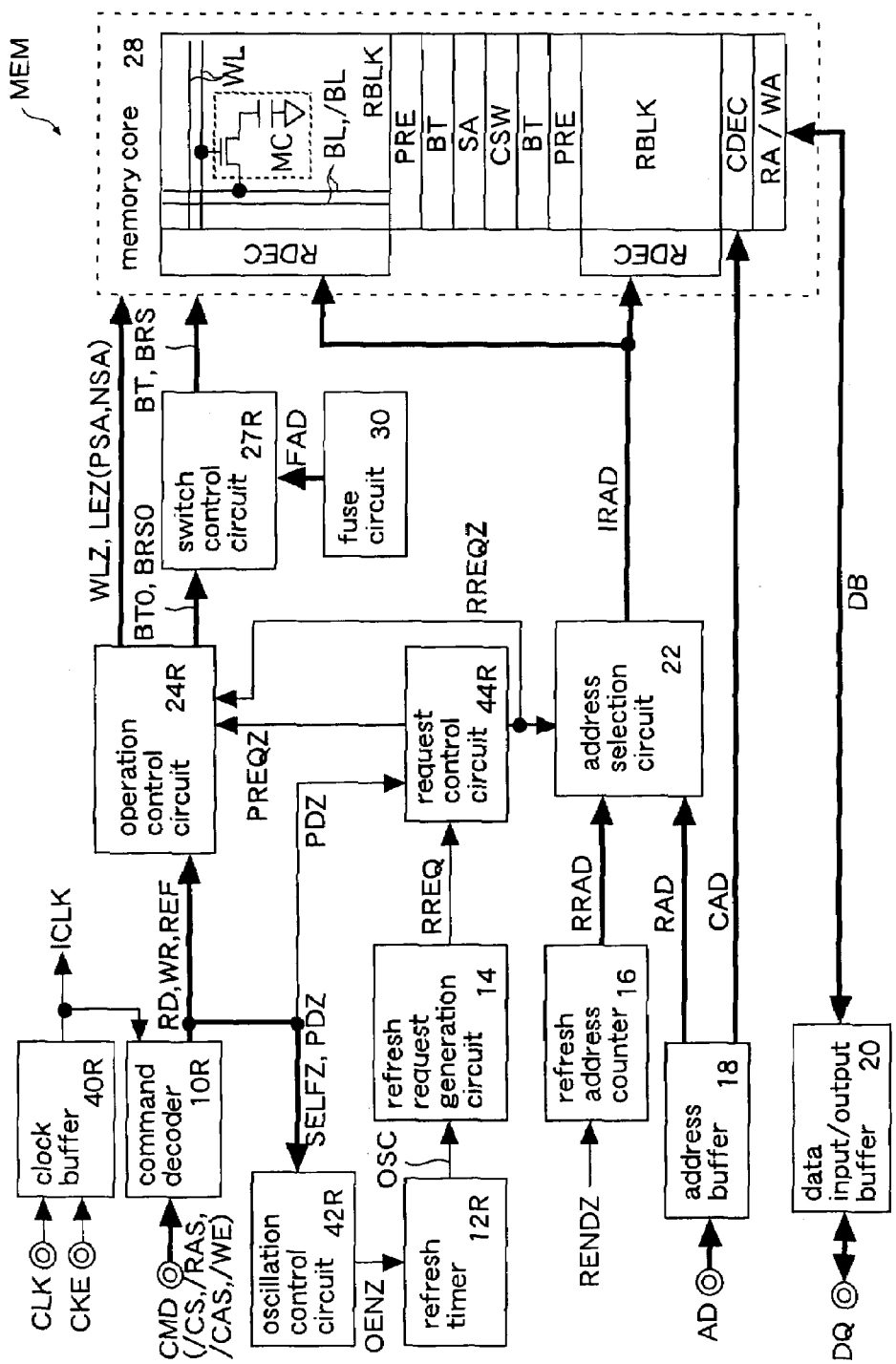
FIG. 53 is a block diagram showing a twenty-fifth embodiment of the present invention.

FIG. 53 shows a twenty-fifth embodiment of the present invention. The same symbols and numerals are attached to the same components as those described in the first, second, and twenty-fourth embodiments and a detailed description thereof is omitted. In the present embodiment, a switch control circuit 27R is formed instead of the switch control circuit 26R in the twenty-fourth embodiment. Also, like the second embodiment, the memory MEM has the fuse circuit 30 (leak memory unit). Other components are the same as those in the twenty-fourth embodiment. That is, the memory MEM is, for example, an SDRAM. The memory MEM constitutes, as shown in FIG. 4, a memory system together with a CPU.

In the present embodiment, like the second embodiment, the fuse circuit 30 outputs block addresses FAD indicating bad memory blocks RBLK. The fuse circuit 30 may use a redundancy fuse circuit storing block addresses of bad memory blocks RBLK to replace a bad memory block RBLK with a redundancy memory block RRBLK (not shown) or a circuit may be formed separately from the redundancy fuse circuit. The switch control circuit 27R sets the cutoff function for bad memory blocks RBLK only and releases the cutoff function for any good memory block RBLK.

Figure 54:
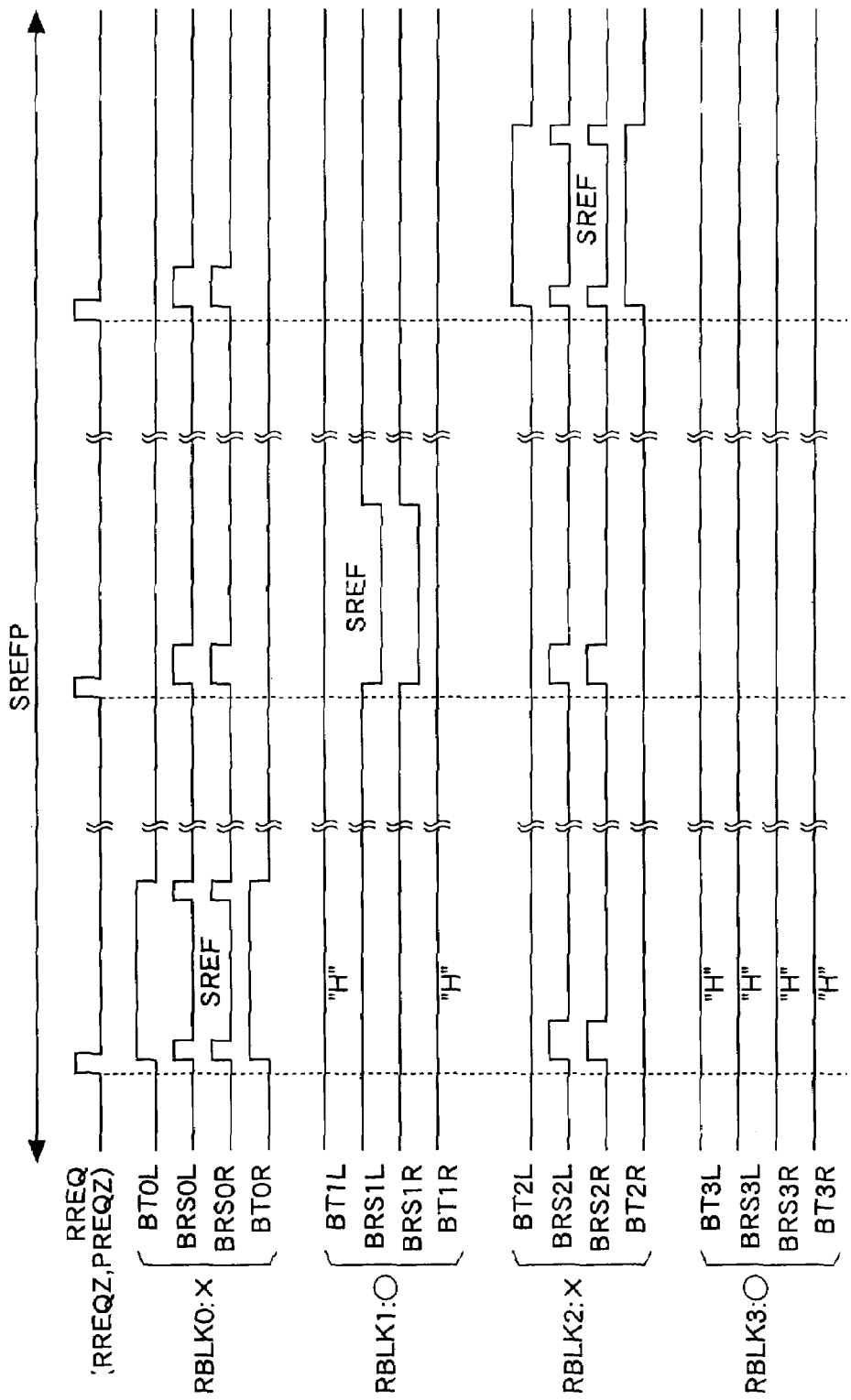
FIG. 54 is a timing chart showing operations in self-refresh mode of the twenty-fifth embodiment.

FIG. 54 shows operations in self-refresh mode of the twenty-fifth embodiment. A detailed description of the same operations as those in FIGS. 5 and 51 described above is omitted. In the present embodiment, in good memory blocks RBLK1 and 3, the precharge control signal BRS is held at the high logical level in self-refresh mode excluding a period of self-refresh operation SREF. In bad memory blocks RBLK0 and 2, the precharge control signal BRS temporarily changes to the high logical level in response to a precharge request signal PREQZ. The precharge circuit PRE shown in FIG. 3 is turned on while the precharge control signal BRS is at the high logical level to supply a precharge voltage VPR to the bit lines BL and /BL.

Figure 55:
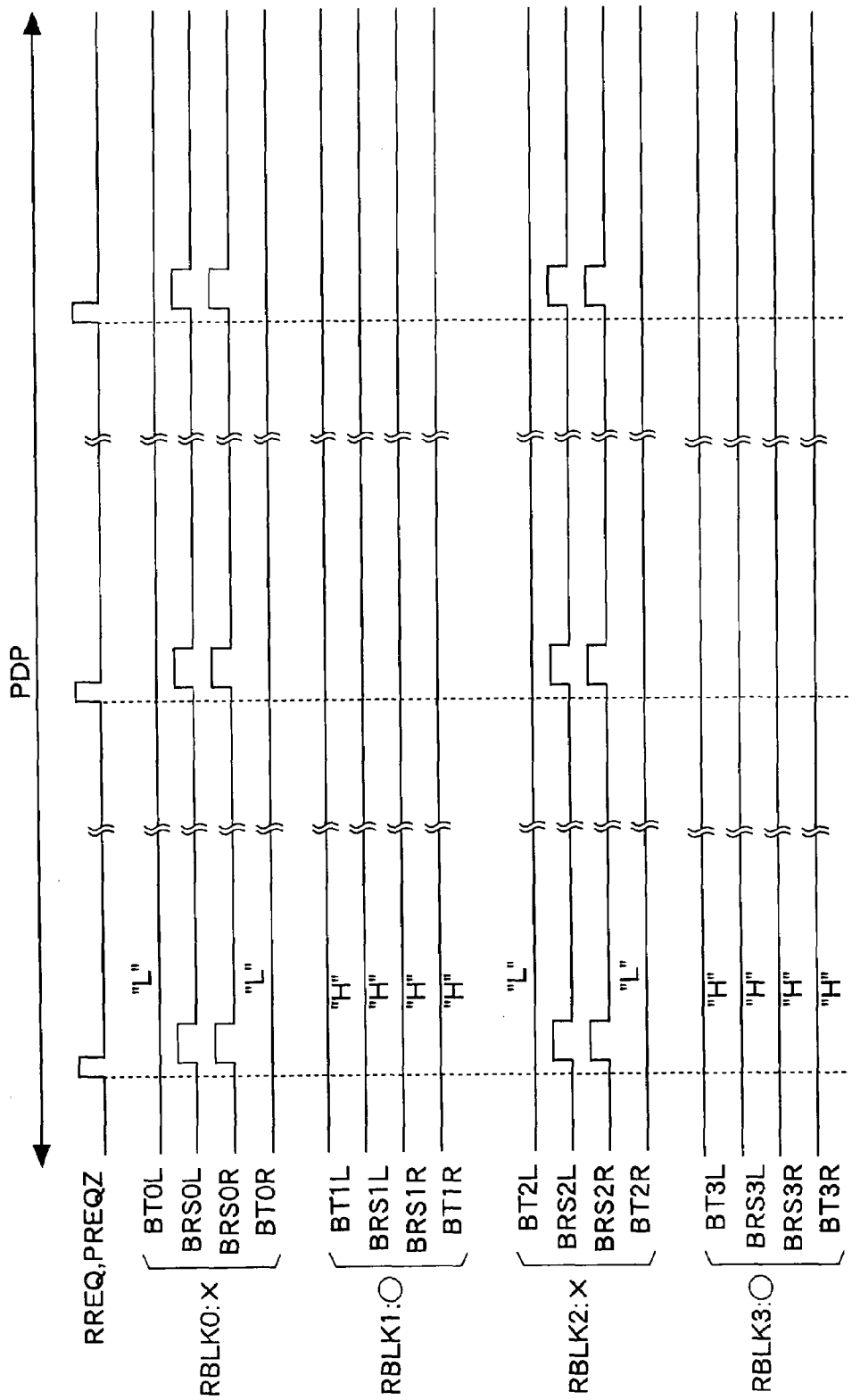
FIG. 55 is a timing chart showing operations in power-down mode of the twenty-fifth embodiment.

FIG. 55 shows operations in power-down mode of the twenty-fifth embodiment. A detailed description of the same operations as those in FIG. 52 described above is omitted. Also in power-down mode, just like in self-refresh mode, the precharge control signal BRS temporarily changes to the high logical level in response to a precharge request signal PREQZ only in the bad memory blocks RBLK0 and 2. In the good memory blocks RBLK1 and 3, the precharge control signal BRS is held at the high logical level in power-down mode. Thus, the precharge circuit PRE is turned on/off only in the bad memory blocks RBLK0 and 2.

Also in the twenty-fifth embodiment described above, the same advantages as those of the above first, second, and twenty-fourth embodiments can be obtained. Further, in the present embodiment, by setting the cutoff function for only bad memory blocks RBLK, wasteful operations of the connection switch BT and precharge circuit PRE can be prevented and standby currents can be reduced still further.

Figure 56:
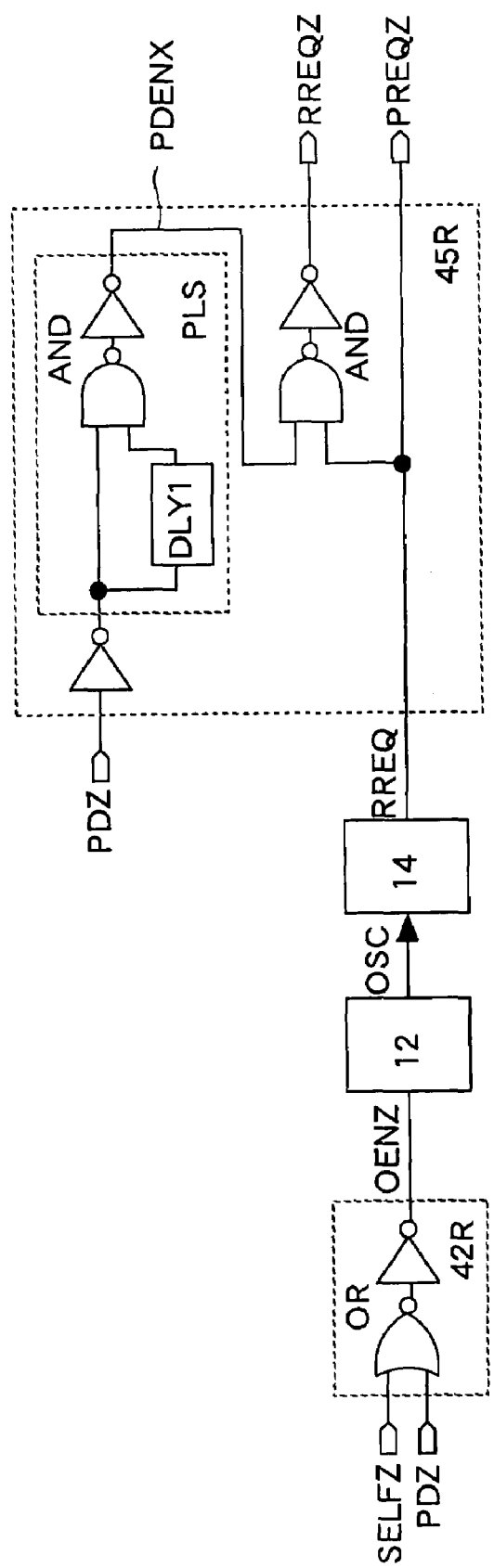
FIG. 56 is a circuit diagram showing details of an oscillation control circuit and a request control circuit in a twenty-sixth embodiment.

FIG. 56 shows details of the oscillation control circuit 42R and a request control circuit 45R in a twenty-sixth embodiment. The same symbols and numerals are attached to the same components as those described in the first and twenty-fourth embodiments and a detailed description thereof is omitted. In the present embodiment, the request control circuit 45R is formed instead of the request control circuit 44R in the twenty-fourth embodiment. Other components are the same as those in the twenty-fourth embodiment. That is, the memory MEM is, for example, an SDRAM. The memory MEM constitutes, as shown in FIG. 4, a memory system together with a CPU.

The request control circuit 45R has a pulse adjustment circuit PLS (mask circuit) between an inverter receiving a power-down mode signal shown in FIG. 49 and a NAND gate. The pulse adjustment circuit PLS (mask circuit) is constituted by a delay circuit DLY1 for delaying inactivation timing of a power-down enable signal PDENX until after that of a power-down mode signal PDZ and an AND circuit.

Figure 57:
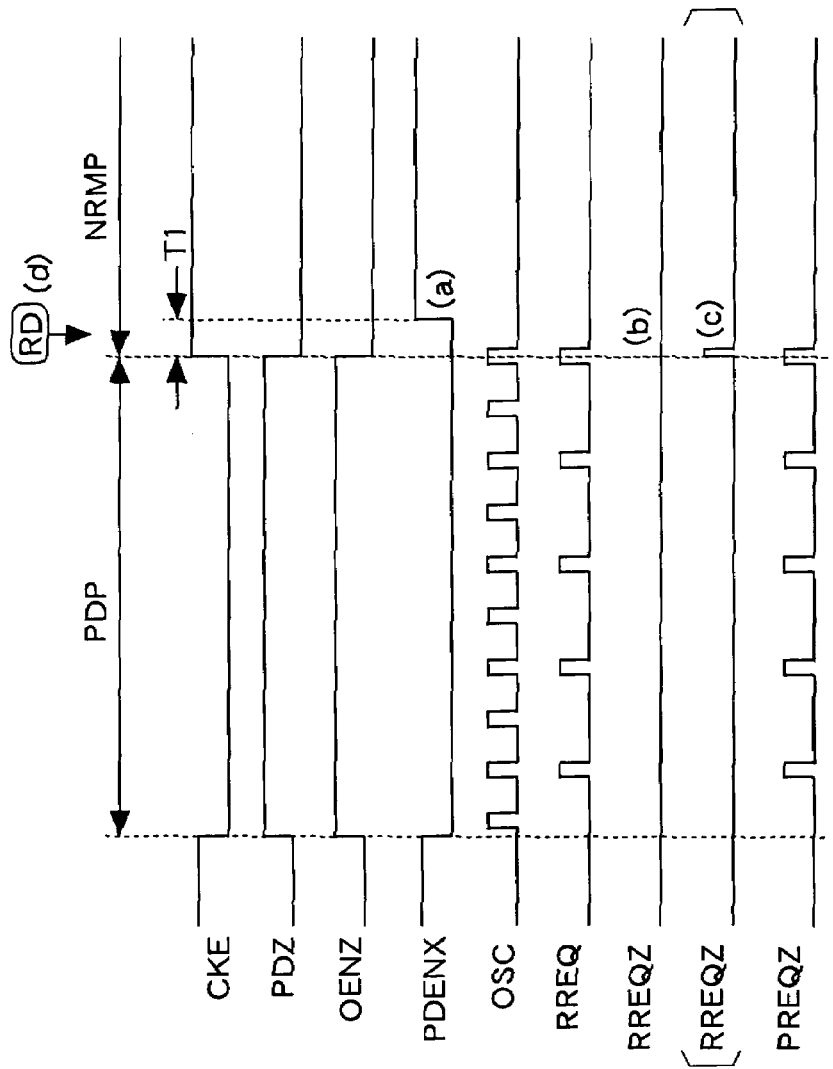
FIG. 57 is a timing chart showing operations of the twenty-sixth embodiment.

FIG. 57 shows operations of the twenty-sixth embodiment. FIG. 57 shows an example in which the memory MEM exits from the power-down mode (PDP) in response to activation of the clock enable signal CKE to migrate to the normal operation mode (NRMP). Inactivation timing of the power-down enable signal PDENX is delayed due to the pulse adjustment circuit PLS (FIG. 57(a)). Thus, after exiting from the power-down mode, generation of the refresh request signal RREQZ (internal access request) is prohibited for a delay time T1 of the delay circuit DLY1 (FIG. 57(b)).

No refresh request signal RREQZ is generated in power-down mode and normal operation mode. However, as shown by brackets in FIG. 57, if a refresh request signal RREQ is output from the refresh request generation circuit 14 when switching from the power-down mode to the normal operation mode, a refresh request signal RREQZ may be output when exiting from the power-down mode (FIG. 57(c)). In normal operation mode, on the other hand, external access requests such as a read command RD are supplied to the memory MEM asynchronously with internal operations of the memory MEM (FIG. 57(d)). Thus, an external access request and an internal access request RREQZ may collide when the normal operation mode starts and it is necessary to prevent such a collision.

Also in the twenty-sixth embodiment described above, the same advantages as those of the above first and twenty-fourth embodiments can be obtained. Further, in the present embodiment, by prohibiting generation of the refresh request signal RREQZ when switching from the power-down mode to the normal operation mode for a predetermined time, collision between an external access request and an internal access request RREQZ can be prevented and thus malfunctions of the memory MEM can be prevented.

Figure 58:
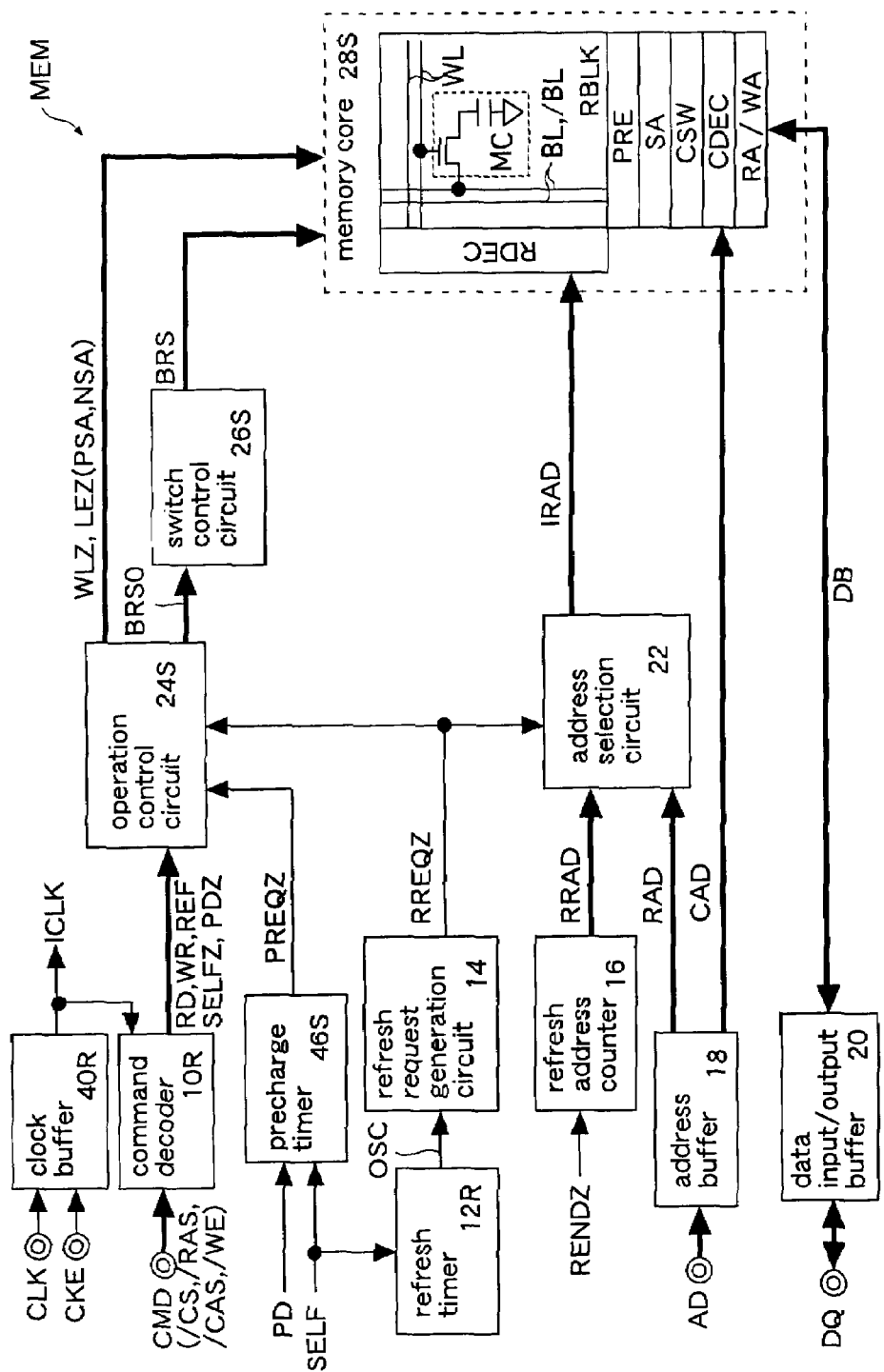
FIG. 58 is a block diagram showing a twenty-seventh embodiment of the present invention.

FIG. 58 shows a twenty-seventh embodiment of the present invention. The same symbols and numerals are attached to the same components as those described in the first and twenty-fourth embodiments and a detailed description thereof is omitted. In the present embodiment, a memory core 28S is constituted by one memory block RBLK. Thus, the memory core 28S has no connection switch BT for connecting the memory block RBLK to the sense amplifier SA. Also, an operation control circuit 24S and a switch control circuit 26S for controlling operations of the memory core 28S are different from those of the twenty-fourth embodiment in that no switch control signal BT is output. Further, the memory MEM has, separately from the refresh timer 12R, a dedicated precharge timer 46S that outputs a precharge request signal PREQZ in a predetermined cycle. Thus, the cycle of the precharge request signal PREQZ can be set regardless of the cycle of the oscillation signal OSC. Since the precharge timer 46S can be set independently, the request control circuit 44R (FIG. 48) for generating a refresh request signal RREQZ and a precharge request signal PREQZ from a refresh request signal RREQ is not needed. Other components are the same as those in the twenty-fourth embodiment. That is, the memory MEM is, for example, an SDRAM. The memory MEM constitutes, as shown in FIG. 4, a memory system together with a CPU.

The precharge timer 46S periodically outputs the precharge request signal PREQZ in power-down mode and self-refresh mode. The refresh timer 12R periodically outputs the oscillation signal OSC only in self-refresh mode. Basic operations of the memory MEM are the same as those in FIG. 50 described above except that the precharge request signal PREQZ is not synchronized with the oscillation signal OSC.

Figure 59:
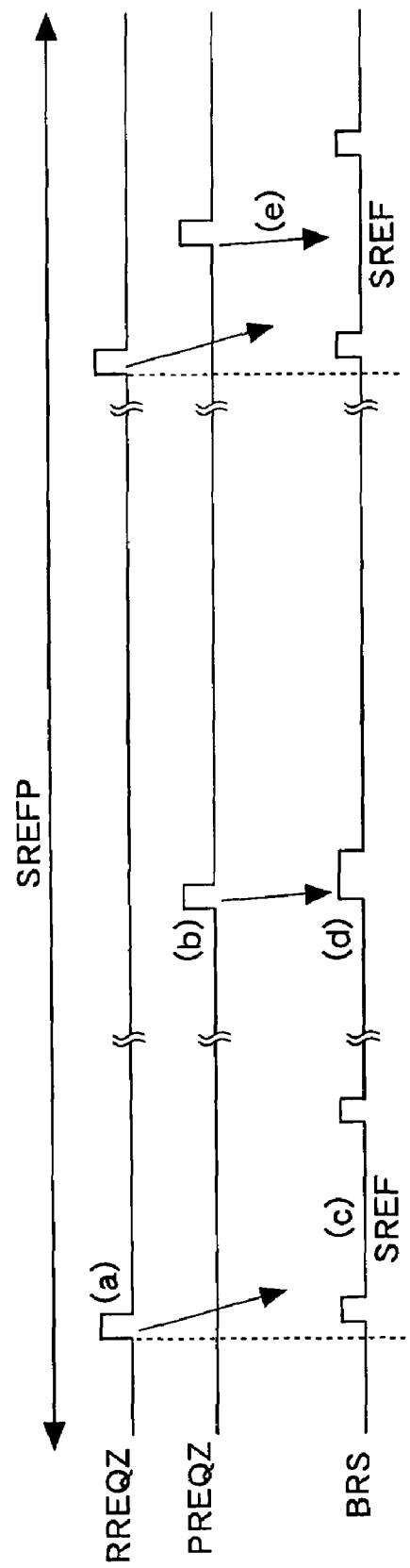
FIG. 59 is a timing chart showing operations in self-refresh mode of the twenty-seventh embodiment.

FIG. 59 shows operations in self-refresh mode of the twenty-seventh embodiment. In the present embodiment, a refresh request signal RREQZ and a precharge request signal PREQZ are mutually asynchronously generated (FIG. 59(a, b)). The operation control circuit 24S generates a precharge control signal BRS in synchronization with a refresh request signal RREQZ and a precharge request signal PREQZ (FIG. 59(c, d)). However, a refresh request signal RREQZ and a precharge request signal PREQZ may overlap. In such cases, the operation control circuit 24S masks the precharge request signal PREQZ and generates a precharge control signal BRS in response to only the refresh request signal RREQZ (FIG. 59(e)).

Also in the twenty-seventh embodiment described above, the same advantages as those of the above first and twenty-fourth embodiments can be obtained. Further, in the present embodiment, the cycle of the precharge request signal PREQZ can be set regardless of the cycle of the oscillation signal OSC. Thus, for example, power consumption of the memory MEM can be reduced by setting the cycle of the precharge request signal PREQZ longer. In other words, a generation cycle of the precharge request signal PREQZ can be set in accordance with a leak current amount of the bit lines BL and /BL.

Figure 60:
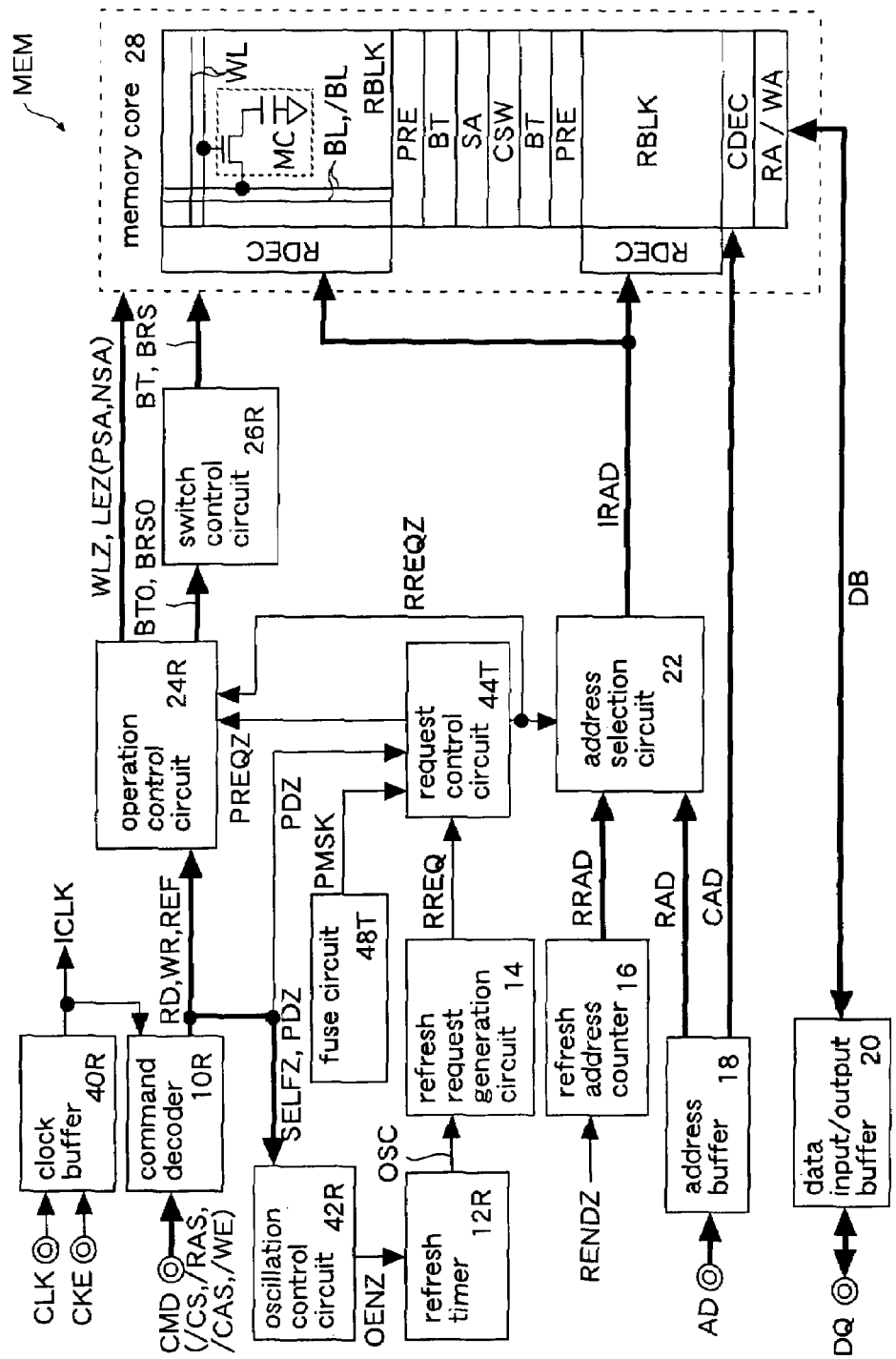
FIG. 60 is a block diagram showing operations of a twenty-eighth embodiment.

FIG. 60 shows a twenty-eighth embodiment of the present invention. The same symbols and numerals are attached to the same components as those described in the first and twenty-fourth embodiments and a detailed description thereof is omitted. In the present embodiment, a request control circuit 44T is formed instead of the request control circuit 44R in the twenty-fourth embodiment. Also, the memory MEM has a fuse circuit 48T (program circuit). Other components are the same as those in the twenty-fourth embodiment. That is, the memory MEM is, for example, an SDRAM. The memory MEM constitutes, as shown in FIG. 4, a memory system together with a CPU.

The fuse circuit 48T outputs a precharge mask signal PMSK in accordance with a program state of a built-in fuse. For example, the precharge mask signal PMSK is set to the high logical level while the fuse is cut, and to the low logical level while the fuse is not cut. When a precharge mask signal PMSK at the high logical level is received, the request control circuit 44T stops generation of the precharge request signal PREQZ. Accordingly, a precharge operation in power-down mode is prohibited. A precharge operation in self-refresh mode is prohibited except for an operation in response to a refresh request signal RREQZ. In the present embodiment, if an amount of leak current of the bit lines BL and /BL is determined to be very small by evaluation of standby currents and the like in an operation test after manufacturing the memory MEM, an internal state of the fuse circuit 48T is programmed. Generation of the precharge request signal PREQZ can thereby be stopped and thus, operation frequencies of the precharge circuit PRE can be reduced. As a result, power consumption of the memory MEM in power-down mode and self-refresh mode can be reduced.

When, for example, a precharge mask signal PMSK at the high logical level is received, the request control circuit 44T may stop generation of the precharge request signal PREQZ only in self-refresh mode. Bit lines BL and /BL are thereby set to the precharge voltage VPR by a self-refresh operation in self-refresh mode and set to the precharge voltage VPR in response to a precharge request signal PREQZ in power-down mode. Therefore, bit lines BL and /BL being maintained in a floating state in power-down mode can be prevented and also malfunctions of the sense amplifier SA in an access operation RD, WR, or REF after returning from the self-refresh mode to the normal operation mode can be prevented.

Also in the twenty-eighth embodiment described above, the same advantages as those of the above first and twenty-fourth embodiments can be obtained. Further, in the present embodiment, power consumption in power-down mode and self-refresh mode can be reduced still further in accordance with characteristics of the manufactured memory MEM.

Figure 61:
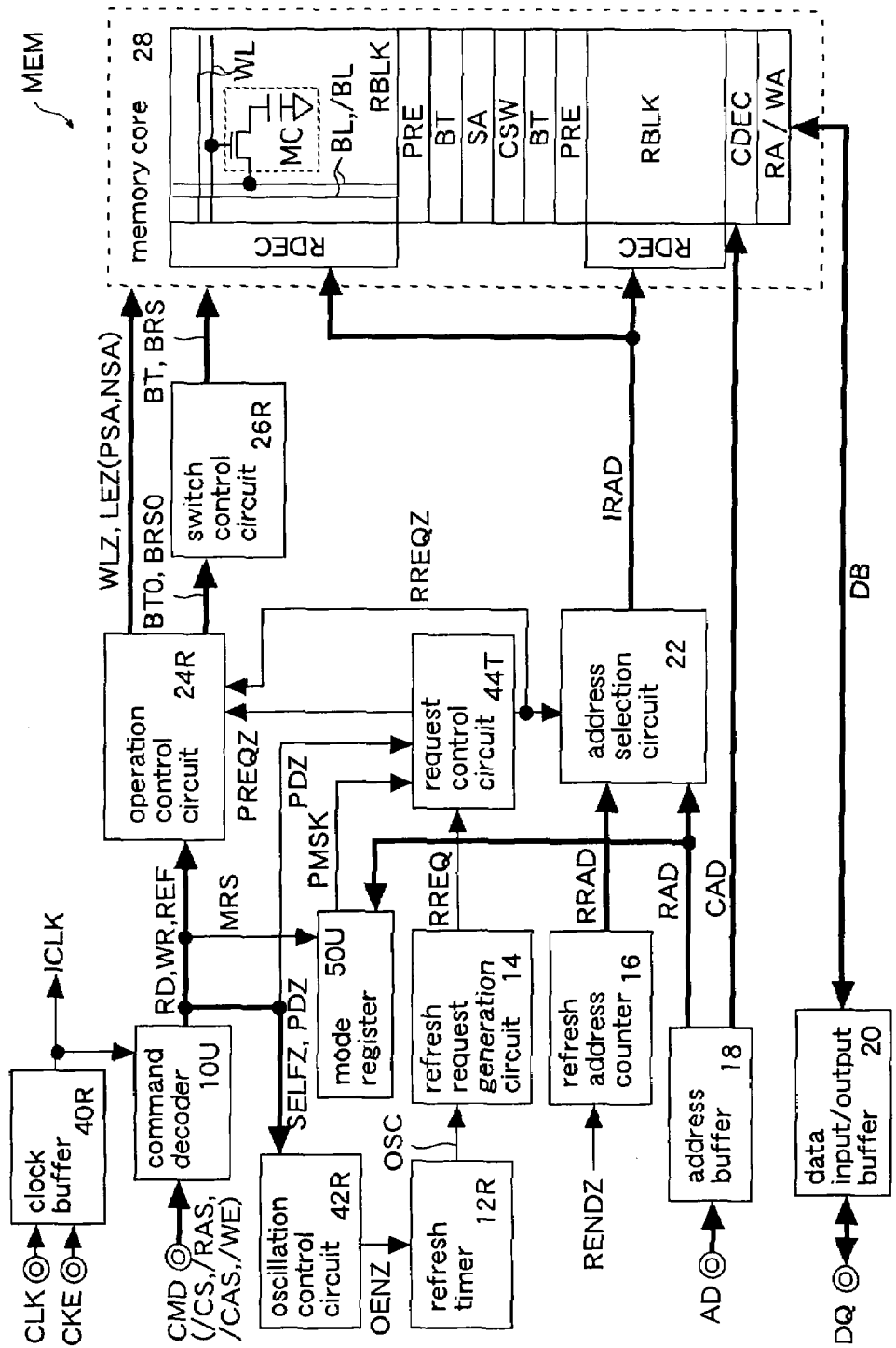
FIG. 61 is a block diagram showing operations of a twenty-ninth embodiment.

FIG. 61 shows a twenty-ninth embodiment of the present invention. The same symbols and numerals are attached to the same components as those described in the first, twenty-fourth, and twenty-eighth embodiments and a detailed description thereof is omitted. In the present embodiment, a command decoder 10U and the request control circuit 44T are formed instead of the command decoder 10R and the request control circuit 44R in the twenty-fourth embodiment. Also, the memory MEM has a mode register 50U (register circuit). Other components are the same as those in the twenty-fourth embodiment. That is, the memory MEM is, for example, an SDRAM. The memory MEM constitutes, as shown in FIG. 4, a memory system together with a CPU.

The command decoder 10U is constituted by adding a function for decoding a mode register setting command MRS to the command decoder 10R in the twenty-fourth embodiment. The mode register 50U sets the value of a built-in memory unit in accordance with the value of an address signal RAD (external data) supplied together with the mode register setting command MRS. One memory unit denotes a precharge mask bit PMSK. The mode register 50U outputs, for example, a precharge mask signal PMSK at the low logical level when "0" is set to the precharge mask bit PMSK and a precharge mask signal PMSK at the high logical level when "1" is set to the precharge mask bit PMSK. The mode register 50U also has a memory unit for setting operation specifications of the memory MEM such as a burst length and data latency. Operations of the request control circuit 44T are the same as those in the twenty-eighth embodiment.

Also in the twenty-ninth embodiment described above, the same advantages as those of the above first, twenty-fourth and twenty-eighth embodiments can be obtained. Further, in the present embodiment, since the mode register 50U can be set after testing the memory MEM, prohibition/permission of output of the precharge request signal PREQZ can be set, for example, after assembling the memory MEM. As a result, for example, reliability of bit lines BL and /BL regarding leak currents can be evaluated using the memory MEM that has been used for a long time.

Figure 62:
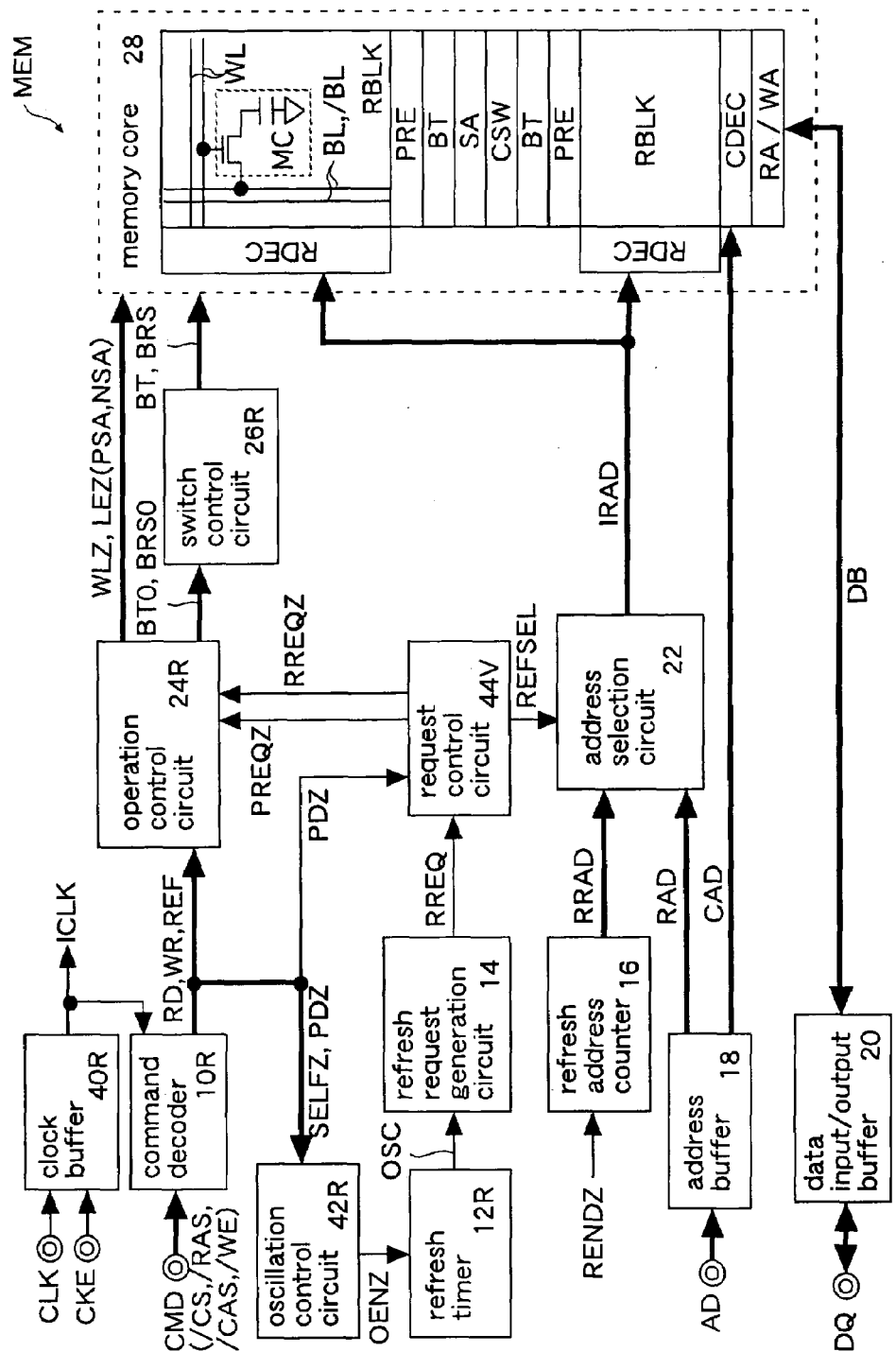
FIG. 62 is a block diagram showing operations of a thirtieth embodiment.

FIG. 62 shows a thirtieth embodiment of the present invention. The same symbols and numerals are attached to the same components as those described in the first and twenty-fourth embodiments and a detailed description thereof is omitted. In the present embodiment, a request control circuit 44V is formed instead of the request control circuit 44R in the twenty-fourth embodiment. The request control circuit 44V outputs a refresh selection signal REFSEL to the address selection circuit 22. Other components are the same as those in the twenty-fourth embodiment. That is, the memory MEM is, for example, an SDRAM. The memory MEM constitutes, as shown in FIG. 4, a memory system together with a CPU.

Figure 63:
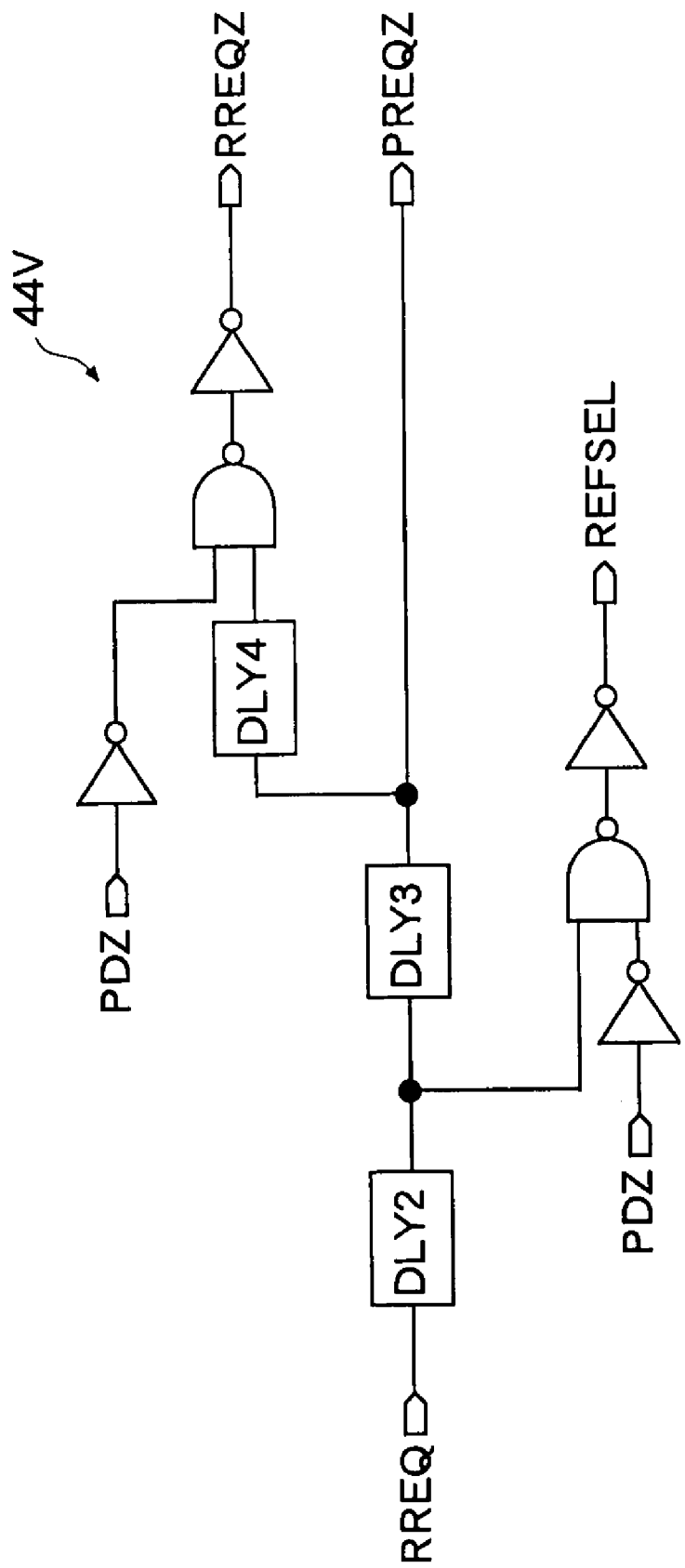
FIG. 63 is a circuit diagram showing details of a request control circuit in FIG. 62.

FIG. 63 shows details of the request control circuit 44V shown in FIG. 62. The request control circuit 44V has cascaded delay circuits DLY2, DLY3 (first delay circuit), and DLY4 (second delay circuit) to sequentially delay a refresh request signal RREQ (timing signal). A refresh selection signal REFSEL is output from an AND circuit receiving an output of the delay circuit DLY2 and inverted logic of a power-down mode signal PDZ. A precharge request signal PREQZ is output from the delay circuit DLY3. A refresh request signal RREQZ is output from an AND circuit receiving an output of the delay circuit DLY4 and inverted logic of a power-down mode signal PDZ. The address selection circuit 22 outputs a refresh address signal RRAD as an internal address signal IRAD to the memory core 28 for a predetermined period in response to activation (for example, the high logical level) of the refresh selection signal REFSEL. While the refresh selection signal REFSEL is inactivated (for example, the low logical level), the address selection circuit 22 outputs a row address signal RAD as an internal address signal IRAD to the memory core 28.

In the present embodiment, a refresh selection signal REFSEL, a precharge request signal PREQZ, and a refresh request signal RREQZ are sequentially generated in self-refresh mode in response to a refresh request signal RREQ. Thus, after a refresh address signal RRAD is output to the memory core 28, precharging of bit lines BL and /BL starts to start a self-refresh operation. Accordingly, for example, a self-refresh operation being started before the row decoder RDEC decodes the refresh address signal RRAD can be prevented.

Also in the thirtieth embodiment described above, the same advantages as those of the above first and twenty-fourth embodiments can be obtained. Further, in the present embodiment, malfunctions in self-refresh mode can be prevented.

Figure 64:
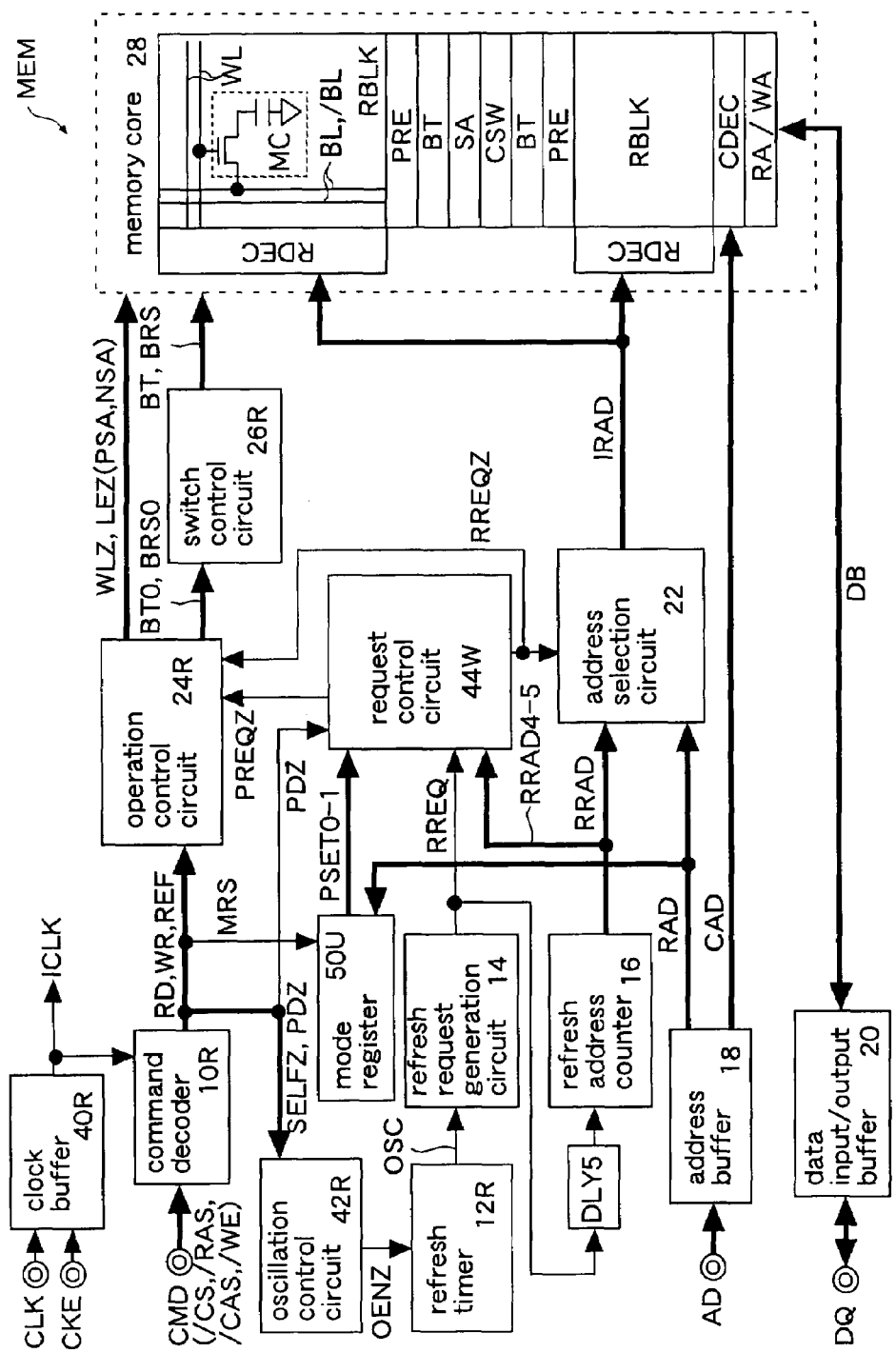
FIG. 64 is a block diagram showing operations of a thirty-first embodiment.

FIG. 64 shows a thirty-first embodiment of the present invention. The same symbols and numerals are attached to the same components as those described in the first, twenty-fourth, and twenty-ninth embodiments and a detailed description thereof is omitted. In the present embodiment, the command decoder 10U and a request control circuit 44W are formed instead of the command decoder 10R and the request control circuit 44R in the twenty-fourth embodiment. Also, the memory MEM has the mode register 50U. The refresh address counter 16 performs count operations in synchronization with a signal obtained after delaying a refresh request signal RREQ by the delay circuit DLY5. A delay time of the delay circuit DLY5 is longer than a period of time from when the refresh request signal RREQ is output to when the row decoder RDEC completes decoding of the refresh address signal RRAD. Other components are the same as those in the twenty-fourth embodiment. That is, the memory MEM is, for example, an SDRAM. The memory MEM constitutes, as shown in FIG. 4, a memory system together with a CPU. For the memory MEM in the present embodiment, the number of memory blocks RBLK performing a self-refresh operation can be set. That is, the memory MEM has a partial refresh function.

The mode register 50U has a plurality of memory units. Two bits of the memory units denote partial setting bits PSET0-1. The mode register 50U outputs partial setting signals PSET0-1 in accordance with a value set to the memory units. A partial refresh area PREFA described later is set by the partial setting bits PSET0-1. The partial refresh area PREFA is a memory block RBLK in which a refresh operation is performed. The partial refresh area PREFA will be described with reference to FIG. 65.

The request control circuit 44W is constituted by adding a function to mask output of the refresh request signal RREQZ in accordance with the partial setting signals PSET0-1 and refresh address signals RRAD4-5 to the request control circuit 44R in the twenty-fourth embodiment. Like the twenty-fourth embodiment, a precharge request signal PREQZ is output by all memory blocks RBLK in response to a refresh request signal RREQZ.

FIG. 65 shows the partial refresh area PREFA. Shaded memory blocks RBLK are a partial refresh area PREFA in which a self-refresh operation is permitted to perform. The refresh operation is prohibited in white memory blocks RBLK. Data capacities that can be retained and power consumption increase with an increasing size of the partial refresh area PREFA. Conversely, data capacities that can be retained and power consumption decrease with a decreasing size of the partial refresh area PREFA.

If both values of the partial setting signals PSET0-1 set by the mode register setting command MRS are the low logical level L, all memory blocks RBLK0-3 are set in the partial refresh area PREFA (ALL). If the partial setting signals PSET0-1 have the values H and L, the memory blocks RBLK0-1 are set in the partial refresh area PREFA (½). If the partial setting signals PSET0-1 have the values L and H, only the memory block RBLK0 is set in the partial refresh area PREFA (¼). If both values of the partial setting signals PSET0-1 are the high logical level H, a refresh operation of all memory blocks RBLK0-3 is prohibited (NONE).

Incidentally, the memory blocks RBLK0-3 are selected by two bits IRAD4-5 of the row address signal IRAD output from the address selection circuit 22. When, for example, the partial refresh area PREFA is set to "ALL", and if the row address signals IRAD4-5 have the values L and L, the memory block RBLK0 is selected. Similarly, if the row address signals IRAD4-5 have the values H and L, L and H, and H and H, the memory blocks RBLK1, RBLK2, and RBLK3 are selected respectively. When another partial refresh area PREFA is set, relationships between the values of the row address signals IRAD4-5 and the memory block RBLK to perform a self-refresh operation are determined, as shown in FIG. 66, by the request control circuit 44W.

Figure 66:
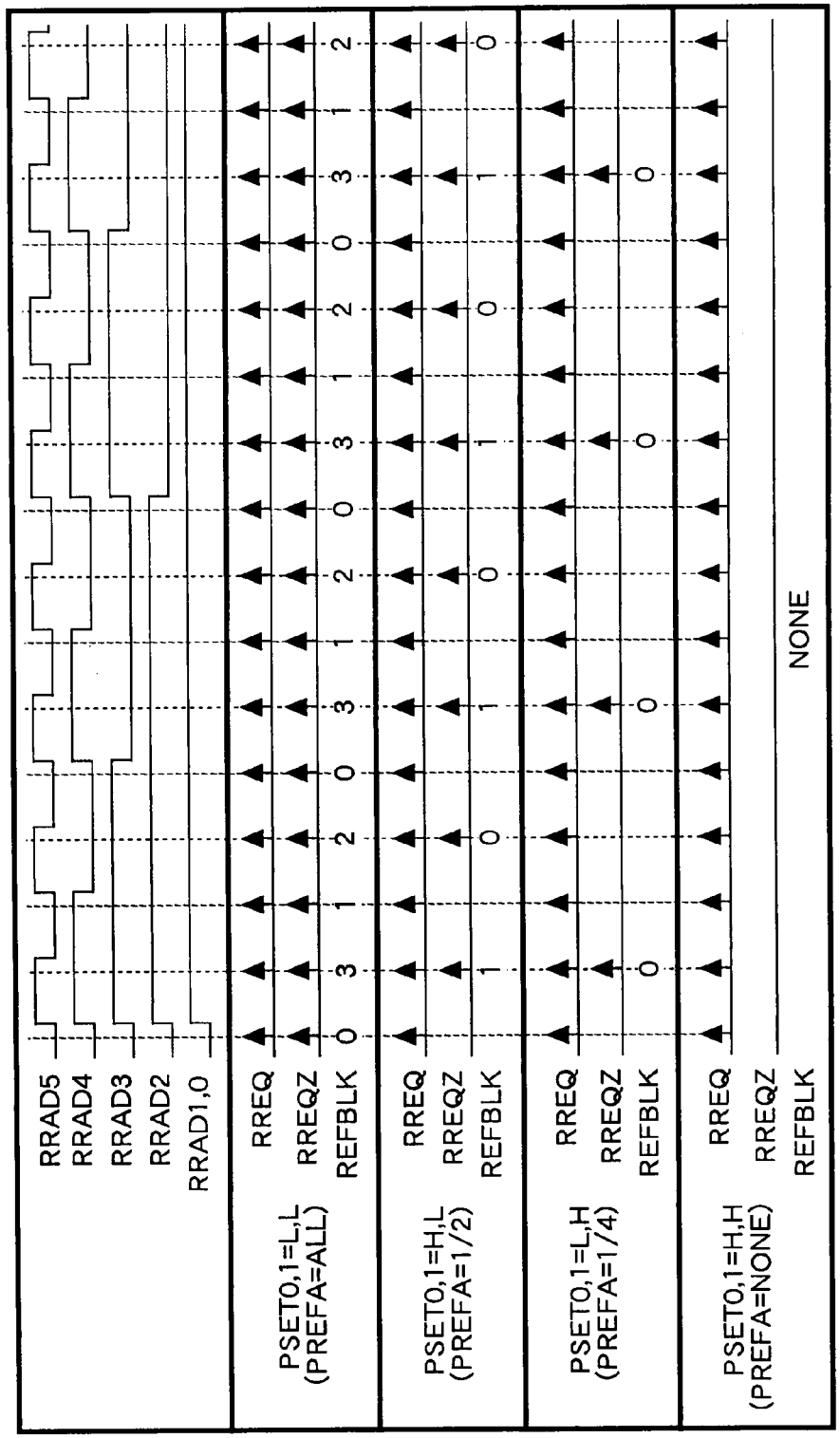
FIG. 66 is a timing chart showing operations in self-refresh mode of the thirty-first embodiment.

FIG. 66 shows operations in self-refresh mode of the thirty-first embodiment. If the partial setting signals PSET0-1 have the levels L and L, all memory blocks RBLK0-3 are set in the partial refresh area PREFA (ALL). In this case, the request control circuit 44W generates a refresh request signal RREQZ in synchronization with all refresh request signals RREQ. Then, in synchronization with the refresh request signal RREQZ, a self-refresh operation of the memory blocks RBLK0-3 selected by a logical value of the refresh address signals RRAD4-5 is performed sequentially. REFBLK in FIG. 66 denotes the number of the memory block RBLK in which a self-refresh operation is performed.

If the partial setting signals PSET0-1 have the levels H and L, the memory blocks RBLK0-1 are set as the partial refresh area PREFA (½). In this case, the request control circuit 44W generates a refresh request signal RREQZ in synchronization with the refresh request signal RREQ only if the refresh address signal RRAD5 is at the high logical level. Then, a self-refresh operation of the memory blocks RBLK0-1 selected only by a logical value of the refresh address signal RRAD4 is performed sequentially.

If the partial setting signals PSET0-1 have the levels L and H, only the memory block RBLK is set in the partial refresh area PREFA (¼). In this case, the request control circuit 44W generates a refresh request signal RREQZ in synchronization with the refresh request signal RREQ only if the refresh address signals RRAD4-5 are at the high logical level. Then, a self-refresh operation of the memory block RBLK0 selected by a value of inverted logic of the refresh address signals RRAD4-5 is performed sequentially.

If the partial setting signals PSET0-1 have the levels H and H, no partial refresh area PREFA is set. In this case, the request control circuit 44W prohibits output of the refresh request signal RREQZ. Thus, a refresh operation of all memory blocks RBLK0-3 is prohibited. That is, no refresh block REFBLK exists (NONE).

Figure 67:
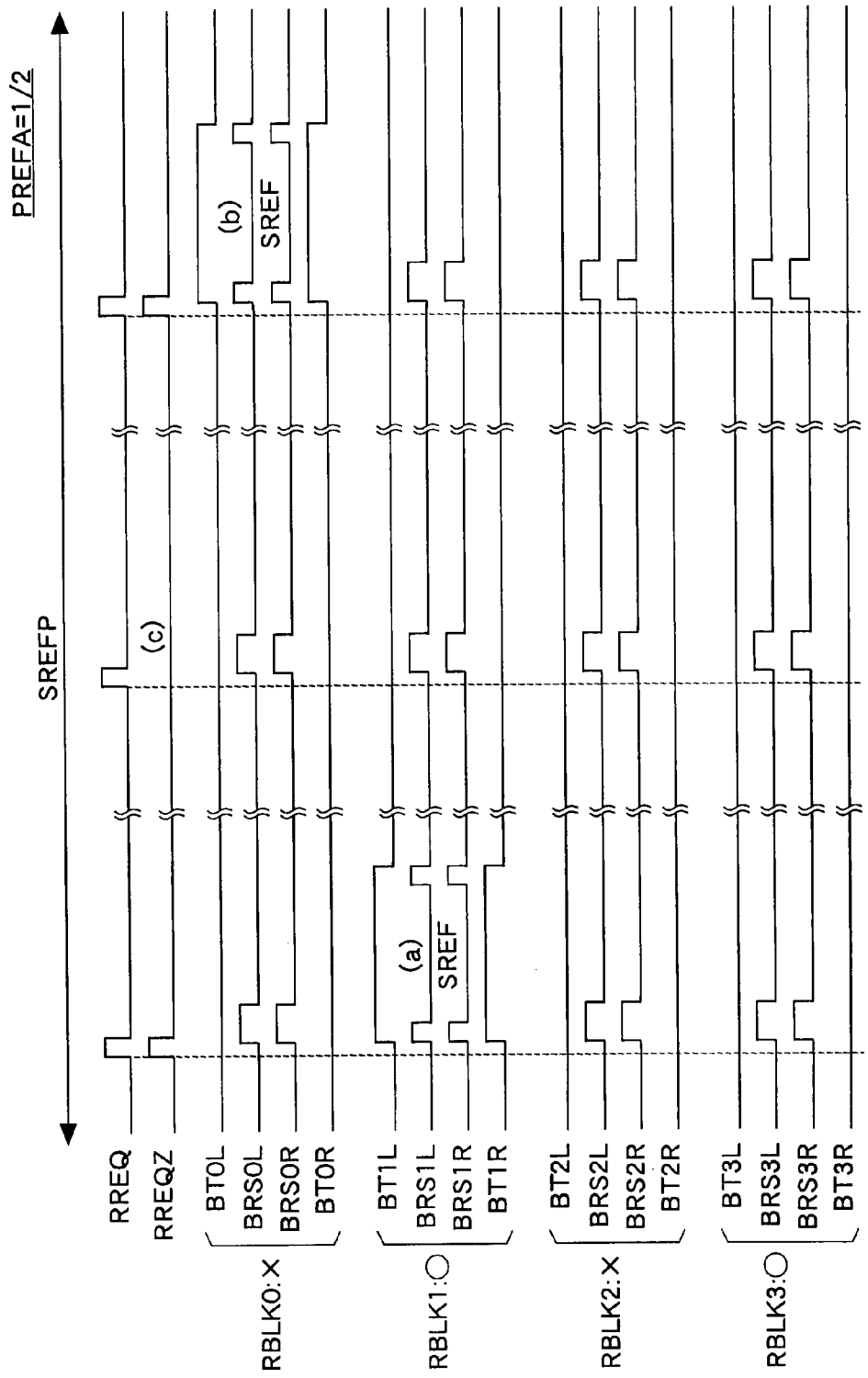
FIG. 67 is a timing chart showing operations in self-refresh mode of the thirty-first embodiment.

FIG. 67 shows operations in self-refresh mode of the thirty-first embodiment. A detailed description of the same operations as those in FIGS. 5 and 51 described above is omitted. In this example, the partial refresh area PREFA is set in the memory blocks RBLK0-1 (½ partial). Thus, a self-refresh operation SREF is performed only in the memory blocks RBLK0-1 (FIG. 67(a, b)). When the refresh address signal RRAD does not show a refresh block REFBLK, no refresh request signal RREQZ is output (FIG. 67 (c)). A precharge operation (high-level pulses of the precharge control signal BRS) is performed in all memory blocks RBLK0-3 in response to a refresh request signal RREQ.

Also in the thirty-first embodiment described above, the same advantages as those of the above first and twenty-fourth embodiments can be obtained. Further, in the present embodiment, the leak current can be minimized by the cutoff function and the voltage level of the bit lines BL and /BL in self-refresh mode can be held at the precharge level VPR also in the memory MEM having the partial refresh function. As a result, malfunctions of the sense amplifier SA in an access operation RD, WR, or REF after returning from the self-refresh mode to the normal operation mode can be prevented.

Figure 68:
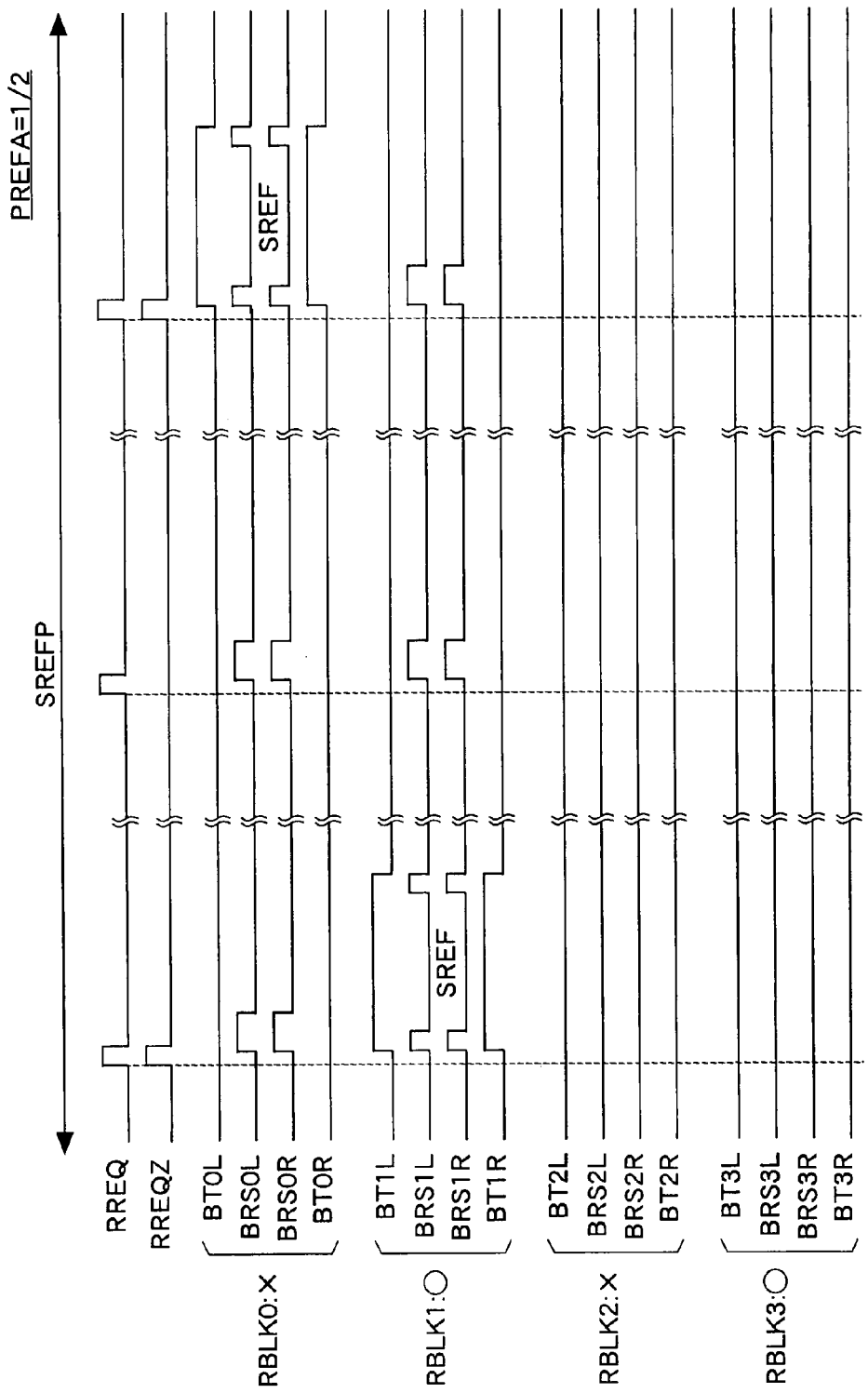
FIG. 68 is a timing chart showing operations in self-refresh mode of a thirty-second embodiment.

FIG. 68 shows operations in self-refresh mode of a thirty-second embodiment of the present invention. The same symbols and numerals are attached to the same components as those described in the first, twenty-fourth, and thirty-first embodiments and a detailed description thereof is omitted. In the present embodiment, a precharge operation in response to a precharge request signal PREQZ is performed only by the memory blocks RBLK0-1 set in the partial refresh area PREFA. The memory blocks RBLK2-3 that are not set in the partial refresh area PREFA do not receive a precharge control signal BRS in self-refresh mode and thus do not perform a precharge operation. Therefore, a switch control circuit (not shown) in the present embodiment is constituted by adding a function to determine the memory blocks RBLK that perform a precharge operation based on the partial setting signals PSET0-1 and to output a precharge control signal BRS to the switch control function 26R in the thirty-first embodiment.

Also in the thirty-second embodiment described above, the same advantages as those of the above first, twenty-fourth, and thirty-first embodiments can be obtained.

In the above third to twenty-third embodiments, like the twenty-fourth to twenty-sixth and the twenty-eighth to thirty-second embodiments, a precharge operation may be performed in self-refresh mode in response to a refresh request signal RREQ.

In the above twenty-seventh embodiment (FIG. 58), an example in which the precharge timer 46S periodically generates a precharge request signal PREQZ has been described. However, the present invention is not limited to this. For example, the cycle of the precharge request signal PREQZ can be made variable by providing a program circuit such as a fuse circuit in the memory MEM and adjusting operations of the precharge timer 46S in accordance with the program state.

In the initial state after manufacturing the memory MEM, for example, the program circuit is set to a value prohibiting output of the precharge request signal PREQZ. By programming the program circuit in accordance with value of the standby current in the memory MEM, malfunctions of the sense amplifier SA can be prevented and also power consumption in power-down mode and self-refresh mode can be minimized for each memory MEM. Strength of the standby current is evaluated after manufacturing the memory MEM using an LSI tester or the like.

In the above twenty-fourth to thirty-first embodiments, examples in which a precharge operation of all memory blocks RBLK is performed temporarily in response to a precharge request signal PREQZ have been described. However, the present invention is not limited to this. For example, the memory block RBLK to temporarily perform a precharge operation may be shifted sequentially for each precharge request signal PREQZ.

Figure 69:
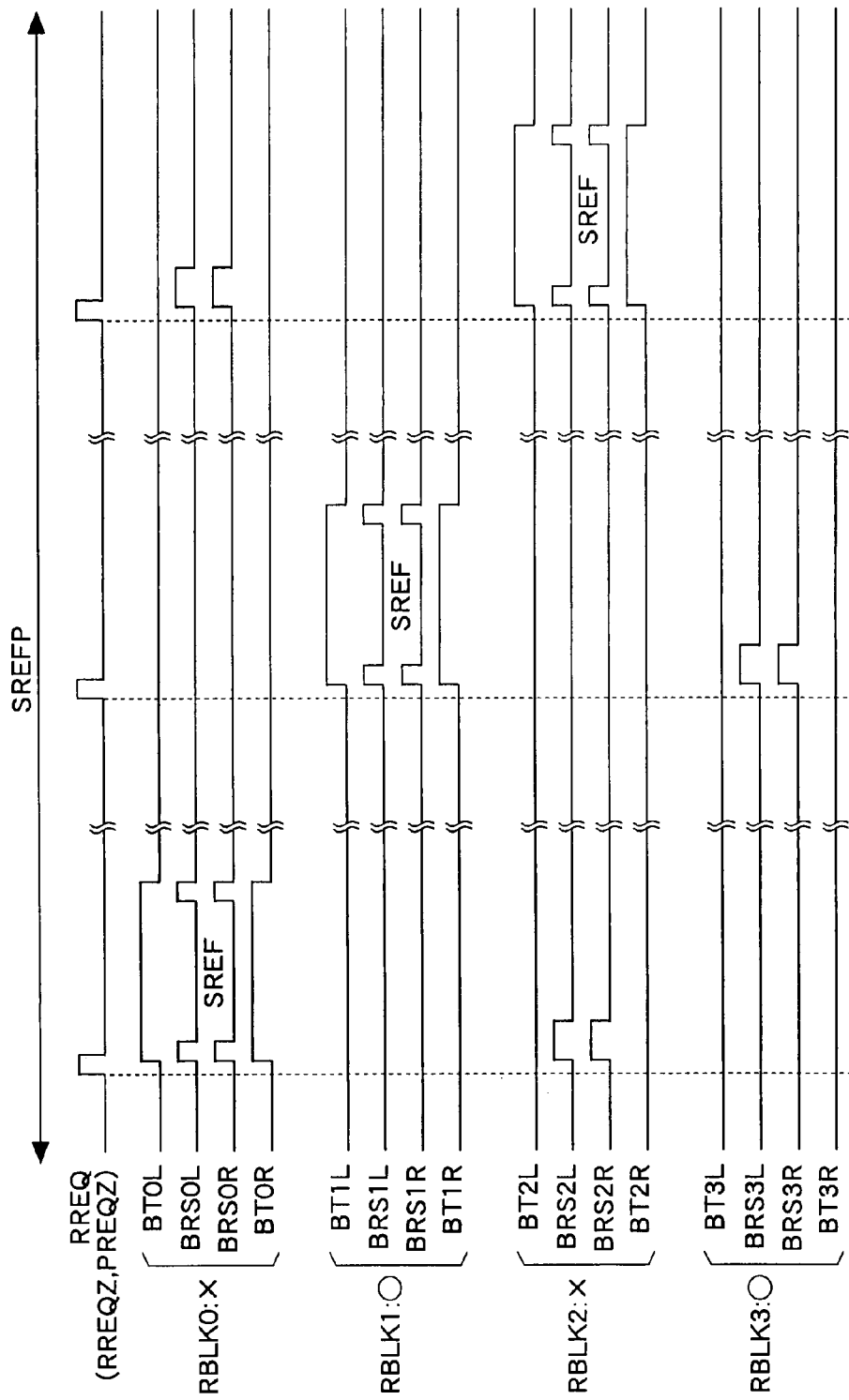
FIG. 69 is a timing chart showing another example of operations in self-refresh mode.

FIG. 69 corresponds to FIG. 51 and the memory block to temporarily perform a precharge operation shifts like RBLK2, 3, 1, . . . for each precharge request signal PREQZ. For example, a shift register that operates upon receipt of a precharge request signal PREQZ to output a precharge request signal indicating one of the memory blocks RBLK0-3 may be provided in the switch control circuit 26R to shift the memory block RBLK temporarily performing a precharge operation.

Figure 70:
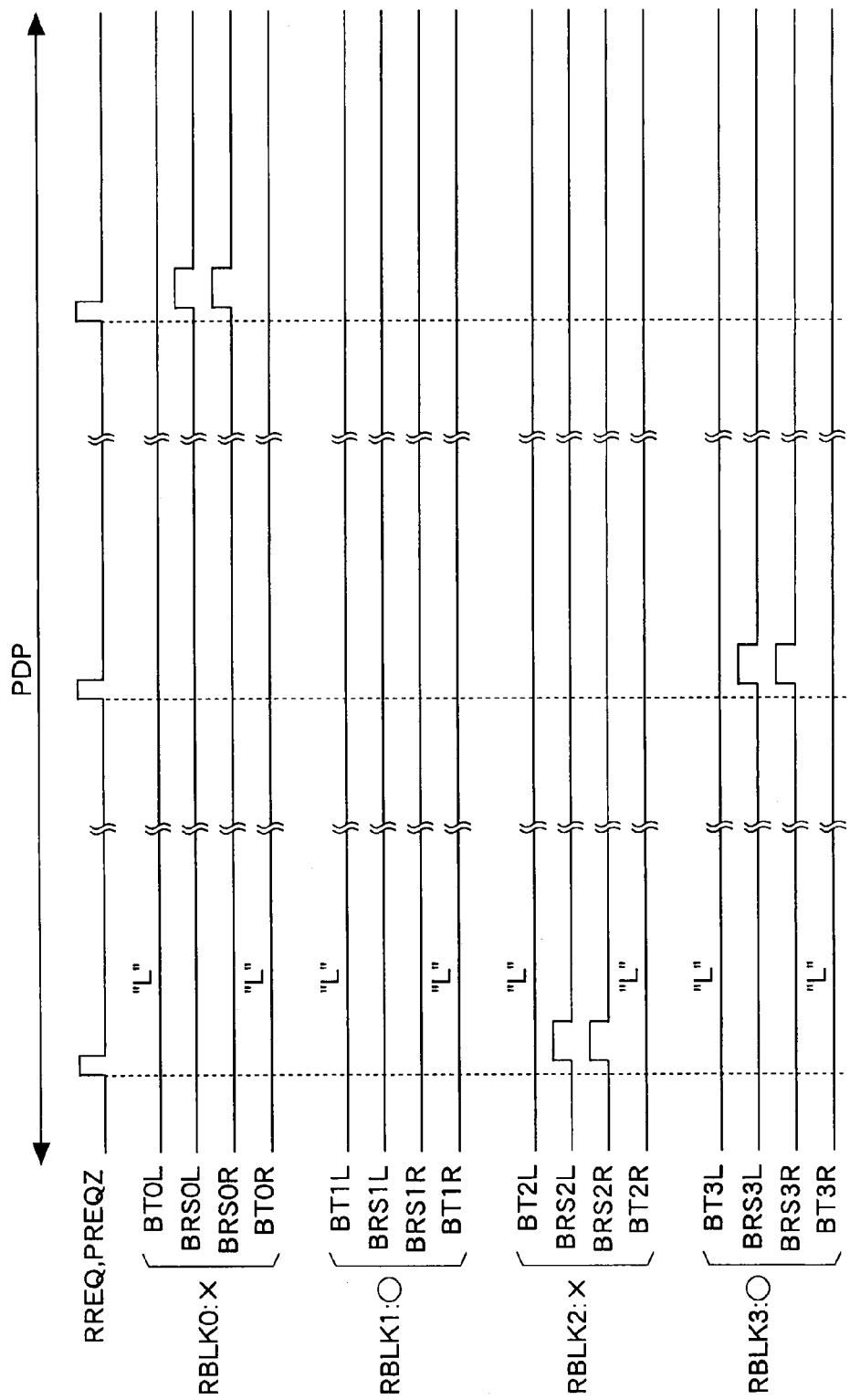
FIG. 70 is a timing chart showing another example of operations in power-down mode.

FIG. 70 corresponds to FIG. 52 and FIG. 71 corresponds to FIG. 54. In both FIGS. 70 and 71, like FIG. 69, the memory block temporarily performing a precharge operation shifts like RBLK2, 3, 1, . . . for each precharge request signal PREQZ. In FIG. 71, however, since a precharge operation of the memory blocks RBLK1 and 3 is always performed, a temporary precharge operation in response to a precharge request signal PREQZ is hidden. By removing the self-refresh operation SREF from FIG. 71, the operating timing of the power-down period PDP is obtained.

In the above embodiments, an X mark attached to a memory block RBLK having a leak failure between a word line WL and a bit line BL (or /BL). In a memory block RBLK having a leak failure, a word line WL generating a leak failure is replaced by a redundancy word line RWL. Alternatively, a bit line pair BL and /BL generating a leak failure is replaced by a redundancy bit line pair RBL and /RBL. The redundancy word line RWL or redundancy bit line pair RBL and /RBL is arranged in each memory block RBLK or in a dedicated redundancy memory block RRBLK.

A semiconductor memory to which the present invention is applied is not limited to semiconductor memory chips (semiconductor memory devices) and may be a semiconductor memory mounted on SiP (System in Package) shown in FIG. 4 or CoC (Chip on Chip), or a semiconductor memory core (semiconductor memory macro) implemented in system LSI. Or, built-in memory implemented in a CPU may be acceptable.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory comprising:
   a pair of memory blocks each having a plurality of memory cells, and word lines and bit lines connected to said memory cells;
   precharge switches for connecting said bit lines to a precharge line;
   a sense amplifier shared by said memory blocks;
   connection switches for connecting said sense amplifier to each of the bit lines of said memory blocks; and
   a switch control circuit that sets a cutoff function to turn off the connection switch in a period in which no access operation of said memory cells is performed and turns off the precharge switch while said cutoff function is set.

2. The semiconductor memory according to claim 1, wherein said switch control circuit turns on the connection switch corresponding to the memory block being accessed during access operation to release said cutoff function, and temporarily turns on the precharge switch corresponding to the memory block being accessed when an access operation is started.

3. The semiconductor memory according to claim 2, wherein said switch control circuit temporarily turns on the precharge switch corresponding to the memory block being accessed when the access operation is completed.

4. The semiconductor memory according to claim 1, further comprising:
   a leak memory unit storing information about a bad memory block having a leak failure between the word line and the bit line
   wherein said cutoff function is set for the connection switch corresponding to said bad memory block and is released for the connection switch corresponding to a good memory block without the leak failure based on information retained in the leak memory unit.

5. The semiconductor memory according to claim 4, further comprising:
   an external standby period in which external access requests and internal access requests can be received and an internal standby period in which reception of external access requests is prohibited and only internal access requests can be received,
   wherein said cutoff function is set in a period in which no access operation is performed in said internal standby period and is released in said external standby period.

6. The semiconductor memory according to claim 1, further comprising:
   an external standby period in which external access requests and internal access requests can be received and an internal standby period in which reception of external access requests is prohibited and only internal access requests can be received,
   wherein said cutoff function is set in a period in which no access operation is performed in said internal standby period and is released in said external standby period.

7. The semiconductor memory according to claim 6, wherein said cutoff function is set after said internal access request is generated at least once after switching from said external standby period to said internal standby period.

8. The semiconductor memory according to claim 7, further comprising:
   a set circuit for setting the number of the internal access requests before said cutoff function is set.

9. The semiconductor memory according to claim 6, wherein said cutoff function is set after a first access operation which responds to said internal access request is performed after switching from said external standby period to said internal standby period, and is released in response to the first external or internal access request after switching from said internal standby period to said external standby period.

10. The semiconductor memory according to claim 1, further comprising:
an external standby period in which external access requests and internal access requests can be received and an internal standby period in which reception of external access requests is prohibited and only internal access requests can be received,
wherein said cutoff function is released in response to said internal access request for memory blocks performing the access operation in response to said internal access request in said internal standby period and is set in response to a next internal access request.

11. The semiconductor memory according to claim 1, further comprising:
a negative voltage generation circuit generating a negative voltage,
wherein the connection switch is constructed of nMOS transistors, and said switch control circuit supplies the negative voltage generated by said negative voltage generation circuit to a gate of said nMOS transistor when said connection switch is turned off.

12. The semiconductor memory according to claim 1, further comprising:
a signal generation circuit periodically generating a timing signal,
wherein said switch control circuit turns on said precharge switch in synchronization with said timing signal while said cutoff function is set.

13. The semiconductor memory according to claim 12, further comprising:
an external operation mode permitting reception of external access requests and an internal operation mode prohibiting reception of said external access requests,
wherein said signal generation circuit generates said timing signal only in said internal operation mode.

14. The semiconductor memory according to claim 13, wherein said internal operation mode includes:
a self-refresh mode refreshing said memory cells in response to internal access requests generated periodically; and
a power-down mode inactivating input circuits receiving said external access requests.

15. The semiconductor memory according to claim 14, further comprising:
a request control circuit that generates said internal access request and generates a precharge request for turning on said precharge switch in response to said timing signal in said self-refresh mode and generates said precharge request in response to said timing signal and prohibits generation of said internal access request in said power-down mode.

16. The semiconductor memory according to claim 15, wherein said request control circuit includes a mask circuit that prohibits generation of said internal access request for a predetermined period of time after exiting from said power-down mode.

17. The semiconductor memory according to claim 15, further comprising:
a refresh address counter that generates a refresh address signal indicating memory cells to be refreshed; and
an address selection circuit that selects said refresh address signal while a refresh selection signal is activated, selects an external address signal while said refresh selection signal is inactivated, and outputs selected address signals to said memory blocks,
wherein said request control circuit includes first and second cascaded delay circuits that sequentially delays said timing signal, generates said refresh selection signal in response to said timing signal, generates said precharge request in response to an output signal of said first delay circuit, and generates said internal access request in response to an output signal of said second delay circuit.

18. The semiconductor memory according to claim 12, further comprising:
a leak memory unit storing information about a bad memory block having a leak failure between the word line and the bit line,
wherein said cutoff function is set for the connection switch corresponding to said bad memory block and is released for the connection switch corresponding to a good memory block without the leak failure, based on information retained in the leak memory unit; and said switch control circuit continues to turn off the precharge switch in said bad memory block excluding part of a period in which an access operation is performed and continues to turn on the precharge switch in said good memory block excluding a period in which an access operation is performed.

19. The semiconductor memory according to claim 12, further comprising:
a program circuit whose internal state is programmable,
wherein a function to turn on the precharge switch in synchronization with said timing signal is stopped while said program circuit is programmed.

20. The semiconductor memory according to claim 12, further comprising:
a register circuit set in accordance with external data, wherein
a function to turn on the precharge switch in synchronization with said timing signal is stopped while said register circuit is set to a predetermined value.

21. The semiconductor memory according to claim 1, further comprising:
a sub precharge switch arranged between said connection switches to connect a data input/output node of said sense amplifier to the precharge line,
wherein said switch control circuit turns on said sub precharge switch while said cutoff function is set.

22. The semiconductor memory according to claim 1, wherein said access operation includes an external access operation which responds to an external access request supplied from outside of the semiconductor memory and an internal access operation which responds to an internal access request generated inside the semiconductor memory.

23. The semiconductor memory according to claim 1, further comprising:
a current suppression element suppressing current arranged between the precharge switch and said precharge line.

24. The semiconductor memory according to claim 1, further comprising:
a test circuit that turns on the connection switches of all said memory blocks in response to a test request for measuring a standby current and thereafter controls the operation of said switch control circuit to turn off the connection switch for each of said memory blocks.

25. The semiconductor memory according to claim 1 further comprising:
a test circuit that turns off the connection switches of all said memory blocks in response to a test request for measuring a standby current and thereafter controls the operation of said switch control circuit to turn on the connection switch for each of said memory blocks.

26. The semiconductor memory according to claim 1, further comprising:
   an operation control circuit controlling an operation timing of the precharge switch and an activation timing of the word line; and
   a test circuit that controls the operation of said operation control circuit so that a time period between the time when the precharge switch is turned off in response to an access request and the time when the word line is activated is set to be longer in a test mode than in a normal operation mode.

27. The semiconductor memory according to claim 26, wherein said test circuit controls the operation of said operation control circuit to perform an operating test of each of said memory blocks in response to a test request and outputs the test result to outside of the semiconductor memory.

28. The semiconductor memory according to claim 1, further comprising:
   an operation control circuit controlling an operation timing of the precharge switch and an activation timing of the word line; and
   a test circuit that controls the operation of said operation control circuit so that said operation control circuit successively activates the word line and the sense amplifier after the precharge switch is turned off in response to an access request and a time period between the time when the word line is activated and the time when the sense amplifier is activated is set to be longer in a test mode than in a normal operation mode.

29. The semiconductor memory according to claim 28, wherein said test circuit controls the operation of said operation control circuit to perform an operating test of each of said memory blocks in response to a test request and outputs the test result to outside of the semiconductor memory.

* * * * *